US011404468B2

(12) United States Patent
Huang et al.

(10) Patent No.: US 11,404,468 B2
(45) Date of Patent: Aug. 2, 2022

(54) WAVELENGTH TUNABLE NARROW BAND FILTER

(71) Applicant: Taiwan Semiconductor Manufacturing Co., Ltd., Hsin-Chu (TW)

(72) Inventors: Cheng Yu Huang, Hsinchu (TW); Chun-Hao Chuang, Hsinchu (TW); Kazuaki Hashimoto, Zhubei (TW); Keng-Yu Chou, Kaohsiung (TW); Wei-Chieh Chiang, Yuanlin Township (TW); Wen-Hau Wu, New Taipei (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/654,297

(22) Filed: Oct. 16, 2019

(65) Prior Publication Data

US 2020/0403023 A1    Dec. 24, 2020

Related U.S. Application Data

(60) Provisional application No. 62/864,666, filed on Jun. 21, 2019.

(51) Int. Cl.
| | |
|---|---|
| *H01L 27/146* | (2006.01) |
| *H04N 5/374* | (2011.01) |
| *G02B 27/64* | (2006.01) |

(52) U.S. Cl.
CPC .... *H01L 27/14643* (2013.01); *H01L 27/1463* (2013.01); *H01L 27/14629* (2013.01);
(Continued)

(58) Field of Classification Search
None
See application file for complete search history.

(56) References Cited

U.S. PATENT DOCUMENTS

| | | |
|---|---|---|
| 8,194,303 B2 | 6/2012 | Park et al. |
| 2011/0089514 A1 | 4/2011 | Tay |
| | (Continued) | |

FOREIGN PATENT DOCUMENTS

| | | |
|---|---|---|
| KR | 20140010480 A | 1/2014 |

OTHER PUBLICATIONS

U.S. Appl. No. 16/156,061, filed Oct. 10, 2018.
Notice of Allowance dated Dec. 27, 2019 in connection with U.S. Appl. No. 16/156,061.

*Primary Examiner* — Nilufa Rahim
(74) *Attorney, Agent, or Firm* — Eschweiler & Potashnik, LLC

(57) ABSTRACT

Various embodiments of the present application are directed towards an image sensor including a wavelength tunable narrow band filter, as well as methods for forming the image sensor. In some embodiments, the image sensor includes a substrate, a first photodetector, a second photodetector, and a filter. The first and second photodetectors neighbor in the substrate. The filter overlies the first and second photodetectors and includes a first distributed Bragg reflector (DBR), a second DBR, and a first interlayer between the first and second DBRs. A thickness of the first interlayer has a first thickness value overlying the first photodetector and a second thickness value overlying the second photodetector. In some embodiments, the filter is limited to a single interlayer. In other embodiments the filter further includes a second interlayer defining columnar structures embedded in the first interlayer and having a different refractive index than the first interlayer.

20 Claims, 40 Drawing Sheets

(52) U.S. Cl.
CPC ....... *H01L 27/14685* (2013.01); *H04N 5/374* (2013.01); *G02B 27/642* (2013.01)

(56) References Cited

U.S. PATENT DOCUMENTS

| | | |
|---|---|---|
| 2012/0327248 A1 | 12/2012 | Tack et al. |
| 2013/0038015 A1 | 2/2013 | Horiuchi et al. |
| 2013/0093034 A1* | 4/2013 | Kokubun .......... H01L 27/14629 257/432 |
| 2015/0200226 A1 | 7/2015 | Jin et al. |
| 2015/0349018 A1* | 12/2015 | Takami ............. H01L 27/14685 438/69 |
| 2016/0073065 A1* | 3/2016 | Lee ................... H01L 27/14685 348/273 |
| 2018/0372546 A1 | 12/2018 | Enichlmair et al. |
| 2019/0025482 A1 | 1/2019 | Lee et al. |
| 2019/0277693 A1* | 9/2019 | Kim ..................... G01J 3/2823 |
| 2019/0305016 A1 | 10/2019 | Tsang et al. |
| 2021/0091135 A1 | 3/2021 | Yokogawa et al. |

* cited by examiner

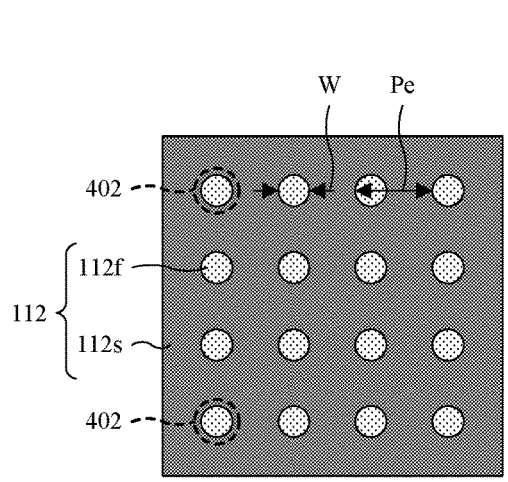 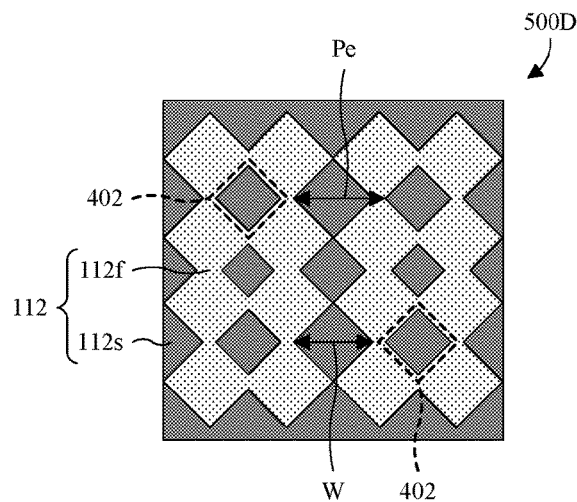
Fig. 5C  Fig. 5D
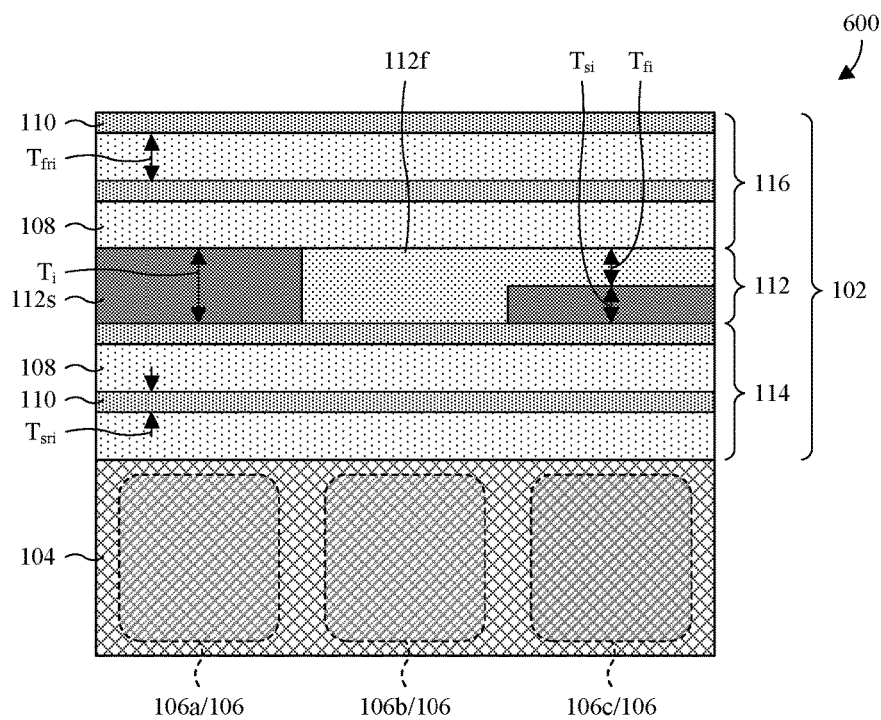
Fig. 6

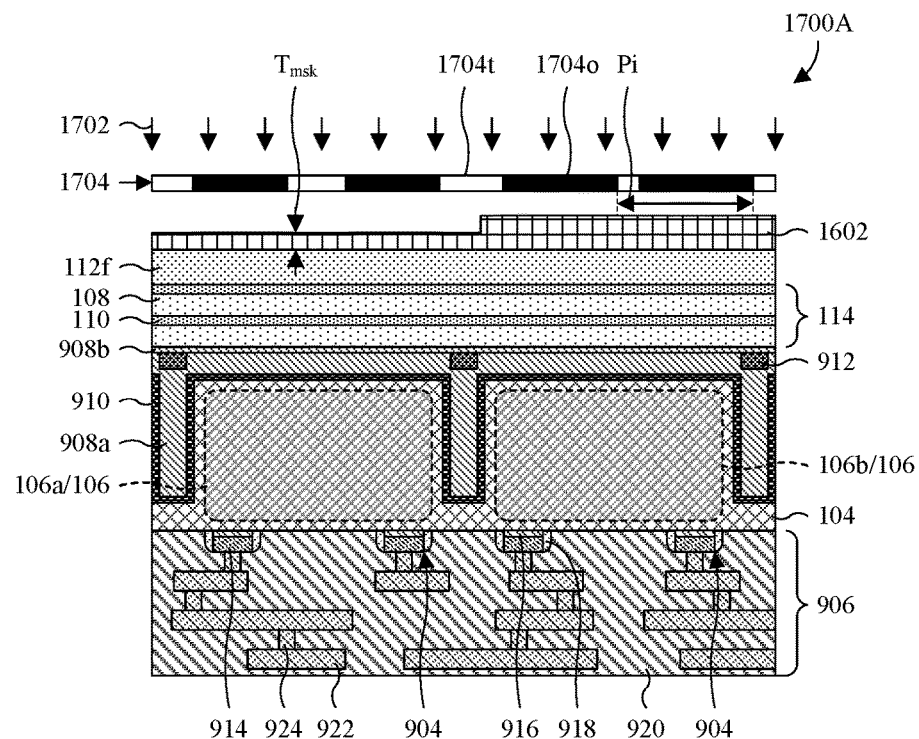
Fig. 17A
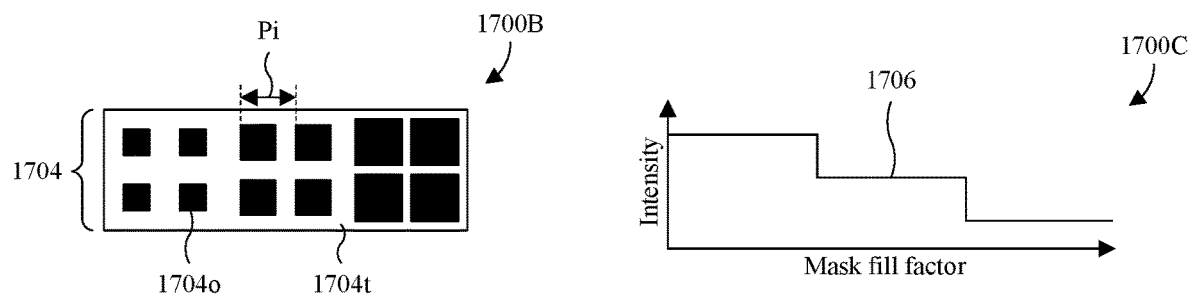
Fig. 17B     Fig. 17C

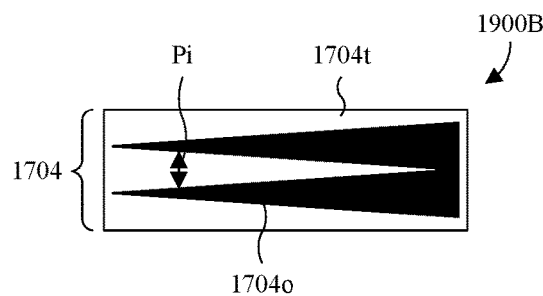
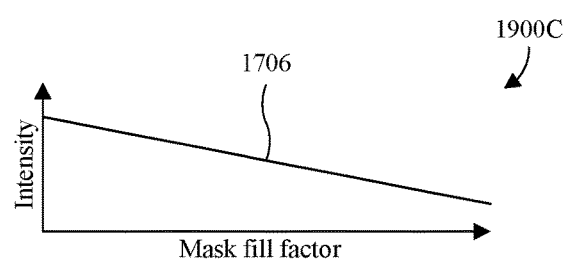
Fig. 19B
Fig. 19C
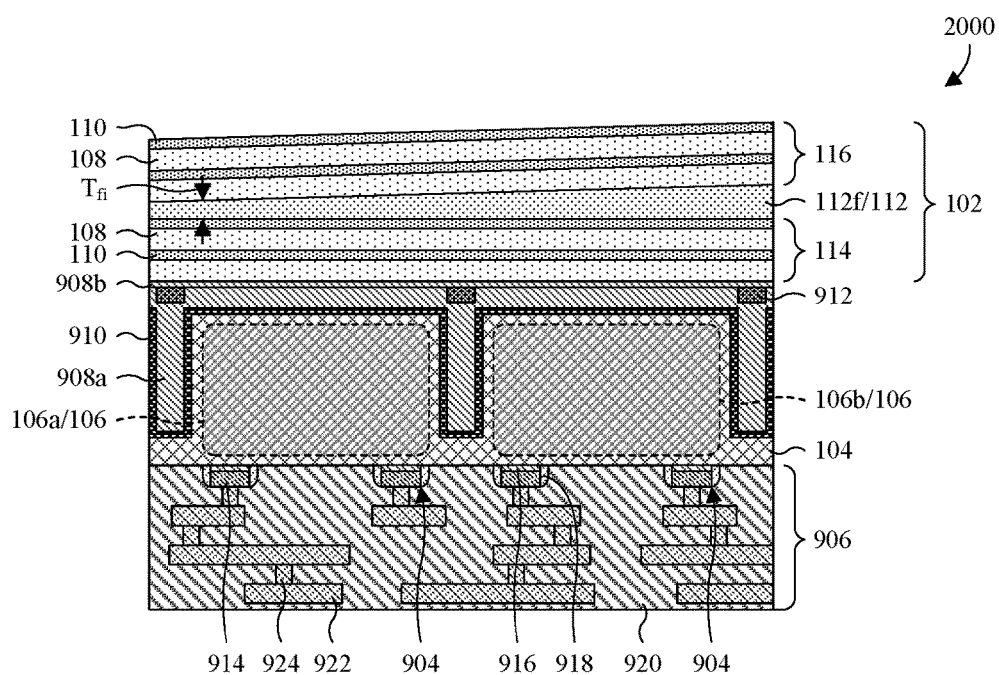
Fig. 20

WAVELENGTH TUNABLE NARROW BAND FILTER

REFERENCE TO RELATED APPLICATION

This application claims the benefit of U.S. Provisional Application No. 62/864,666, filed on Jun. 21, 2019, the contents of which are incorporated by reference in their entirety.

BACKGROUND

Many devices include photodetectors to sense incident radiation. For example, a complementary metal-oxide-semiconductor (CMOS) image sensor may comprise an array of photodetectors to convert an optical image to digital data representing the optical image. However, photodetectors typically have little to no ability to discriminate between different wavelengths (or colors) of radiation. Therefore, filters may be paired with photodetectors to allow the photodetectors to sense specific wavelengths of radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D illustrate top layouts of some embodiments of the interlayers of FIGS. 4A and 4B.

FIG. 6 illustrates a cross-sectional view of some embodiments of an image sensor comprising a narrow band filter in which a ratio between interlayers varies, the interlayers have variable thicknesses, and the narrow band filter has a uniform thickness.

FIGS. 11-16, 17A, 18, 19A, and 20 illustrate a series of cross-sectional views of some embodiments of a method using a gray mask to form an image sensor comprising a narrow band filter that has a single interlayer with a thickness that varies.

FIGS. 17B, 17C, 19B, and 19C illustrate operation of the gray mask in FIGS. 17A and 19A according to some embodiments of the gray mask.

DETAILED DESCRIPTION

Figure 1:
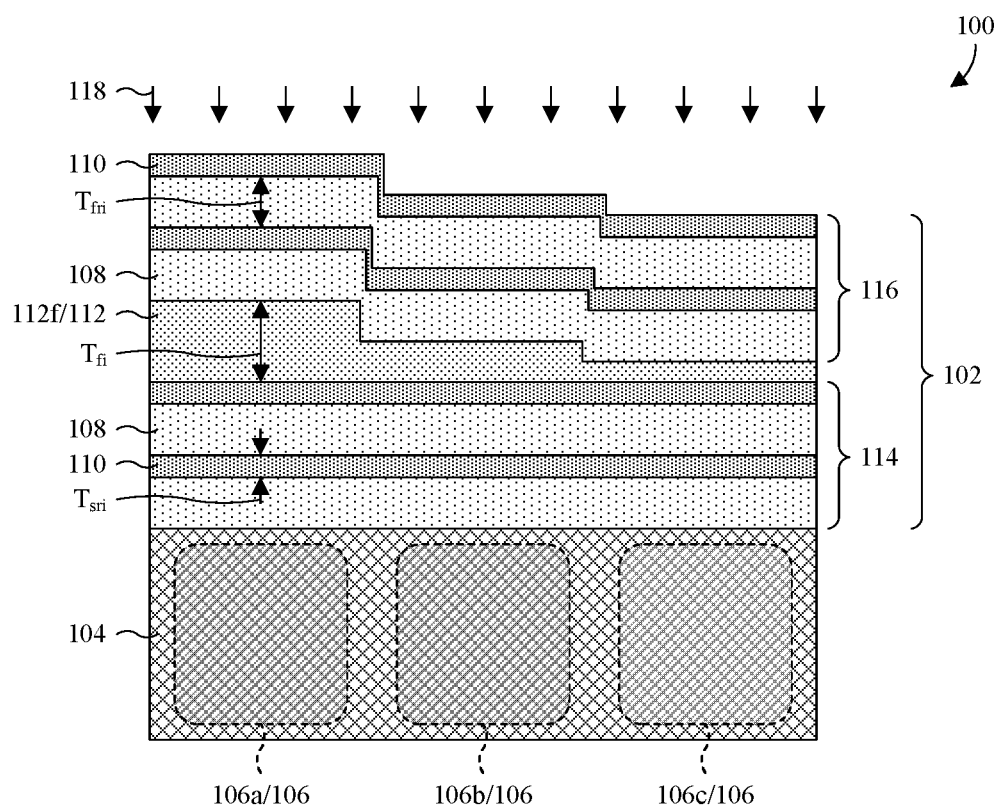
FIG. 1 illustrates a cross-sectional view of some embodiments of an image sensor comprising a narrow band filter in which the narrow band filter has a single interlayer with a thickness that varies discretely.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of wavelength filter is an absorptive filter. An absorptive filter is a filter made of a material that absorbs some wavelengths of radiation while transmitting other wavelengths of radiation. An absorptive filter is limited by the available materials, such that it can be difficult to control properties of the absorptive filter. For example, it can be difficult to achieve a narrow transmission band. A narrow transmission band may, for example, be a transmission band with a width less than about 50 nanometers.

Another type of wavelength filter is a microcavity filter. A microcavity filter comprises a pair of metal plates and a thin film sandwiched between the metal plates. The thin film defines a microcavity within which constructive interface occurs for wavelengths in the transmission band and within which destructive interface occurs for wavelengths outside the transmission band. However, despite constructive interface for wavelengths inside the transmission band, the microcavity filter has poor transmission due to absorption by metal of the metal plates. Further, the transmission band is shifted by varying a thickness of the thin film. However, multiple wavelength filters with different transmission bands are often used together in image sensors and other devices. This leads to many masks to set thicknesses of the various wavelength filters and hence leads to high costs since masks are expensive.

Yet another type of wavelength filter is a plasmonic filter employing a metal nanostructure with a periodic pattern. The metal nanostructure filters wavelengths of radiation by the surface plasmon effect and can be adjusted by varying the pitch of the periodic pattern. However, the spectrum of a plasmonic filter highly depends on the incident angle of radiation, which limits application of the plasmonic filter. Further, transmission is poor due to absorption by metal of the metal nanostructure.

Various embodiments of the present application are directed towards an image sensor comprising a wavelength tunable narrow band filter, as well as methods for forming the image sensor. In some embodiments, the image sensor comprises a substrate, a first photodetector, a second photodetector, and a filter. The first and second photodetectors neighbor in the substrate. The filter overlies the first and second photodetectors and comprises a first distributed Bragg reflector (DBR), a second DBR, and a first interlayer between the first and second DBRs. A thickness of the first interlayer has a first thickness value overlying the first photodetector and a second thickness value overlying the second photodetector. In some embodiments, the filter is limited to a single interlayer (i.e., the first interlayer). In other embodiments the filter further comprises a second interlayer defining columnar structures embedded in the first interlayer and having a different refractive index than the first interlayer.

Increasing the thickness of the first interlayer increases a transmission wavelength of the filter (i.e., decreases a transmission frequency of the filter), and decreasing the thickness decreases the transmission wavelength of the filter (i.e., increases the transmission frequency of the filter). Because the thickness of the first interlayer is different at the first and second photodetectors, the transmission wavelength of the filter is different at the first and second photodetectors. In embodiments in which the filter further comprises the second interlayer, one of the interlayers has a comparatively low refractive index and one of the interlayers has a comparatively high refractive index because the refractive indexes are different. This allows a ratio of the high refractive index material to the low refractive index material to be adjusted across the first and second photodetectors. Increasing the ratio increases the transmission wavelength of the filter (i.e., decreases the transmission frequency of the filter). Decreasing the ratio decreases the transmission wavelength of the filter (i.e., increases the transmission frequency of the filter). By tuning the thickness of the first interlayer and/or by tuning the ratio, transmission wavelengths may be tuned at the first and second photodetectors. Tuning the thickness allows coarse control and tuning the ratio allows fine control. Further, by forming the filter with the first and second DBRs and the first interlayer, transmission band may be narrow. Further yet, because the first and second DBRs may be formed without absorptive materials (e.g., metal or some other absorptive material), high transmission may be achieved at the transmission band.

With reference to FIG. 1, a cross-sectional view 100 of some embodiments of an image sensor comprising a narrow band filter 102 is provided. The narrow band filter 102 overlies a substrate 104 in which a plurality of photodetectors 106 is arranged. The substrate 104 may, for example, be a bulk monocrystalline silicon substrate or some other suitable semiconductor substrate. The plurality of photodetectors 106 comprises a first photodetector 106a, a second photodetector 106b, and a third photodetector 106c. The narrow band filter 102 comprises a plurality of first refractive-index layers 108, a plurality of second refractive-index layers 110, and an interlayer structure 112 stacked upon each other.

The first and second refractive-index layers 108, 110 are alternatingly stacked in a periodic pattern above and below the interlayer structure 112. A lower multilayer film 114 and an upper multilayer film 116 are defined by the first and second refractive-index layers 108, 110. The lower multilayer film 114 is defined by three or more of the first and second refractive-index layers 108, 110 alternatingly stacked in the periodic pattern under the interlayer structure 112. The upper multilayer film 116 is defined by three or more of the first and second refractive-index layers 108, 110 alternatingly stacked in the periodic pattern over the interlayer structure 112. In some embodiments, the lower and upper multilayer films 114, 116 are or define DBRs. The lower and upper multilayer films 114, 116 result in a low transmission band (i.e., a range of wavelengths at which transmission through the narrow band filter 102 is low).

The interlayer structure 112 is or comprises a first interlayer 112f. The first interlayer 110f has a different refractive index, a different thickness, a different material, or any combination of the foregoing when compared to the first and/or second refractive-index layers 108, 110 to break the periodic pattern at the lower multilayer film 114 and/or the upper multilayer film 116. Breaking the periodic pattern results in a high transmission band (i.e., a range of wavelengths at which transmission through the narrow band filter 102 is high) bisecting the low transmission band. Further, the first interlayer 112f has a thickness $T_{fi}$ discretely varying across the photodetectors 106. For example, the thickness $T_{fi}$ of the first interlayer 112f has a different value overlying the first photodetector 106a than overlying the second photodetector 106b. The variable thickness varies the location of the high transmission band.

During use of the image sensor, the narrow band filter 102 receives radiation 118 en route to the photodetectors 106. Further, the narrow band filter 102 selectively transmits the radiation 118 to the photodetectors 106 by constructive and destructive interference of reflections at interfaces between the first and second refractive-index layers 108, 110 and the first interlayer 112f. Such selective transmission, in turn, allows the photodetectors 106 to discriminate between different wavelengths of radiation and hence different colors of radiation.

As noted above, the lower and upper multilayer films 114, 116 result in the low transmission band. Low transmission may, for example, be transmission less than about 40%, 30%, 20%, or some other suitable value. Additionally, the interlayer structure 112 results in the high transmission band. High transmission is transmission greater than the low transmission and may, for example, be transmission in excess of about 80%, 90%, 95%, or some other suitable value. Further, high transmission may, for example, be transmission that is high compared to microcavity filters and/or plasmonic filters because the narrow band filter 102 may be formed without metal and other high absorption materials. The high transmission band is also narrow and bisects the low transmission band into upper and lower segments. A narrow transmission band may, for example, be a transmission band with a width less than about 20, 35, or 50 nanometers. Other widths are, however, amenable.

Increasing the thickness $T_{fi}$ of the first interlayer 112f shifts the high transmission band to higher wavelengths. Similarly, decreasing the thickness $T_{fi}$ shifts the high transmission band to lower wavelengths. Because the thickness $T_{fi}$ of the first interlayer 110f varies across the photodetectors 106, the high transmission band varies across the photodetectors 106. For example, the high transmission band may be at lower wavelengths directly over the third photodetector 106c than directly over the second photodetector 106b. Because the high transmission band varies across the photodetectors 106, the narrow band filter 102 allows the photodetectors 106 to discriminate between different wavelengths of radiation and hence different colors of radiation.

With continued reference to FIG. 1, the first refractive-index layers 108 have a first refractive index that is the same or substantially the same at each of the first refractive-index layers 108. Further, the second refractive-index layers 110 have a second refractive index that is the same or substantially the same at each of the second refractive-index layers 110. The first refractive index is greater than the second refractive index, or vice versa. The first refractive index and/or the second refractive index may, for example, be about 1.0-4.5, about 1.0-2.5, or about 1.5-4.5. Other refractive index values are, however, amenable.

The first refractive-index layers 108 have a first thickness $T_{fri}$ that is the same or substantially the same at each of the first refractive-index layers 108, and the second refractive-index layers 110 have a second thickness $T_{sri}$ that is the same or substantially the same at each of the second refractive-index layers 110. The first thickness $T_{fri}$ and/or the second thickness $T_{sri}$ may, for example, be about 15-300 nanometers, about 25-300 nanometers, or about 15-200 nanometers. Other thickness values are, however, amenable.

The first refractive-index layers 108 are or comprise a first material, and the second refractive-index layers 110 are or comprise a second material. In some embodiments, the first and second thicknesses $T_{fri}$, $T_{sri}$ are different and the first and second materials are the same. In other embodiments, the first and second thicknesses $T_{fri}$, $T_{sri}$ are the different and the first and second materials are different. In other embodiments, the first and second thicknesses $T_{fri}$, $T_{sri}$ are the same and the first and second materials are different. In some embodiments, the first and second materials have low absorption for wavelengths to be transmitted by the narrow band filter 102. Low absorption may, for example, be absorption less than about 30%, 20%, 10%, or some other suitable value. A low absorption material is to be contrasted with metal, which typically has high absorption. In some embodiments, the first and second materials are dielectric. The first material and/or the second material may, for example, be or comprise silicon oxide, titanium oxide, or some other suitable material.

In some first embodiments in which the first refractive index is less than the second refractive index, the first refractive index is about 1.0-2.5, the second refractive index is about 1.5-4.5, the first thickness $T_{fri}$ is about 25-300 nanometers, the second thickness $T_{sri}$ is about 15-200 nanometers, the first material is silicon oxide, the second material is titanium oxide, or any combination of the foregoing. In some second embodiments in which the first refractive index is greater than the second refractive index, the first refractive index is about 1.5-4.5, the second refractive index is about 1.0-2.5, the first thickness $T_{fri}$ is about 15-200 nanometers, the second thickness $T_{sri}$ is about 25-300 nanometers, the first material is titanium oxide, the second material is silicon oxide, or any combination of the foregoing. Other materials, thickness, and refractive indexes are, however, amenable for the first and second embodiments. In some embodiments, each of the first refractive-index layers 108 is the same as each other one of the first refractive-index layers 108 in terms of refractive index, material, thickness, or any combination of the foregoing. Similarly, in some embodiments, each of the second refractive-index layers 110 is the same as each other one of the second refractive-index layers 110 in terms of refractive index, material, thickness, or any combination of the foregoing.

In some embodiments, the refractive index of the first interlayer 112f is different than the first refractive index of the first refractive-index layers 108 and/or the second refractive index of the second refractive-index layers 110. In some embodiments, the refractive index of the first interlayer 112f is about 1.0-4.5, about 1.0-2.75, about 2.75-4.5, or some other suitable refractive index value. In some embodiments, the thickness $T_{fi}$ of the first interlayer 112f is different than the first thickness $T_{fri}$ of the first refractive-index layers 108 and/or the second thickness $T_{sri}$ of the second refractive-index layers 110. In some embodiments, the thickness $T_{fi}$ of the first interlayer 112f is about 30-600 nanometers, about 30-315 nanometers, about 315-600 nanometers, or some other suitable thickness value.

In some embodiments, the first interlayer 112f is or comprises a different material than the first material of the first refractive-index layers 108 and/or the second material of the second refractive-index layers 110. In some embodiments, the first interlayer 112f is transparent and/or has a low absorption for wavelengths to be transmitted by the narrow band filter 102. Low absorption may, for example, be absorption less than about 30%, 20%, 10%%, or some other suitable value. In some embodiments, the first interlayer 112f is or comprises a dielectric. The first interlayer 112f may, for example, be or comprise silicon oxide, titanium oxide, or some other suitable material.

Figure 2:
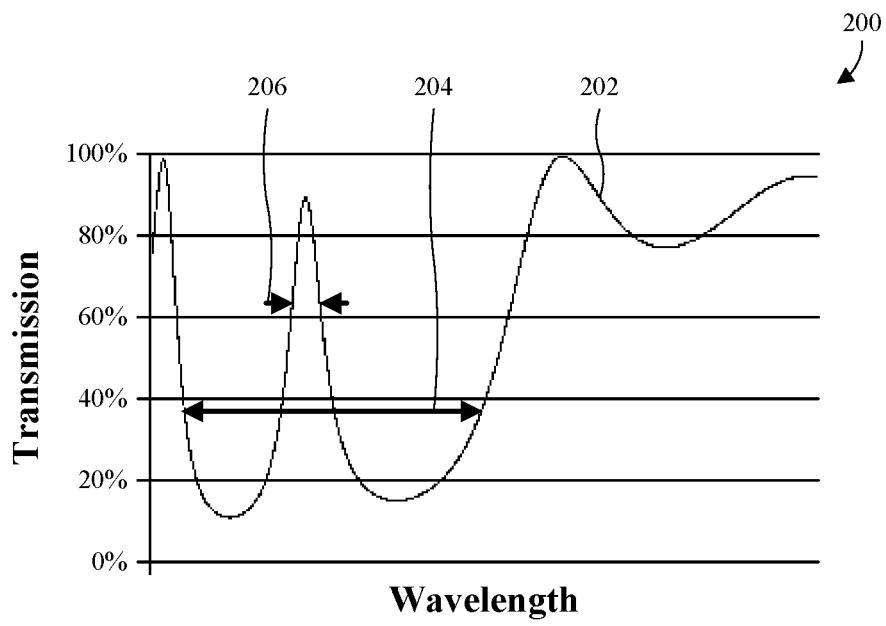
FIG. 2 illustrates a graph of some embodiments of a curve describing transmission as a function of wavelength for the narrow band filter of FIG. 1.

With reference to FIG. 2, a graph 200 of some embodiments of a curve 202 describing transmission as a function of wavelength for the narrow band filter 102 of FIG. 1 is provided. The lower and upper multilayer films 114, 116 (see FIG. 1) result in a low transmission band 204. The sharpness of the low transmission band 204 may, for example, be increased by increasing the number of first and second refractive-index layers 108, 110 (see FIG. 1) in the lower and upper multilayer films 114, 116. The sharpness of the low transmission band 204 may, for example, be the steepness of the curve 202 at lower and upper limits of the low transmission band 204.

The position of the low transmission band 204 depends on the thicknesses $T_{fri}$, $T_{sri}$ of the first and second refractive-index layers 108, 110 and the refractive indexes of the first and second refractive-index layers 108, 110. For example, the central wavelength $\lambda$ of the low transmission band 204 may be as follows: $\lambda=2(n_1 T_{fri}+n_2 T_{sri})/m$. $n_1$ and $n_2$ are respectively the refractive index of the first refractive-index layers 108 and the refractive index of the second refractive-index layers 110. $T_{fri}$ and $T_{sri}$ are respectively the thickness of the first refractive-index layers 108 and the thickness of the second refractive-index layers 110. m is the order of the optical response, which is an integer larger than zero.

The width $\Delta\lambda$ of the low transmission band 204 depends on the central wavelength $\lambda$ of the low transmission band 204, and also depends on the refractive indexes of the first and second refractive-index layers 108, 110. For example, the width $\Delta\lambda$ of the low transmission band 204 may be as follows: $\Delta\lambda=\lambda\Delta n/2$. $\Delta n$ is the difference between the refractive index of the first refractive-index layers 108 and the refractive index of the second refractive-index layers 110.

The interlayer structure 112 defines a high transmission band 206 bisecting the low transmission band 204. The peak of the high transmission band 206 moves towards higher wavelengths as the thickness $T_{fi}$ of the first interlayer 112f increases and/or the refractive index of the first interlayer 112f increases. Further, the peak of the high transmission band 206 moves towards lower wavelengths as the thickness $T_{fi}$ of the first interlayer 112f decreases and/or the refractive index of the first interlayer 112f decreases.

Figure 3:
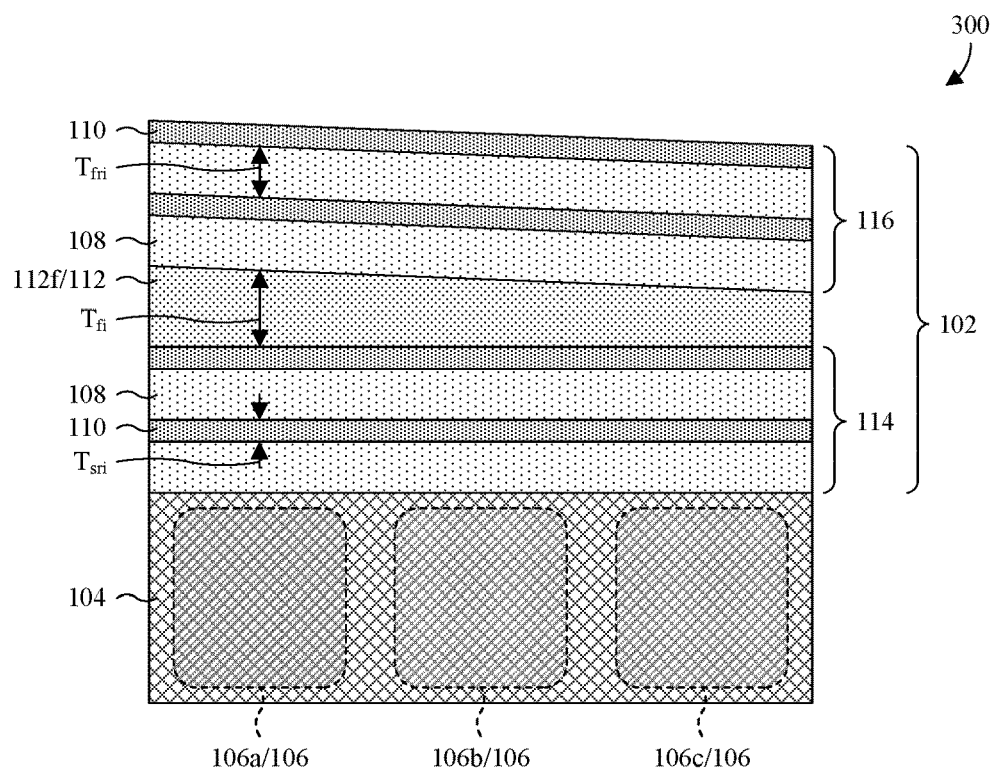
FIG. 3 illustrates a cross-sectional view of some alternative embodiments of the image sensor of FIG. 1 in which the thickness of the single interlayer varies continuously.

With reference to FIG. 3, a cross-sectional view of some alternative embodiments of the image sensor of FIG. 1 is provided in which the thickness $T_{fi}$ of the first interlayer 112f varies continuously across the photodetectors 106. For example, the thickness $T_{fi}$ may decrease continuously from the first photodetector 106a to the third photodetector 106c.

Figure 4A:
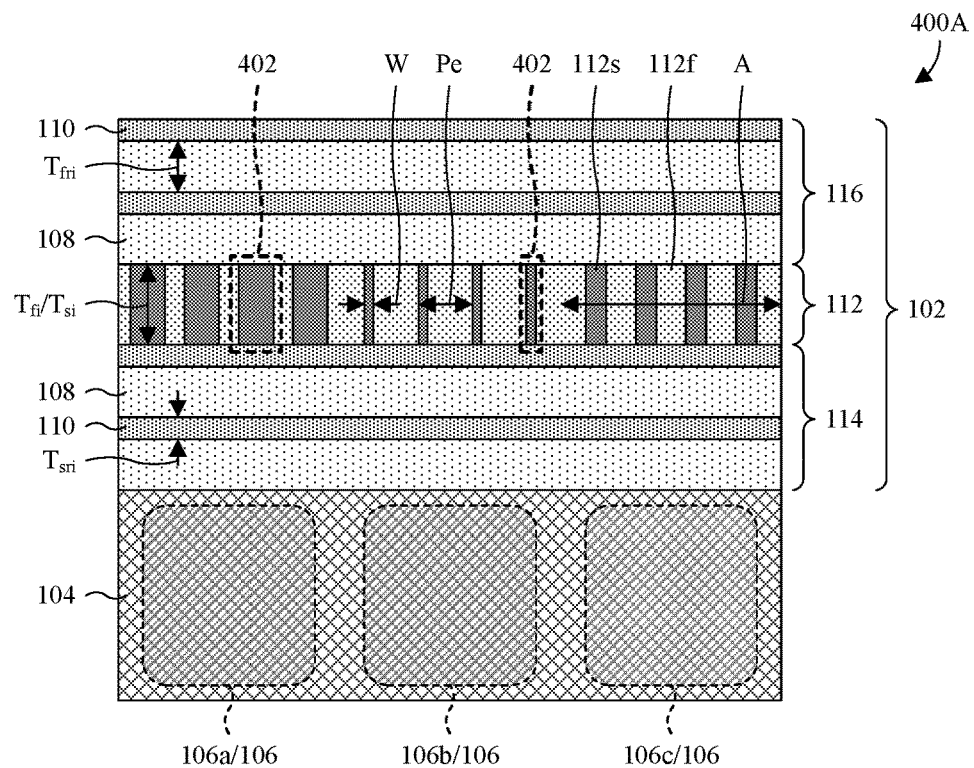
FIGS. 4A and 4B illustrate cross-sectional views of various embodiments of an image sensor comprising a narrow band filter in which a ratio between interlayers varies and the interlayers and the narrow band filter have uniform thicknesses.

With reference to FIG. 4A, a cross-sectional view 400A of some alternative embodiments of the image sensor of FIG. 1 is provided in which the thickness $T_{fi}$ of the first interlayer 112f is uniform or substantially uniform across the photodetectors 106 and the interlayer structure 112 comprises a second interlayer 112s. The second interlayer 112s has a thickness $T_{si}$ that is the same or substantially the same as the thickness $T_{fi}$ of the first interlayer 112f and that is uniform or substantially uniform across the photodetectors 106. Further, the second interlayer 112s has a different refractive index than the first interlayer 112f and defines a plurality of columnar structures 402 in the first interlayer 112f. In some embodiments, the second interlayer 112s has a refractive index greater than the first interlayer 112f. In other embodiments, the second interlayer 112s has a refractive index less than the first interlayer 112f.

The columnar structures 402 repeat periodically across the photodetectors 106 with a period Pe, so the second interlayer 112s has a periodic pattern. Further, the period Pe of the columnar structures 402 and/or individual volumes of the columnar structures 402 is/are varied across the photodetectors 106, so the periodic pattern varies across the photodetectors 106. For example, individual volumes of columnar structures overlying the first photodetector 106a are greater than individual volumes of columnar structures overlying the second photodetector 106b. The individual volumes may, for example, be varied by individual widths W of the columnar structures 402, individual shapes of the columnar structures 402, other suitable parameters of the columnar structures 402, or any combination of the foregoing. The period Pe and the widths W are less than the high transmission band (see, e.g., 206 in FIG. 2).

The variation in the periodic pattern varies a ratio of the second interlayer 112s to the first interlayer 112f. Increasing the ratio increases the fill factor of the second interlayer 112s while decreasing the fill factor of the first interlayer 112f. Decreasing the ratio decreases the fill factor of the second interlayer 112s while increasing the fill factor of the first interlayer 112f. Because the period Pe and the widths W are less than the high transmission band, varying the ratio and hence the fill factors varies the effective refractive index of the interlayer structure 112. If the period Pe and the widths W are greater than the high transmission band, the fill factors may not vary the effective refractive index. In embodiments in which the second interlayer 112s has a refractive index greater than the first interlayer 112f, increasing the fill factor of the second interlayer 112s increases the effective refractive index of the interlayer structure 112. On the other hand, in embodiments in which the second interlayer 112s has a refractive index less than the first interlayer 112f, increasing the fill factor of the second interlayer 112s decreases an effective refractive index of the interlayer structure 112.

The variation in effective refractive index of the interlayer structure 112 varies the location of the high transmission band. Increasing the effective refractive index shifts the high transmission band to higher wavelengths, and decreasing the effective refractive index shifts the high transmission band to lower wavelengths. Therefore, variation in the periodic pattern of the second interlayer 112s may be employed to vary the effective refractive index of the interlayer structure 112 and hence to vary the high transmission band. This, in turn, may be used to allow the photodetectors 106 to discriminate between different wavelengths of radiation and hence different colors of radiation.

For example, as illustrated, the periodic structure is different overlying each of the first, second, and third photodetectors 106a-106c. The fill factor of the second interlayer 112s is higher overlying the third photodetector 106c than overlying the second photodetector 106b and is higher overlying the first photodetector 106a than overlying the third photodetector 106c. In embodiments in which the second interlayer 112s has a higher refractive index than the first interlayer 112f, the effective refractive index and the high transmission band are higher overlying the third photodetector 106c than overlying the second photodetector 106b and are higher overlying the first photodetector 106a than overlying the third photodetector 106c. On the other hand, in embodiments in which the second interlayer 112s has a lower refractive index than the first interlayer 112f, the effective refractive index and the high transmission band are lower overlying the third photodetector 106c than overlying the second photodetector 106b and are lower overlying the first photodetector 106a than overlying the third photodetector 106c.

In some embodiments, the refractive index of the second interlayer 112s is different than the refractive index of the first refractive-index layers 108 and/or the refractive index of the second refractive-index layers 110. In some embodiments, the refractive index of the second interlayer 112s is about 1.0-4.5, about 1.0-2.75, about 2.75-4.5, or some other suitable value. In some embodiments, the refractive index of the second interlayer 112s is about 1.5-4.5 and the refractive index of the first interlayer 112f is about 1.0-2.5 or vice versa. Other refractive index values are, however, amenable.

In some embodiments, the second interlayer 112s is or comprise a different material than the first refractive-index layers 108 and/or the second refractive-index layers 110. In some embodiments, the second interlayer 112s is or comprises a different material than the first interlayer 112f and/or is or comprises a dielectric. In some embodiments, the second interlayer 112s is transparent and/or has a low absorption for wavelengths to be transmitted by the narrow band filter 102. Low absorption may, for example, be absorption less than about 30%, 20%, 10%, or some other suitable value. In some embodiments, the second interlayer 112s is or comprises silicon oxide, titanium oxide, or some other suitable material. In some embodiments, the second interlayer 112s is or comprises titanium oxide, and the first interlayer 112f is or comprise silicon oxide, or vice versa.

Figure 4B:
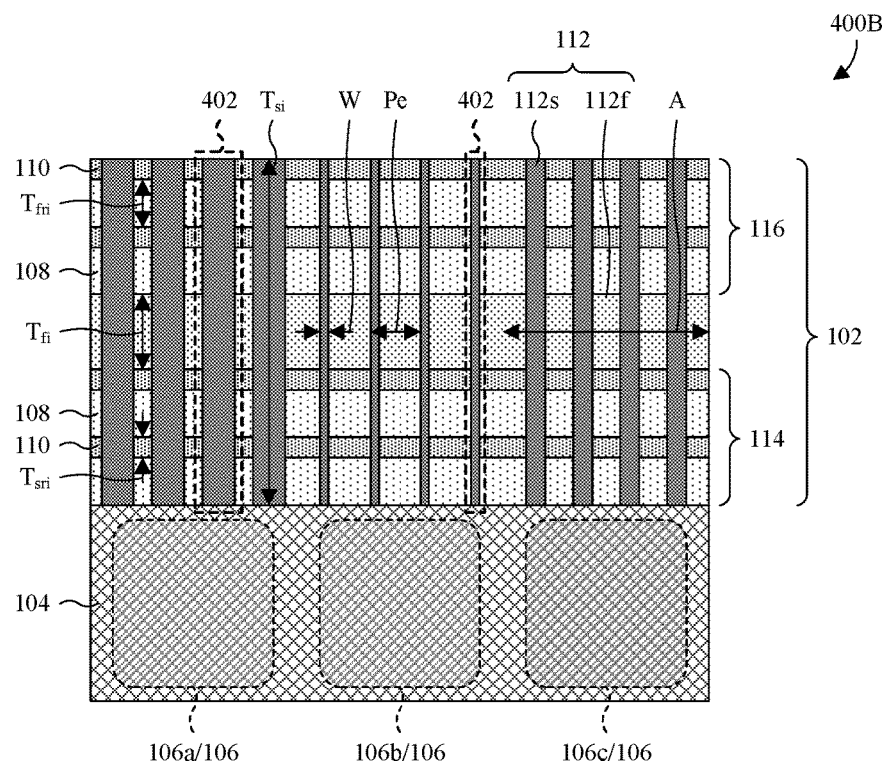

With reference to FIG. 4B, a cross-sectional view 400B of some alternative embodiments of the image sensor of FIG. 4A is provided in which the thickness $T_{si}$ of the second interlayer 112s is greater than the thickness $T_{fi}$ of the first interlayer 112f and extends through an entire thickness of the narrow band filter 102.

Figures 5A, 5B:
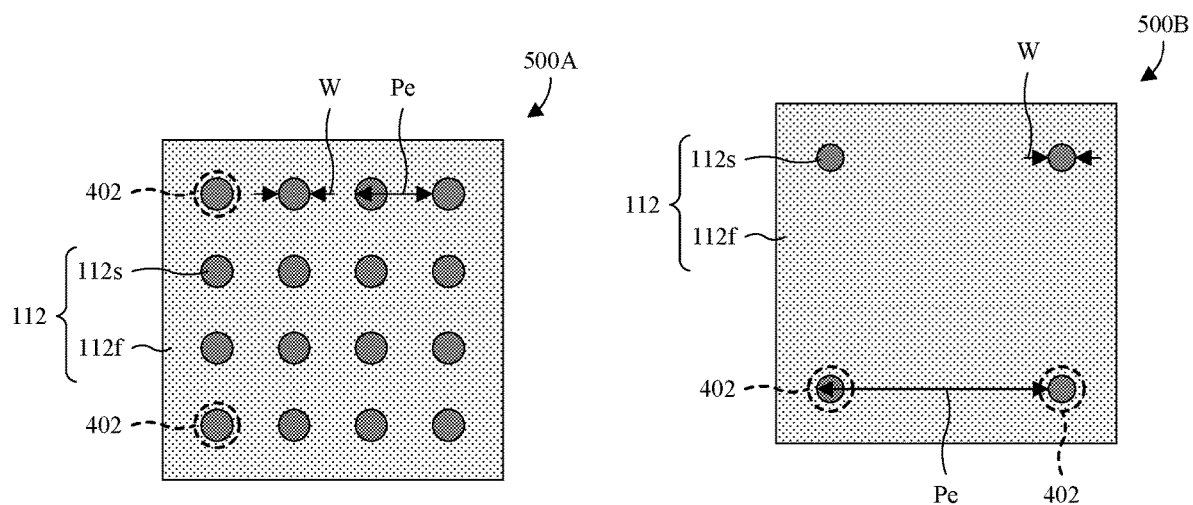

With reference to FIG. 5A, a top layout 500A of some embodiments of the interlayer structure 112 of FIGS. 4A and 4B is provided in which the columnar structures 402 are circular. The top layout 500A may, for example, be taken along line A in FIG. 4A or 4B. In alternative embodiments, the columnar structures 402 may be triangular, square, rectangular, or some other suitable shape. The shape of the columnar structures 402 may, for example, be employed to vary the periodic structure of second interlayer 112s and may, for example, therefore be employed to vary fill factors of the first and second interlayers 112f, 112s. Variation in the fill factors leads to variation in the effective refractive index of the interlayer structure 112.

With reference to FIGS. 5B-5D, top layouts 500B-500D of some alternative embodiments of the interlayer structure 112 of FIG. 5A is provided. As illustrated in FIG. 5B, the period Pe of the columnar structures 402 is increased to decrease a fill factor of the second interlayer 112s. As illustrated in FIG. 5C, the first and second interlayers 112f, 112s have been switched so the first interlayer 112f defines the columnar structures 402. As illustrated in FIG. 5D, the columnar structures 402 are diamond shaped. Further, the individual widths W of the columnar structures 402 and the period Pe of the columnar structures 402 vary.

With reference to FIG. 6, a cross-sectional view 600 of some alternative embodiments of the image sensor of FIG. 1 is provided in which the interlayer structure 112 comprises the second interlayer 112s underlying the first interlayer 112f. In alternative embodiments, the second interlayer 112s overlies the first interlayer 112f. Further, the thickness $T_{si}$ of the second interlayer 112s discretely varies across the photodetectors 106 and the thicknesses $T_{fi}$, $T_{si}$ of the first and second interlayers 112f, 112s vary so a thickness $T_i$ of the interlayer structure 112 (i.e., the sum of the thicknesses $T_{fi}$, $T_{si}$ of the first and second interlayers 112f, 112s) is uniform or substantially uniform across the photodetectors 106.

By varying the thicknesses $T_{fi}$, $T_{si}$ of the first and second interlayers 112f, 112s across the photodetectors 106, the ratio of the second interlayer 112s to the first interlayer 112f varies across the photodetectors. Increasing the ratio increases the fill factor of the second interlayer 112s while decreasing the fill factor of the first interlayer 112f. Decreasing the ratio decreases the fill factor of the second interlayer 112s while increasing the fill factor of the first interlayer 112f. As described above, such fill factor variations vary an effective refractive index of the interlayer structure 112 across the photodetectors 106 and hence vary a high transmission band of the narrow band filter 102 across the photodetectors 106. Therefore, variation in the thicknesses $T_{fi}$, $T_{si}$ of the first and second interlayers 112f, 112s may be employed to vary the effective refractive index of the interlayer structure 112 and hence to vary the high transmission band. This, in turn, may be used to allow the photodetectors 106 to discriminate between different wavelengths of radiation and hence different colors of radiation.

For example, as illustrated, the thicknesses $T_{fi}$, $T_{si}$ of the first and second interlayers 112f, 112s are different overlying each of the first, second, and third photodetectors 106a-106c, so the fill factors of the first and second interlayers 112f, 112s are different. The fill factor of the second interlayer 112s is higher overlying the third photodetector 106c than overlying the second photodetector 106b and is higher overlying the first photodetector 106a than overlying the third photodetector 106c. In embodiments in which the second interlayer 112s has a higher refractive index than the first interlayer 112f, the effective refractive index and the high transmission band are higher overlying the third photodetector 106c than overlying the second photodetector 106b and are higher overlying the first photodetector 106a than overlying the third photodetector 106c. In embodiments in which the second interlayer 112s has a lower refractive index than the first interlayer 112f, the effective refractive index and the high transmission band are lower overlying the third photodetector 106c than overlying the second photodetector 106b and are lower overlying the first photodetector 106a than overlying the third photodetector 106c.

Figure 7A:
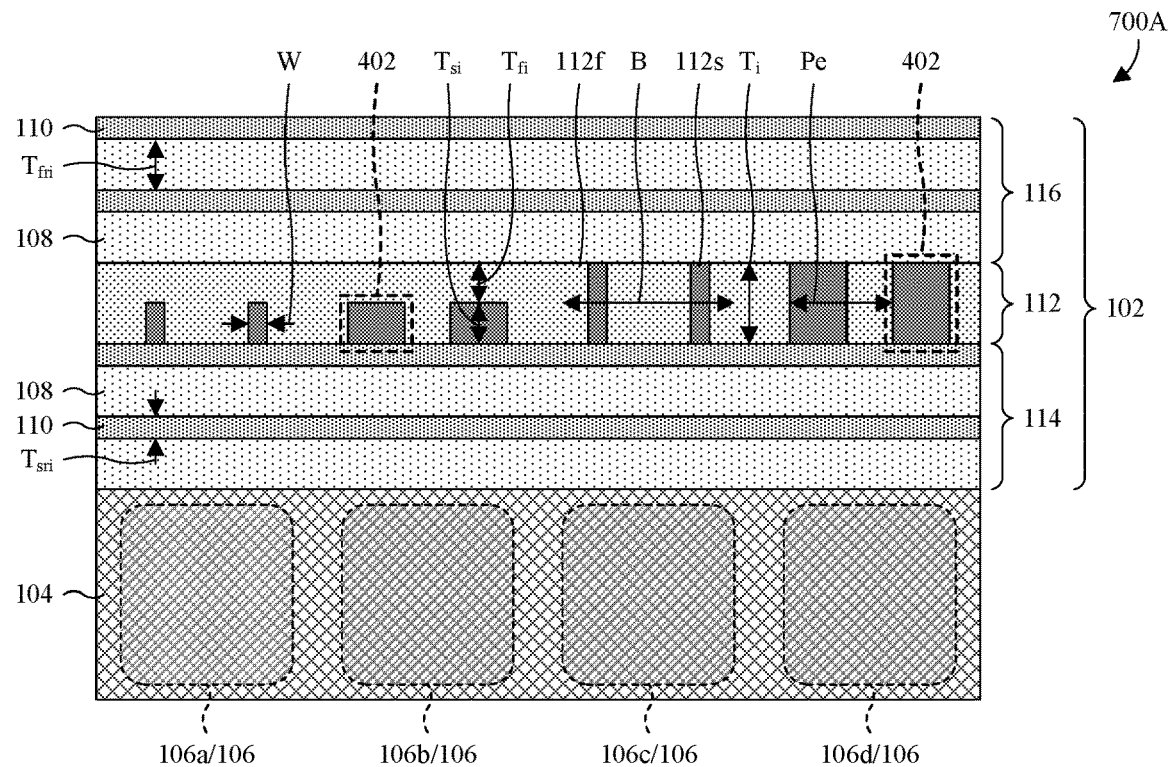
FIGS. 7A and 7B illustrate cross-sectional views of various alternative embodiments of the image sensor of FIG. 6.
Figure 7B:
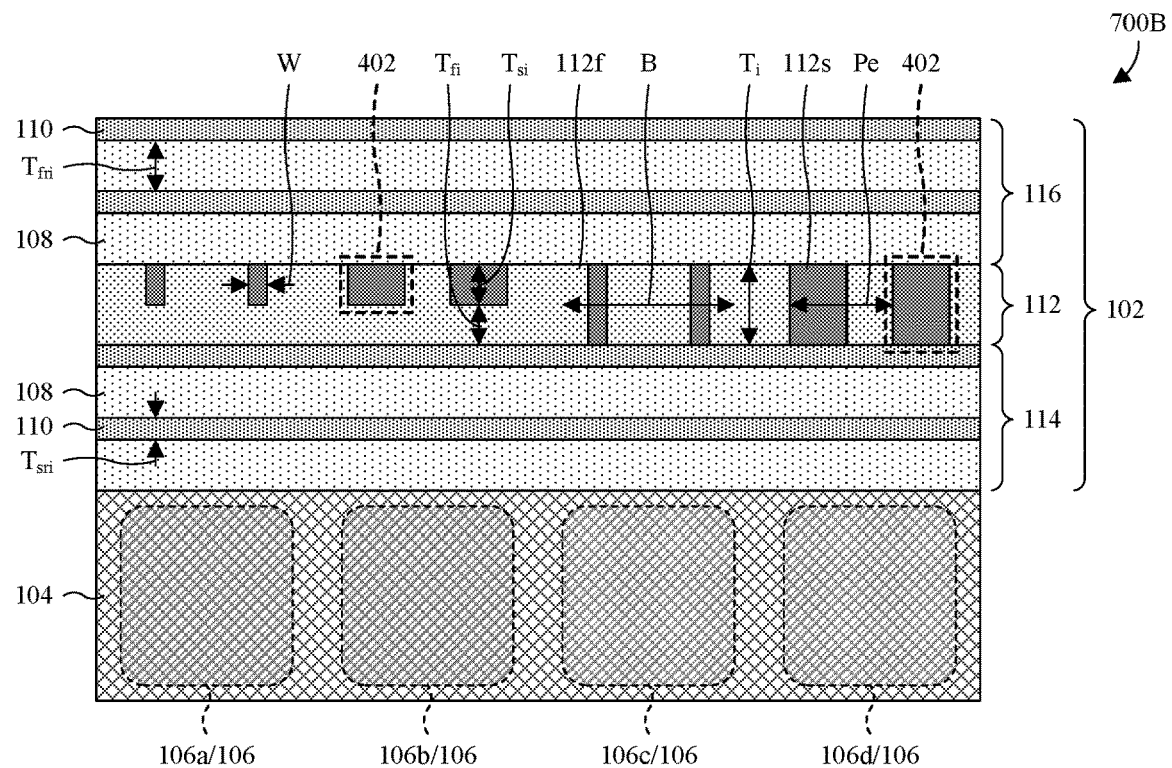

With reference to FIGS. 7A and 7B, cross-sectional views 700A, 700B of some alternative embodiments of the image sensor of FIG. 6 is provided in which the plurality of photodetectors 106 further comprises a fourth photodetector 106d. Further, the second interlayer 112s further defines the columnar structures 402 as described with regard to FIG. 4A. As illustrated in FIG. 7A, the second interlayer 112s underlies the first interlayer 112f. As illustrated in FIG. 7B, the second interlayer 112s overlies the first interlayer 112f. In some embodiments, a top layout of the columnar structures 402, as taken along line B, is as shown in FIG. 5B. In alternative embodiments, the top layout of the columnar structures 402 is as illustrated in any one of FIGS. 5A, 5C, and 5D. Other top layouts are, however, amenable.

The columnar structures 402 together with variations in the thicknesses $T_{fi}$, $T_{si}$ of the first and second interlayers 112f, 112s are employed to vary fill factors of the first and second interlayers 112f, 112s. As described above, such fill factor variations vary an effective refractive index of the interlayer structure 112 across the photodetectors 106 and hence vary a high transmission band (see, e.g., 206 in FIG. 2) of the narrow band filter 102 across the photodetectors 106. This, in turn, allows the narrow band filter 102 to selectively transmit radiation to the photodetectors 106 so the photodetectors 106 can discriminate between different wavelengths of radiation and hence different colors of radiation.

For example, as illustrated, the fill factor of the second interlayer 112s is higher overlying the third photodetector 106c than overlying the first photodetector 106a, is higher overlying the second photodetector 106b than overlying the third photodetector 106c, and is higher overlying the fourth photodetector 106d than overlying the second photodetector 106b. In embodiments in which the second interlayer 112s has a higher refractive index than the first interlayer 112f, the effective refractive index and the high transmission band are higher overlying the third photodetector 106c than overlying the first photodetector 106a, are higher overlying the second photodetector 106b than overlying the third photodetector 106c, and are higher overlying the fourth photodetector 106d than overlying the second photodetector 106b. In embodiments in which the second interlayer 112s has a lower refractive index than the first interlayer 112f, the effective refractive index and the high transmission band are lower overlying the third photodetector 106c than overlying the first photodetector 106a, are lower overlying the second photodetector 106b than overlying the third photodetector 106c, and are lower overlying the fourth photodetector 106d than overlying the second photodetector 106b.

Figure 8A:
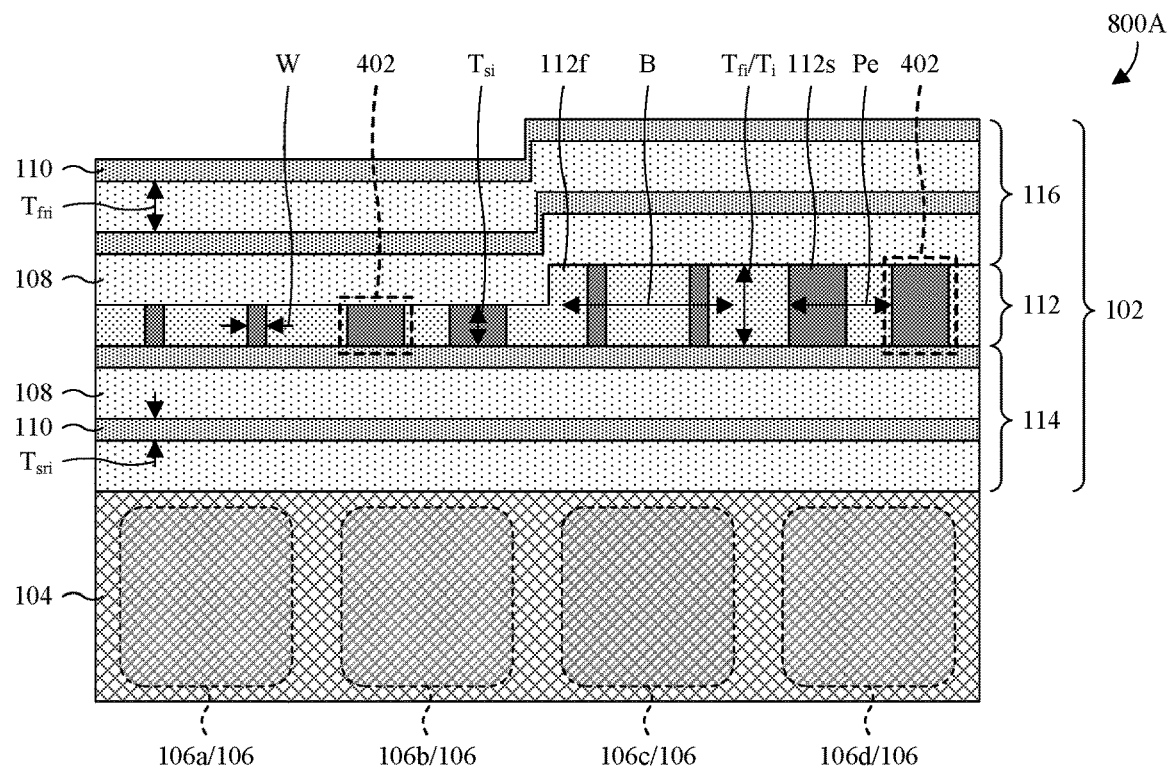
FIGS. 8A and 8B illustrate cross-sectional views of various embodiments of an image sensor comprising a narrow band filter in which a ratio between interlayers varies and the interlayers and the narrow band filter have variable thicknesses.

With reference to FIG. 8A, a cross-sectional view 800A of some alternative embodiments of the image sensor of FIG. 7A is provided in which the thickness $T_i$ of the interlayer structure 112 varies discretely across the photodetectors 106 and the first and second interlayers 112f, 112s do not overlap. Further, the columnar structures 402 and the thickness $T_i$ are both employed to shift the high transmission band.

Increasing the thickness $T_i$ shifts the high transmission band to higher wavelengths and decreasing the thickness $T_i$ shifts the high transmission band to lower wavelengths. Increasing the fill factor of high refractive index material using the columnar structures 402 increases the effective refractive index of the interlayer structure 112 and shifts the high transmission band to higher wavelengths. Decreasing the fill factor of high refractive index material using the columnar structures 402 decreases the effective refractive index of the interlayer structure 112 and shifts the high transmission band to lower wavelengths. Therefore, the high transmission band is shifted to higher wavelengths as a product of the thickness $T_i$ and the effective refractive index increases and is shifted to lower wavelengths as the product decreases.

Shifting the location of the high transmission band by the effective refractive index (e.g., as in FIG. 4A) allows fine adjustments to the location compared to shifting the location by thickness (e.g., as in FIG. 1). On the other hand, shifting the location of the high transmission band by thickness (e.g., as in FIG. 1) allows coarse adjustments to the location compared to shifting the location by the effective refractive index (e.g., as in FIG. 4A). Shifting the location of the high transmission band by both effective refractive index and thickness (e.g., as in FIG. 8A) allows both fine and coarse adjustments to the location.

Because the fill factor of the of the second interlayer 112s varies across the photodetectors 106, the effective refractive index of the interlayer structure 112 varies across the photodetectors 106. Because the effective refractive index and the thickness $T_i$ both vary across the photodetectors 106, both the effective refractive index and the thickness $T_i$ contribute to a shift in the high transmission band across the photodetectors 106. In some embodiments, the high transmission band is shifted by a different amount at each of the photodetectors 106.

Figure 8B:
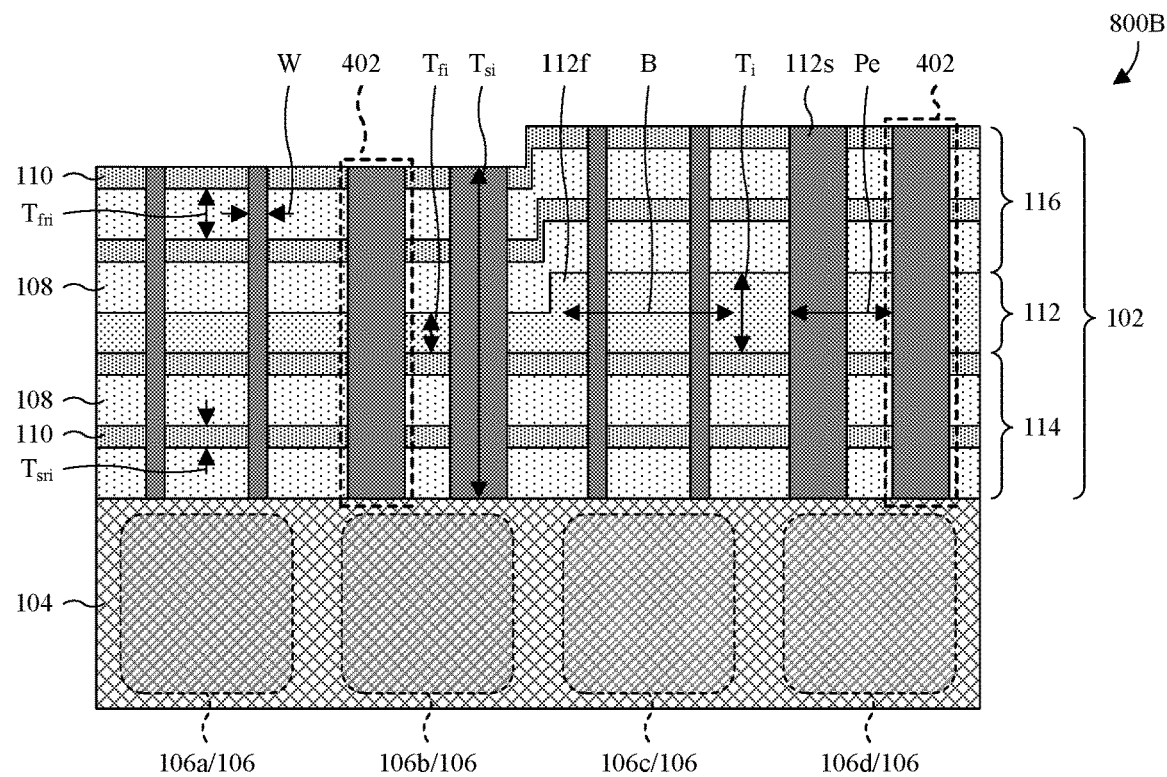

With reference to FIG. 8B, a cross-sectional view 800B of some alternative embodiments of the image sensor of FIG. 8A is provided in which the thickness $T_{si}$ of the second interlayer 112s is greater than the thickness $T_{fi}$ of the first interlayer 112f and extends through an entire thickness of the narrow band filter 102. Further, the thickness $T_i$ of the interlayer structure 112 alternatives between the thickness $T_{fi}$ of the first interlayer 112f and the thickness $T_{si}$ of the second interlayer 112s across the photodetectors 106.

Figure 9:
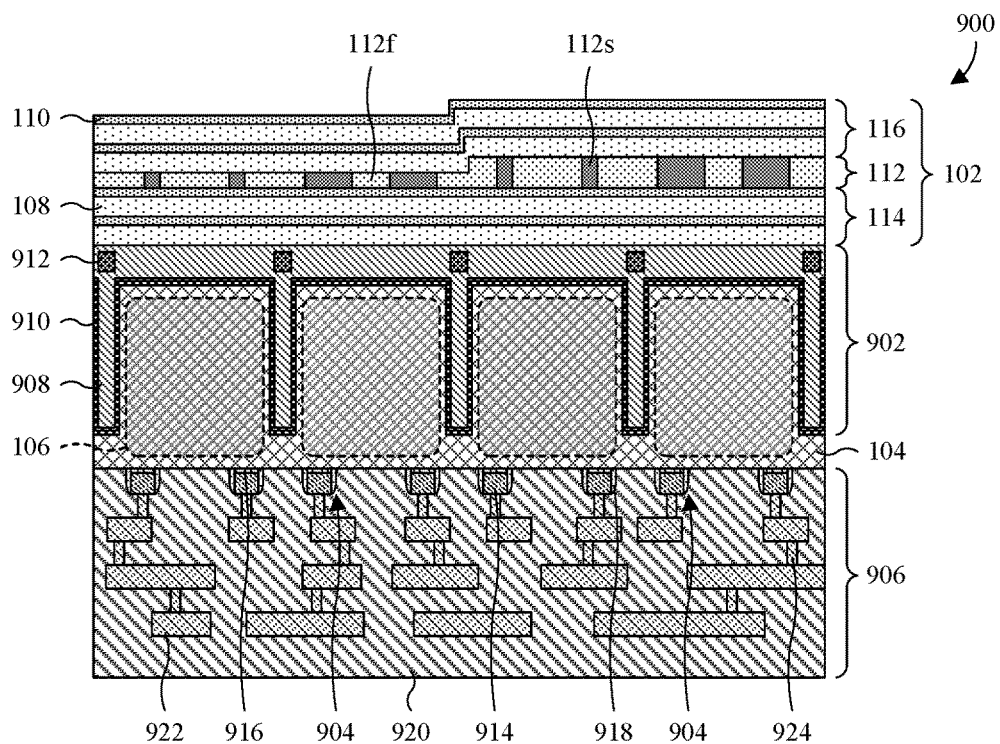
FIG. 9 illustrates a cross-sectional view of some embodiments of the image sensor of FIG. 8A in which an interconnect structure and semiconductor devices are further shown.

With reference to FIG. 9, a cross-sectional view 900 of some more detailed embodiments of the image sensor of FIG. 8A is provided in which the narrow band filter 102 is on a backside of the substrate 104 and is separated from the backside by a backside structure 902. Further, semiconductor devices 904 and an interconnect structure 906 are on a frontside of the substrate 104 that is opposite the backside of the substrate 104.

The backside structure 902 comprises an isolation layer 908, an isolation liner 910, and a metal grid 912. The isolation layer 908 and the isolation liner 910 cover the backside of the substrate 104. The isolation layer 908 protrudes into the substrate 104 to separate the photodetectors 106 from each other, and the isolation liner 910 lines an underside of the isolation layer 908 to separate the isolation layer 908 from the substrate 104. Collectively, the protrusions define a backside trench isolation structure. The isolation layer 908 may be or comprise, for example, silicon oxide and/or some other suitable dielectric(s). The isolation liner 910 may, for example, a high k dielectric having a dielectric constant greater than about 10 and/or some other suitable dielectric(s). In some embodiments, the isolation layer 908 and/or the isolation liner 910 is/are an antireflective coating (ARC).

The metal grid 912 is buried in the isolation layer 908 to act as reflective guide for radiation traveling to the photodetectors 106. By acting as a radiation guide, the metal grid 912 may, for example, reduce cross talk between the photodetectors 106 and enhance quantum efficiency. The metal grid 912 may be or comprise, for example, copper, aluminum copper, aluminum, some other suitable metal(s), or any combination of the foregoing.

The semiconductor devices 904 are partially defined by the substrate 104 and may be, for example, metal-oxide-semiconductor field-effect devices (MOSFETs), some other suitable metal-oxide-semiconductor (MOS) devices, some other suitable insulated-gate field-effect transistors (IGFETs), some other suitable semiconductor devices, or any combination of the foregoing. In some embodiments, the semiconductor devices 904 and the photodetectors 106 collectively define pixel sensors. The pixel sensors may, for example, be active pixel sensors or some other suitable pixel sensors. In some embodiments, the semiconductor devices 904 comprise corresponding gate electrodes 914, corresponding gate dielectric layers 916, corresponding dielectric spacers 918, and corresponding source/drain regions (not shown). The source/drain regions are in the substrate 104, and the gate electrodes 914 are each sandwiched between two of the source/drain regions. The gate dielectric layers 916 space the gate electrodes 914 from the substrate 104. The dielectric spacers 918 are on sidewalls of the gate electrodes 914.

The interconnect structure 906 comprises an interconnect dielectric layer 920, a plurality of wires 922, and a plurality of vias 924. The wires 922 and the vias 924 are alternatingly stacked in the interconnect dielectric layer 920 to define conductive paths to the semiconductor devices 904. The conductive paths interconnect the semiconductor devices 904 and/or provide electrically coupling to the semiconductor devices 904 from outside the image sensor.

Figure 10:
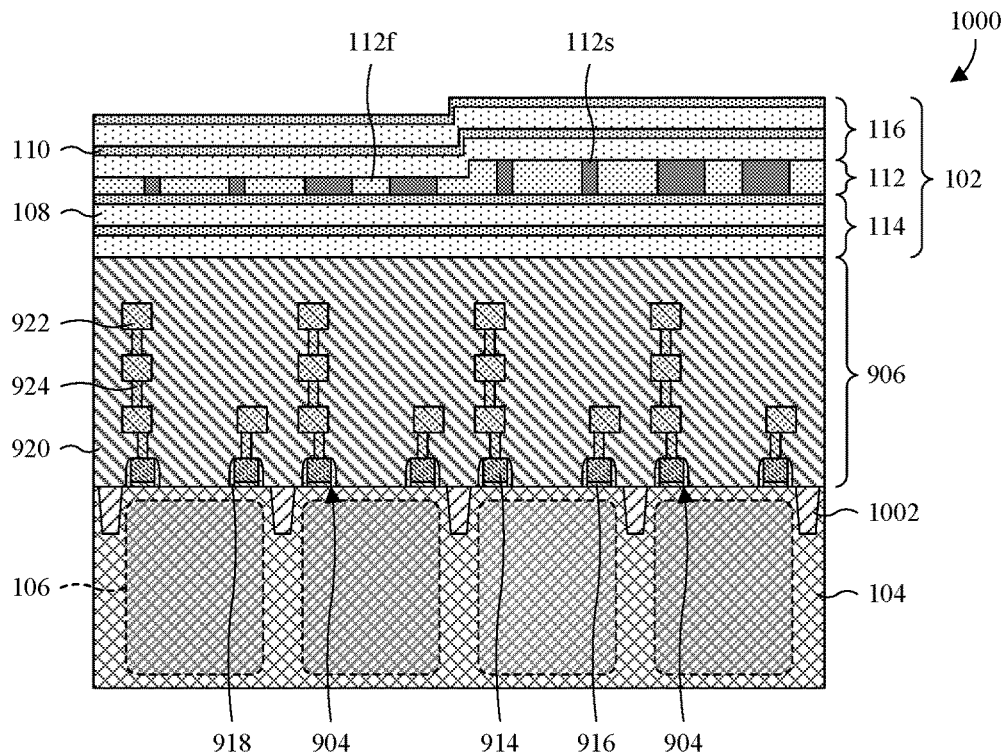
FIG. 10 illustrates a cross-sectional view of some alternative embodiments of the image sensor of FIG. 9 in which the image sensor is frontside illuminated (FSI).

With reference to FIG. 10, a cross-sectional view 1000 of some alternative embodiments of the image sensor of FIG. 9 is provided in which the image sensor is frontside illuminated instead of backside illuminated. As such, the backside structure 902 is omitted and a trench isolation structure 1002 extends into the frontside of the substrate 104 to physically and electrically separate the photodetectors 106. The trench isolation structure 1002 is or comprises a dielectric and may, for example, be a shallow trench isolation (STI) structure or some other suitable trench isolation structure. Further, the semiconductor devices 904 and the interconnect structure 906 are between the substrate 104 and the narrow band filter 102.

While FIGS. 9 and 10 are illustrated using embodiments of the narrow band filter 102 in FIG. 8A, embodiments of the narrow band filter 102 in any one of FIGS. 1, 3, 4A, 4B, 6, 7A, 7B, and 8B may be used in alternative embodiments.

With reference to FIGS. 11-16, 17A, and 18, a series of cross-sectional views 1100-1600, 1700A, 1800 of some embodiments of a method using a gray mask to form an image sensor comprising a narrow band filter that has a single interlayer with a thickness that varies is provided. An example of such a narrow band filter is illustrated and described with regard to FIG. 1.

Figure 11:
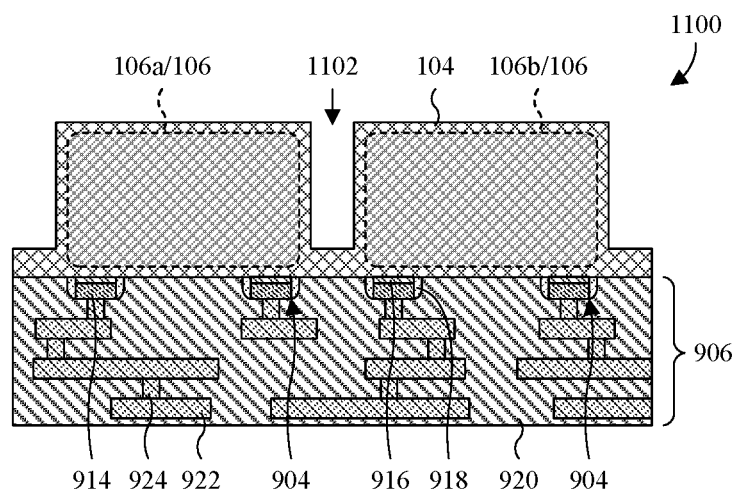

As illustrated by the cross-sectional view 1100 of FIG. 11, a backside of a substrate 104 is patterned to form a trench 1102 separating photodetectors 106 in the substrate 104. The photodetectors 106 comprise a first photodetector 106a and a second photodetector 106b. The backside of the substrate 104 is on an opposite side of the substrate 104 as a frontside of the substrate 104, and semiconductor devices 904 and an interconnect structure 906 are on the frontside of the substrate 104. The semiconductor devices 904 and/or the interconnect structure 906 may, for example, be as described with regard to FIG. 9. The patterning may, for example, be performed by a photolithography/etching process or some other suitable patterning process.

Figure 12:
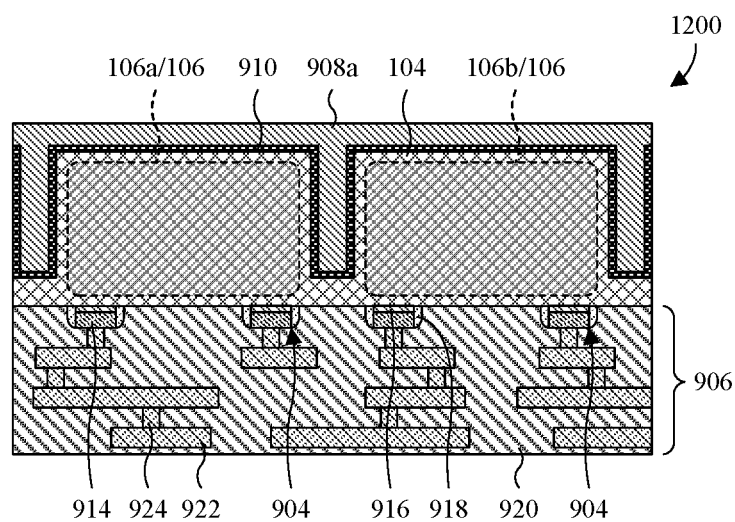

As illustrated by the cross-sectional view 1200 of FIG. 12, an isolation liner 910 and a first isolation layer 908a are sequentially deposited covering the backside of the backside of the substrate 104 and filling the trench 1102 (see, e.g., FIG. 11). The isolation liner 910 lines the backside of the backside of the substrate 104 and partially fills the trench 1102. The first isolation layer 908a covers the isolation liner 910 and fills the trench 1102 over the isolation liner 910. Collectively, the isolation liner 910 and the first isolation layer 908a define a backside trench isolation structure. In some embodiments, after depositing the first isolation layer 908a, a top surface of the first isolation layer 908a is planarized so it is planar or substantially planar. The first isolation layer 908a may be or comprise, for example, silicon oxide and/or some other suitable dielectric(s). The isolation liner 910 may, for example, a high k dielectric having a dielectric constant greater than about 10 and/or some other suitable dielectric(s). In some embodiments, the isolation liner 910 is an ARC.

Figure 13:
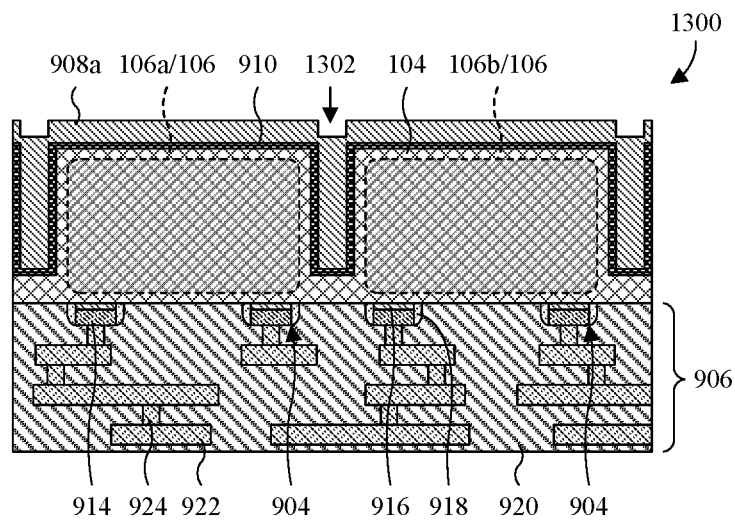

As illustrated by the cross-sectional view 1300 of FIG. 13, the first isolation layer 908a is patterned to form a metal-grid opening 1302 extending laterally (when viewed top down) to individually surround each of the photodetectors 106. The patterning may, for example, be performed by a photolithography/etching process or some other suitable patterning process.

Figure 14:
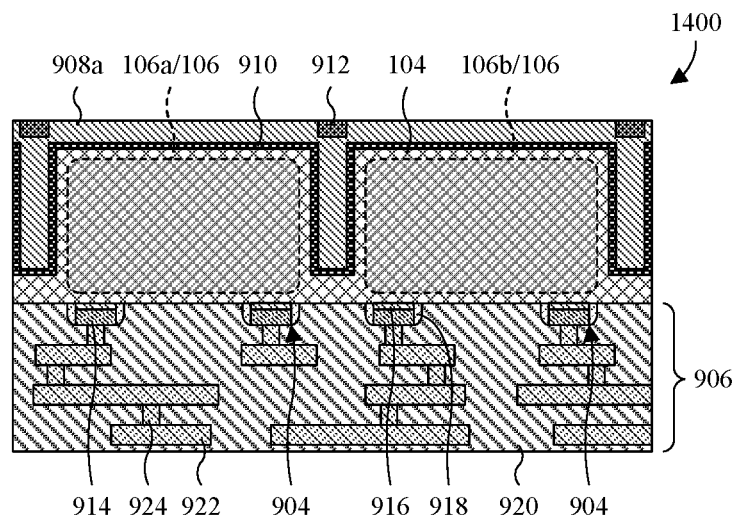

As illustrated by the cross-sectional view 1400 of FIG. 14, a metal grid 912 is formed in the metal-grid opening 1302 (see, e.g., FIG. 13). A process for forming the metal grid 912 may, for example, comprise depositing a metal layer in the metal-grid opening 1302 and subsequently performing a planarization into the metal layer until a top surface of the first isolation layer 908a is reached. Other processes for forming the metal grid 912 are, however, amenable.

Figure 15:
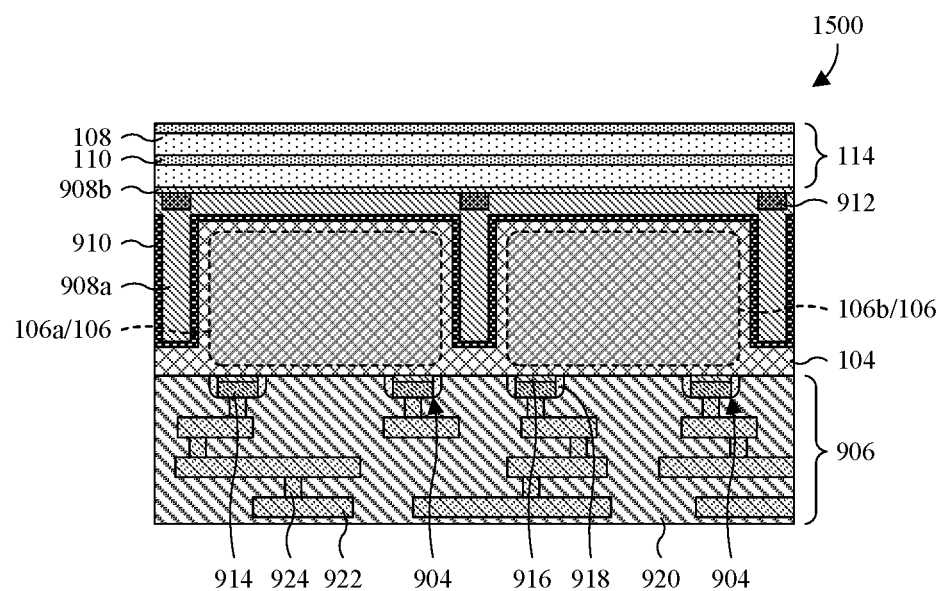

As illustrated by the cross-sectional view 1500 of FIG. 15, a second isolation layer 908b is deposited over the metal grid 912 and the first isolation layer 908a. The second isolation layer 908b may be or comprise, for example, silicon oxide and/or some other suitable dielectric(s).

Also illustrated by the cross-sectional view 1500 of FIG. 15, one or more first refractive-index layers 108 and one or more second refractive-index layers 110 are deposited over the second isolation layer 908b. In total, at least three layers are deposited. The first and second refractive-index layers 108, 110 have different refractive indexes and are stacked in a periodic pattern to define a lower multilayer film 114. In some embodiments, the lower multilayer film 114 is or defines a DBR. The first and second refractive-index layers 108, 110 and the lower multilayer film 114 may, for example, be as described with regard to FIG. 1.

Figure 16:
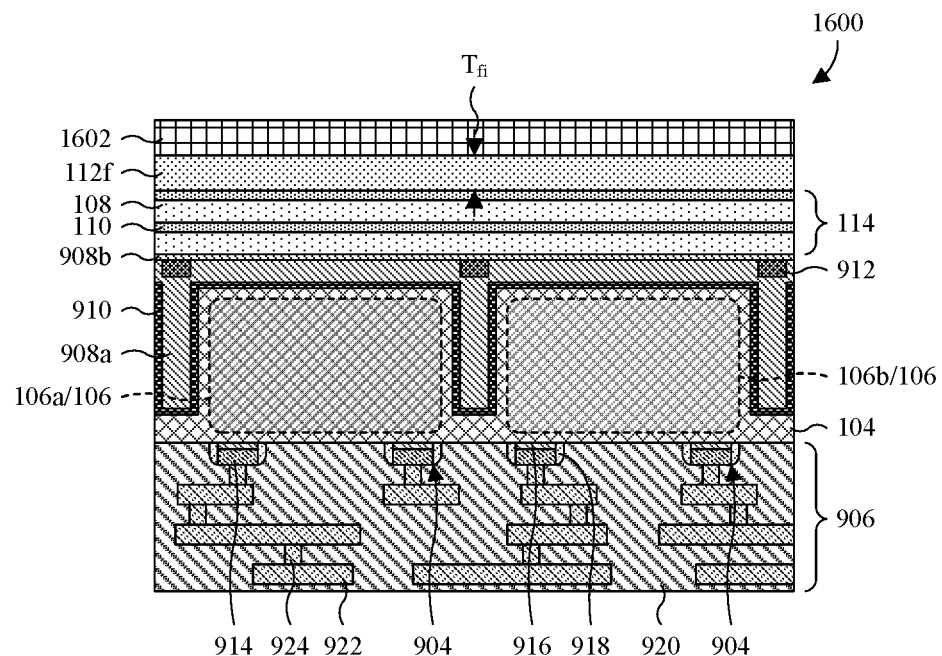

As illustrated by the cross-sectional view 1600 of FIG. 16, a first interlayer 112f is deposited over the lower multilayer film 114. The first interlayer 112f has a different refractive index, a different thickness, a different material, or any combination of the foregoing when compared to the first and/or second refractive-index layer(s) 108, 110 to break the periodic pattern at the lower multilayer film 114.

In some embodiments, the refractive index of the first interlayer 112f is different than the refractive index of the first refractive-index layer(s) 108 and/or the refractive index of the second refractive-index layer(s) 110. In some embodiments, the refractive index of the first interlayer 112f is about 1.0-4.5, about 1.0-2.75, about 2.75-4.5, or some other suitable value. In some embodiments, the thickness $T_{fi}$ of the first interlayer 112f is about 30-600 nanometers, about 30-315 nanometers, about 315-600 nanometers, or some other suitable value. In some embodiments, the first interlayer 112f is or comprises a dielectric. In some embodiments, the first interlayer 112f is transparent and/or has a low absorption for wavelengths to be transmitted by the narrow band filter 102. Low absorption may, for example, be absorption less than about 30%, 20%, 10%, or some other suitable value. In some embodiments, the first interlayer 112f is or comprises silicon oxide, titanium oxide, or some other suitable material.

Also illustrated by the cross-sectional view 1600 of FIG. 16, a mask layer 1602 is deposited over the first interlayer 112f. The mask layer 1602 is a photoresist or some other suitable photosensitive material and may, for example, be deposited by spin on coating or some other suitable deposition process.

As illustrated by the cross-sectional view 1700A of FIG. 17A, the mask layer 1602 is exposed to radiation 1702 through a gray mask 1704 so an intensity of the radiation 1702 is greater directly over the first photodetector 106a than directly over the second photodetector 106b. As a result, subsequent application of developer to the mask layer 1602 removes a greater amount of the mask layer 1602 directly over the first photodetector 106a than directly over the second photodetector 106b. Further, a thickness $T_{msk}$ of the mask layer 1602 is less directly over the first photodetector 106a than directly over the second photodetector 106b.

The gray mask 1704 has a plurality of opaque regions 1704o that are surrounded by a transparent region 1704t. The opaque regions 1704o define a periodic pattern that varies laterally and repeat with a pitch Pi that is less than a wavelength of the radiation 1702. Because the pitch Pi is less than the wavelength, the intensity of the radiation 1702 passing through the gray mask 1704 varies with the fill factor of the opaque regions 1704o. As the fill factor increases, the intensity of the radiation 1702 decreases, and vice versa. Accordingly, because the fill factor of the opaque regions 1704o is greater directly over the second photodetector 106b than directly over the first photodetector 106a, the intensity of the radiation 1702 is greater directly over the first photodetector 106a than over the second photodetector 106b.

With further reference to FIGS. 17B and 17C, operation of the gray mask 1704 of FIG. 17A according to some embodiments of the gray mask 1704 is illustrated. FIG. 17B is an expanded top layout 1700B of some embodiments of the gray mask 1704 and has a fill factor discretely increasing from left to right. FIG. 17B is "expanded" in that it illustrates more of the gray mask 1704 than illustrated in FIG. 17A. FIG. 17C is a graph 1700C of some embodiments of a curve 1706 describing intensity as function of fill factor for the gray mask 1704. As seen in FIG. 17C, intensity discretely decreases as fill factor discretely increases.

Figure 18:
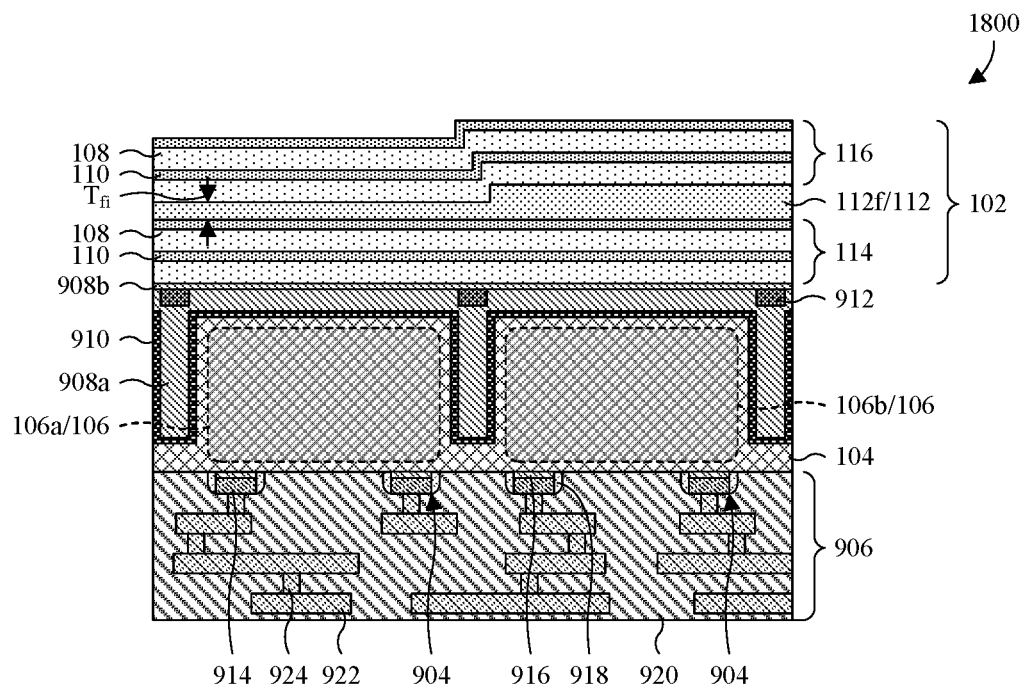

As illustrated by the cross-sectional view 1800 of FIG. 18, an etch is performed into the mask layer 1602 (see, e.g., FIG. 17) and the first interlayer 112f to transfer a pattern of the mask layer 1602 to the first interlayer 112f. As a result of the pattern transfer, a thickness $T_{fi}$ of the first interlayer 112f discretely varies across the first and second photodetectors 106a, 106b. Further, the first interlayer 112f defines an interlayer structure 112. Because of the use of the gray mask 1704 (see FIG. 17A), the thickness $T_{fi}$ of the first interlayer 112f may be varied across the photodetectors 106 with a single mask. Photomasks are costly, whereby use of a single mask reduces costs.

During the etch, the etch thins the mask layer 1602 until the first interlayer 112f is exposed directly over the first photodetector 106a. At this point, the second photodetector 106b remains covered by the mask layer 1602. The etch then etches into the first interlayer 112f directly over the first photodetector 106a while it simultaneously etches into the mask layer 1602 directly over the second photodetector 106b. This persists until the pattern of the mask layer 1602 has been transferred to the first interlayer 112f and, in some embodiments, the mask layer 1602 has been removed. To the extent that any of the mask layer 1602 remains after the etch, the remainder of the mask layer 1602 is removed from the first interlayer 112f.

Also illustrated by the cross-sectional view 1800 of FIG. 18, one or more additional first refractive-index layers 108 and one or more additional second refractive-index layers 110 are deposited over the first interlayer 112f. In total, at least three layers are deposited. The additional first and second refractive-index layers 108, 110 have different refractive indexes and are stacked in a periodic pattern to define an upper multilayer film 116. In some embodiments, the upper multilayer film 116 is or defines a DBR. The additional first and second refractive-index layers 108, 110 and the upper multilayer film 116 may, for example, be as described with regard to FIG. 1. Collectively, the lower and upper multilayer films 114, 116 and the interlayer structure 112 define a narrow band filter 102.

During use of the image sensor, the narrow band filter 102 receives radiation en route to the photodetectors 106. Further, the narrow band filter 102 selectively transmits the radiation 118 to the photodetectors 106 by constructive and destructive interference of reflections at interfaces between the first and second refractive-index layers 108, 110 and the first interlayer 112f. Such selective transmission, in turn, allows the photodetectors 106 to discriminate between different wavelengths and different colors of radiation.

The lower and upper multilayer films 114, 116 result in a low transmission band (see, e.g., 204 in FIG. 2), and the interlayer structure 112 results in a high transmission band (see, e.g., 206 in FIG. 2) that is narrow and bisects the low transmission band. Increasing the thickness $T_{fi}$ of the first interlayer 112f shifts the high transmission band to higher wavelengths and decreasing the thickness $T_{fi}$ shifts the high transmission band to lower wavelengths. Because the thickness $T_{fi}$ of the first interlayer 112f is greater directly over the second photodetector 106b than directly over the first photodetector 106a, the high transmission band may be at higher wavelengths directly over the second photodetector 106b than directly over the first photodetector 106a. This allows the narrow band filter 102 to discriminate between different wavelengths of radiation and hence different colors.

While FIGS. 17A and 18 illustrate embodiments of the method using the gray mask 1704 of FIG. 17A to discretely vary the thickness $T_{msk}$ of the mask layer 1602 of FIG. 17A, alternative embodiments of the method may use the gray mask 1704 to continuously vary the thickness $T_{msk}$. For example, the opaqueness of the gray mask 1704 may vary continuously, and/or a fill factor of the opaque regions 1704o may vary continuously, so intensity of the radiation 1702 passing through the gray mask 1704 varies continuously.

Figure 19A:
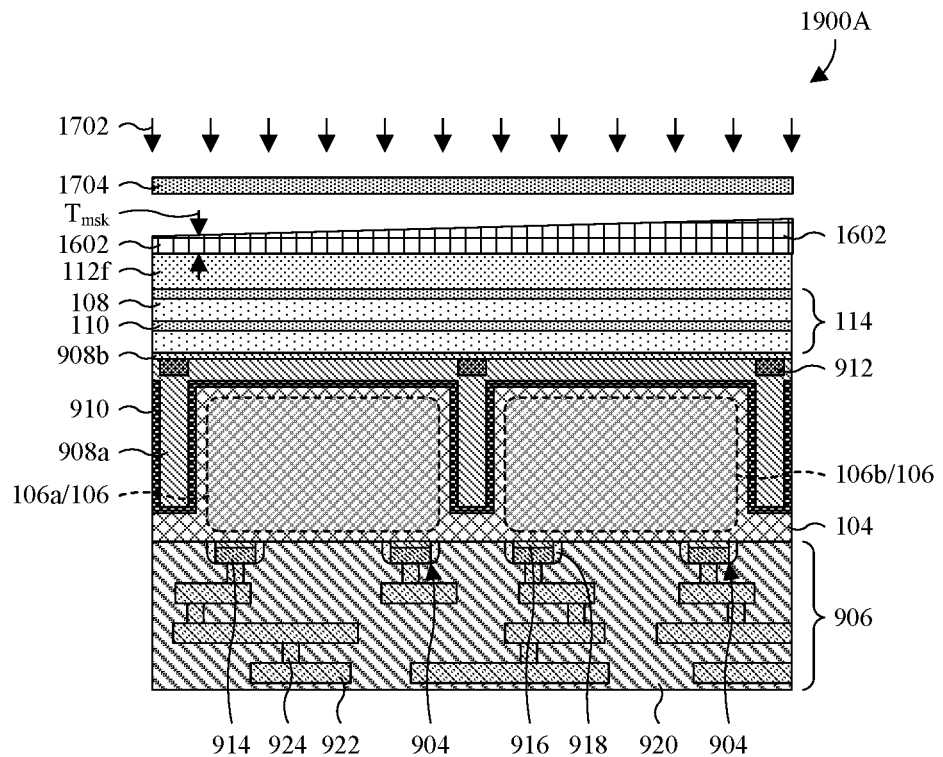

With reference to FIGS. 19A and 20, cross-sectional views 1900A, 2000 illustrate some of the alternative embodiments of the method. These alternative embodiments proceed from the acts at FIGS. 11-16 to the acts at FIG. 19A, and from the acts at FIG. 19A to the acts at FIG. 20, while skipping the acts at FIGS. 17A and 18. Hence, FIGS. 19A and 20 are alternatives to FIGS. 17A and 18. Further, FIGS. 19A and 20 are respectively as FIGS. 17A and 18 are described except for the differences resulting from the thickness $T_{msk}$ of the mask layer 1602 varying continuously.

With further reference to FIGS. 19B and 19C, operation of the gray mask 1704 of FIG. 19A according to some embodiments of the gray mask 1704 is illustrated. FIG. 19B is an expanded top layout 1900B of some embodiments of the gray mask 1704 and has a fill factor continuously increasing from left to right. FIG. 19C is a graph 1900C of some embodiments of a curve 1706 describing intensity as function of fill factor for the gray mask 1704. As seen in FIG. 19C, intensity continuously decreases as fill factor continuously increases. FIGS. 19B and 19C may be regarded as alternative embodiments respectively of FIGS. 17B and 17C.

While FIGS. 11-16, 17A, 18, 19A, and 20 are described with reference to a method, it will be appreciated that the structures shown in FIGS. 11-16, 17A, 18, 19A, and 20 are not limited to the method but rather may stand alone separate of the method. While FIGS. 11-16, 17A, 18, 19A, and 20 are described as a series of acts, it will be appreciated that the order of the acts may be altered in other embodiments. While FIGS. 11-16, 17A, 18, 19A, and 20 illustrate and describe as a specific set of acts, some acts that are illustrated and/or described may be omitted in other embodiments. Further, acts that are not illustrated and/or described may be included in other embodiments.

Figure 21:
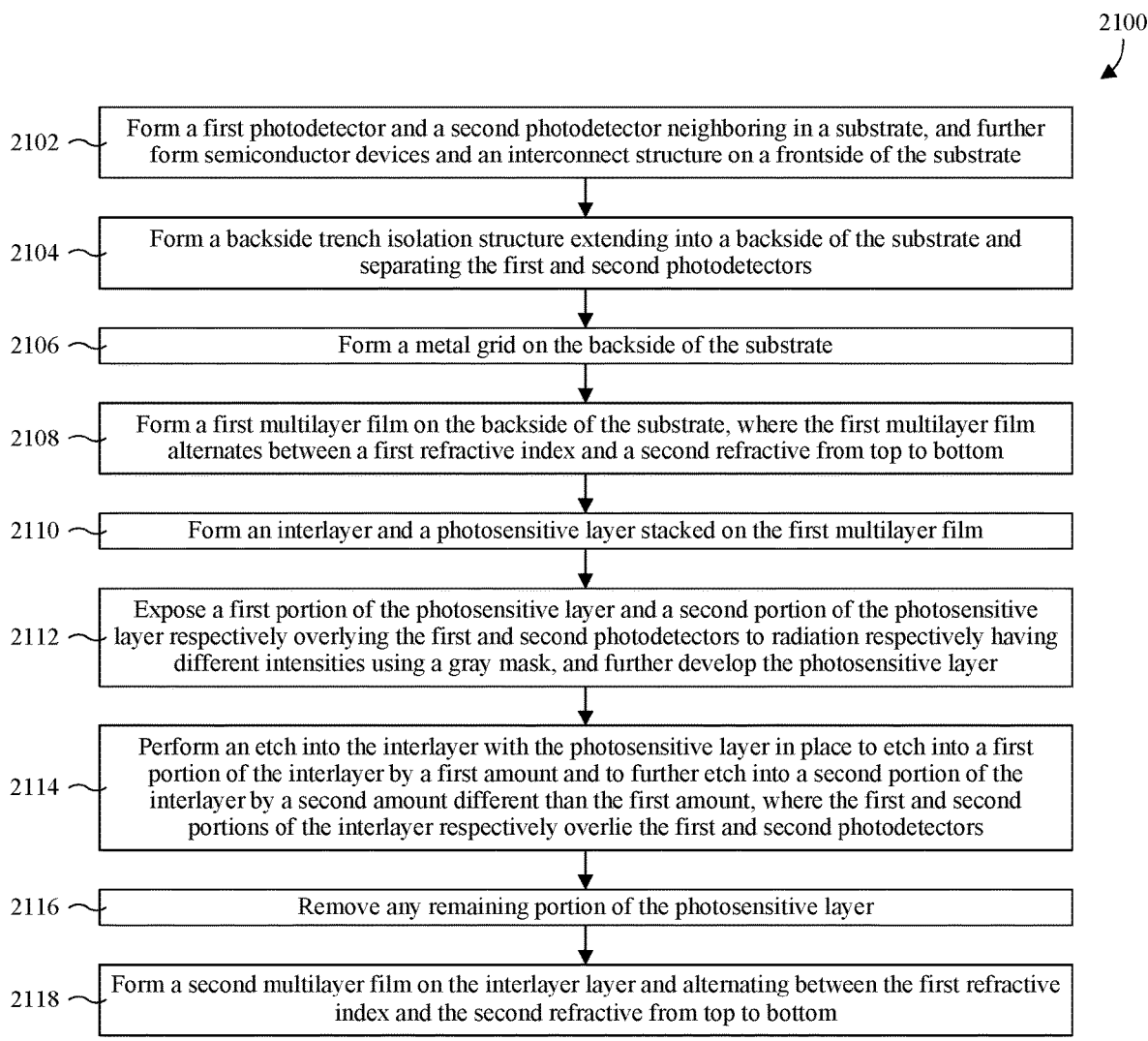
FIG. 21 illustrates a block diagram of some embodiments of the method of FIGS. 11-16, 17A, 18, 19A, and 20.

With reference to FIG. 21, a block diagram 2100 of some embodiments of the method of FIGS. 11-16, 17A, 18, 19A, and 20 is provided.

At 2102, a first photodetector and a second photodetector are formed neighboring in a substrate. Further, semiconductor devices and an interconnect structure are formed on a frontside of the substrate. See, for example, FIG. 11.

At 2104, a backside trench isolation structure is formed extending into a backside of the substrate and separating the first and second photodetectors. See, for example, FIGS. 11 and 12.

At 2106, a metal grid is formed on the backside of the substrate. See, for example, FIGS. 13 and 14.

At 2108, a first multilayer film is formed on the backside of the substrate, where the first multilayer film alternates between a first refractive index and a second refractive from top to bottom. See, for example, FIG. 15.

At 2110, an interlayer and a photosensitive layer are formed stacked on the first multilayer film. See, for example, FIG. 16.

At 2112, a first portion of the photosensitive layer and a second portion of the photosensitive layer respectively overlying the first and second photodetectors are exposed to radiation respectively having different intensities using a gray mask. Further, the photosensitive layer is developed. See, for example, FIG. 17A or 19A.

At 2114, an etch is performed into the interlayer with the photosensitive layer in place to etch into a first portion of the interlayer by a first amount and to further etch into a second portion of the interlayer by a second amount different than the first amount, where the first and second portions of the interlayer respectively overlie the first and second photodetectors. See, for example, FIG. 18 or 20.

At 2116, any remaining portion of the photosensitive layer is removed. See, for example, FIG. 18 or 20.

At 2118, a second multilayer film is formed on the interlayer layer and alternating between the first refractive index and the second refractive from top to bottom. See, for example, FIG. 18 or 20.

While the block diagram 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 22-28, a series of cross-sectional views 2200-2800 of some alternative embodiments of the method of FIGS. 11-16, 17A, and 18 is provided in which a stamp is used in place of a gray mask.

Figure 22:
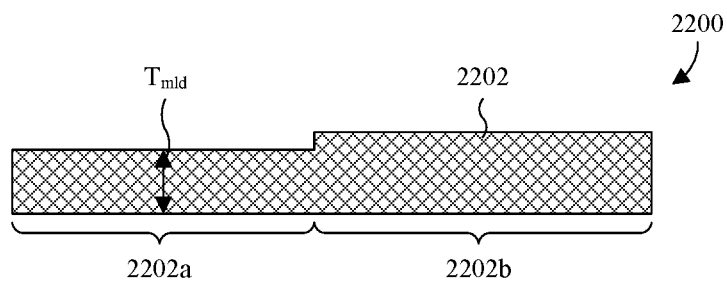
FIGS. 22-31 illustrate a series of cross-sectional views of some alternative embodiments of the method of FIGS. 11-16, 17A, 18, 19A, and 20 in which a stamp is used in place of a gray mask.

As illustrated by the cross-sectional view 2200 of FIG. 22, a mold substrate 2202 is patterned so as to have a thickness $T_{mld}$ that varies discretely across a first mold region 2202a and a second mold region 2202b. As seen hereafter, the first and second mold regions 2202a, 2202b may, for example, correspond to photodetectors. The patterning may, for example, be performed by a photolithography/etching process or some other suitable patterning process. The mold substrate 2202 may, for example, be a bulk silicon substrate and/or some other suitable substrate. Further, the mold substrate 2202 may, for example, be a wafer or some other suitable substrate.

Figure 23:
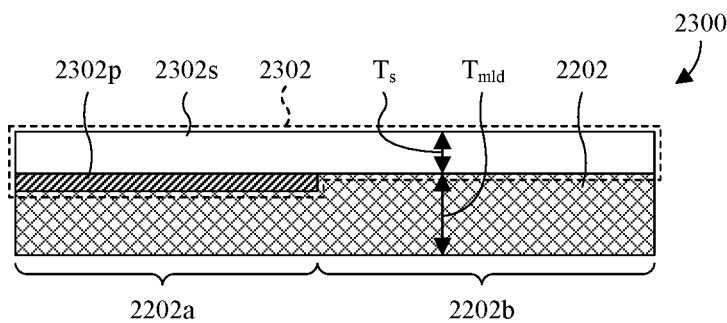

As illustrated by the cross-sectional view 2300 of FIG. 23, a stamp 2302 is formed with the pattern of the mold substrate 2202, such that a thickness $T_s$ of the stamp 2302 varies discretely across the first and second mold regions 2202a, 2202b. The stamp 2302 comprises a carrier substrate 2302s and a protrusion 2302p underlying the carrier substrate 2302s. The protrusion 2302p protrudes downward from the carrier substrate 2302s so a bottom surface of the stamp 2302 conforms to a top surface of the mold substrate 2202. The protrusion 2302p may, for example, be or comprise glue or some other suitable material. The carrier substrate 2302s may, for example, be a wafer or some other suitable substrate.

In some embodiments, a process for forming the stamp 2302 comprises depositing (UV) glue (e.g., glue that is cured by UV light) on the mold substrate 2202, placing the carrier substrate 2302s on the UV glue and the mold substrate 2202, and curing the UV glue with UV radiation through the carrier substrate 2302s. In such embodiments, the protrusion 2302p is or comprise UV glue that has been cured and the carrier substrate 2302s is or comprises glass or some other material that is transparent to UV radiation. Notwithstanding the foregoing process and materials, other processes and/or materials may be used to form the stamp 2302.

Figure 24:
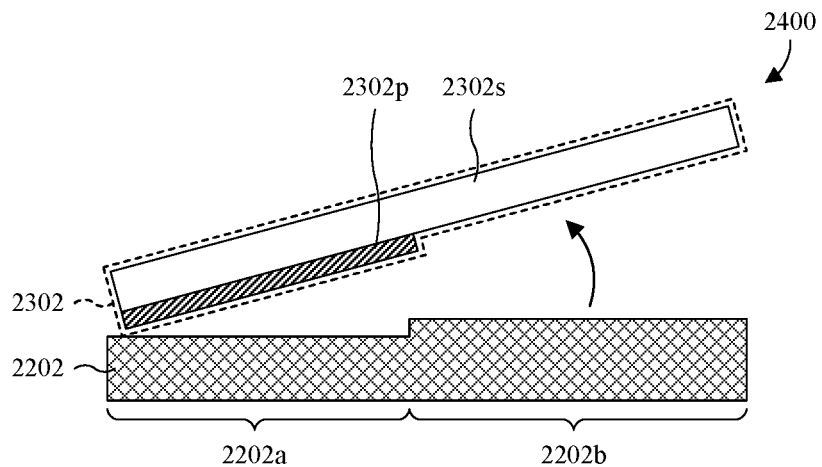

As illustrated by the cross-sectional view 2400 of FIG. 24, the stamp 2302 is removed from the mold substrate 2202.

Figure 25:
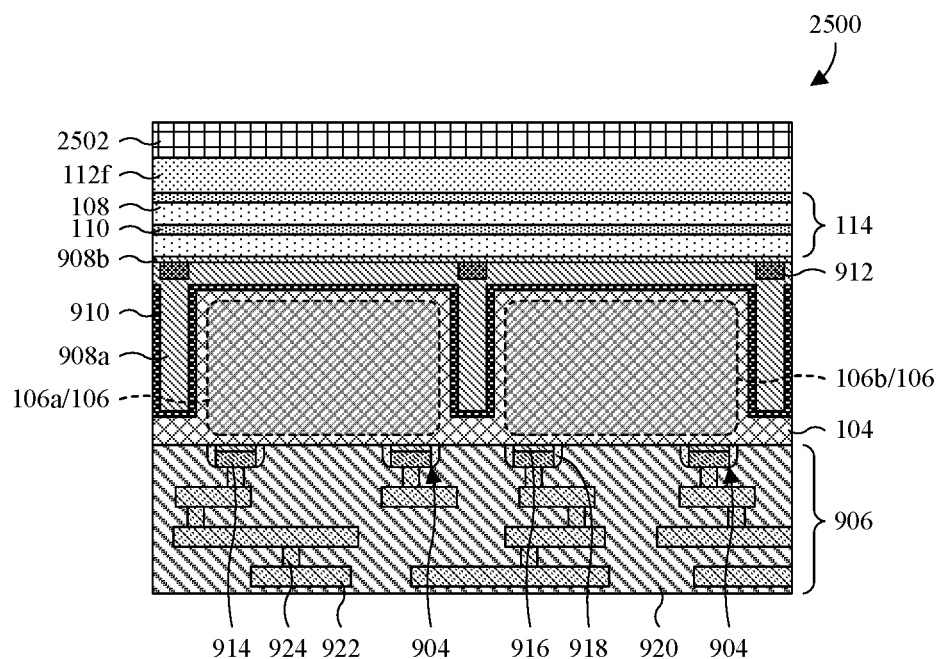

As illustrated by the cross-sectional view 2500 of FIG. 25, a first isolation layer 908a, a second isolation layer 908b, an isolation liner 910, and a metal grid 912 are formed on a backside of a substrate 104. Further, one or more first refractive-index layers 108, one or more second refractive-index layers 110, and a first interlayer 112f are deposited over the second isolation layer 908b. The first and second refractive-index layers 108, 110 have different refractive indexes and are stacked in a periodic pattern to define a lower multilayer film 114.

The structure of FIG. 25 and formation thereof are as described at FIGS. 11-16, except for formation of a mask layer 2502. The mask layer 2502 is deposited on the first interlayer 112f instead of the mask layer 1602 of FIG. 16. The mask layer 2502 is or comprises a flowable and/or pliable material that may be patterned by stamping. In some embodiments, the mask layer 2502 is a photoresist-like material that is more flowable than photoresist. The mask layer 2502 may, for example, be formed by spin coating or some other suitable deposition process.

Figure 26:
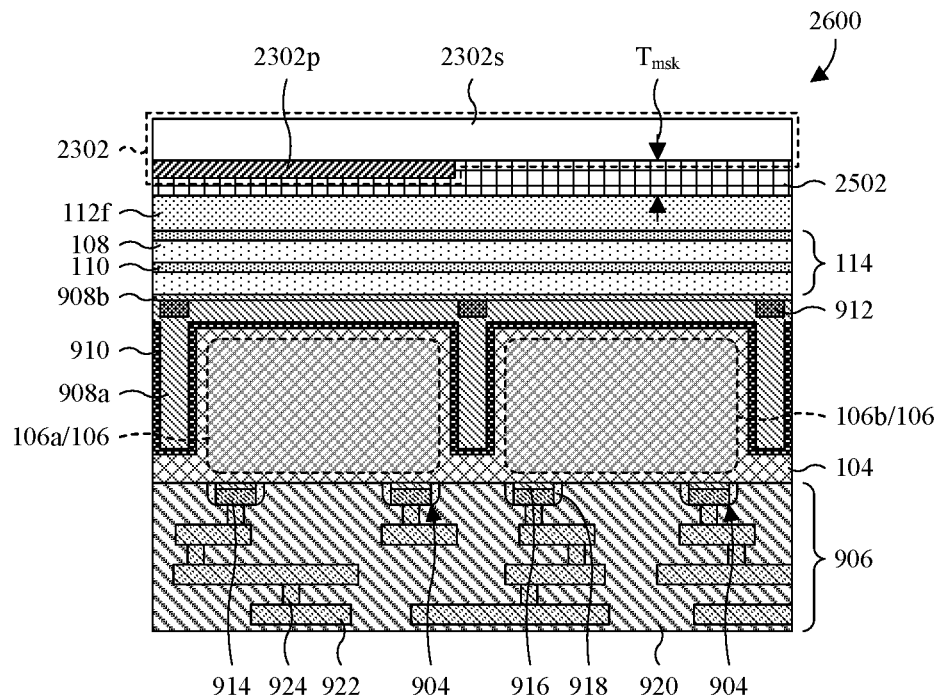

As illustrated by the cross-sectional view 2600 of FIG. 26, the mask layer 2502 is stamped to transfer a pattern from the stamp 2302 to the mask layer 2502. As a result of the pattern transfer, a thickness $T_{msk}$ of the mask layer 2502 varies discretely across the first and second photodetectors 106a, 106b. Additionally, in some embodiments, the mask layer 2502 is cured and/or hardened once the pattern has been transferred to the mask layer 2502. The curing and/or hardening may, for example, be performed by heating the mask layer 2502, exposing the mask layer 2502 to radiation through the stamp 2302, or by some other suitable process. In alternative embodiments, curing and/or hardening is omitted.

Figure 27:
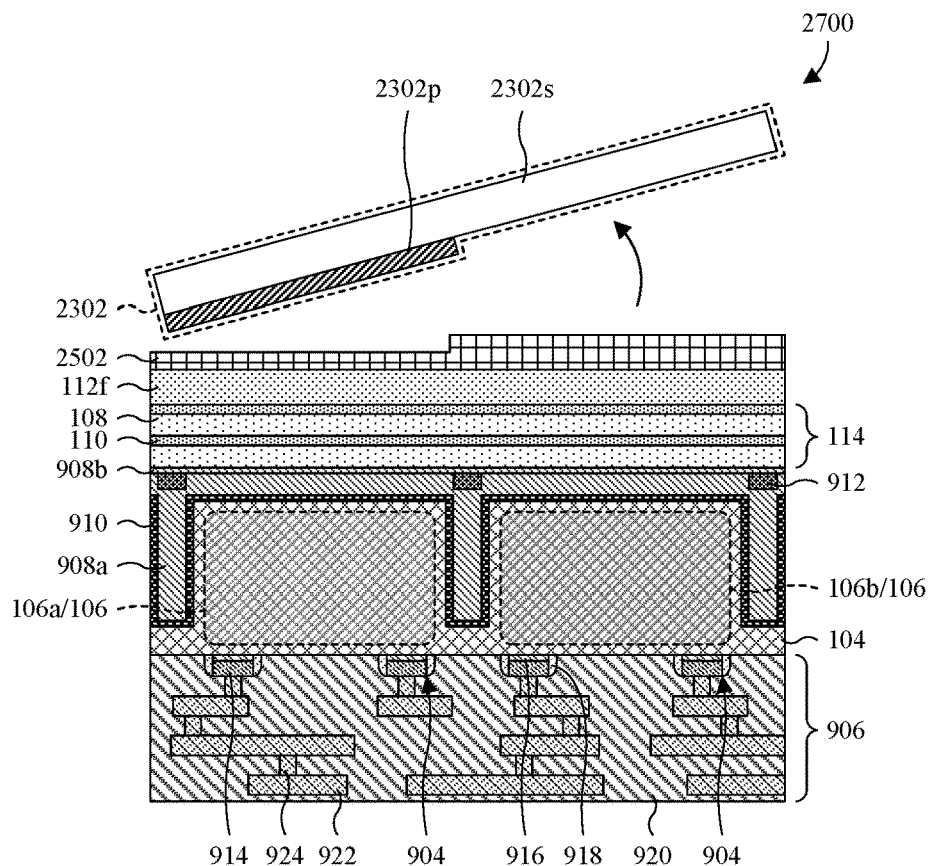

As illustrated by the cross-sectional view 2700 of FIG. 27, the stamp 2302 is removed from the mask layer 2502.

Figure 28:
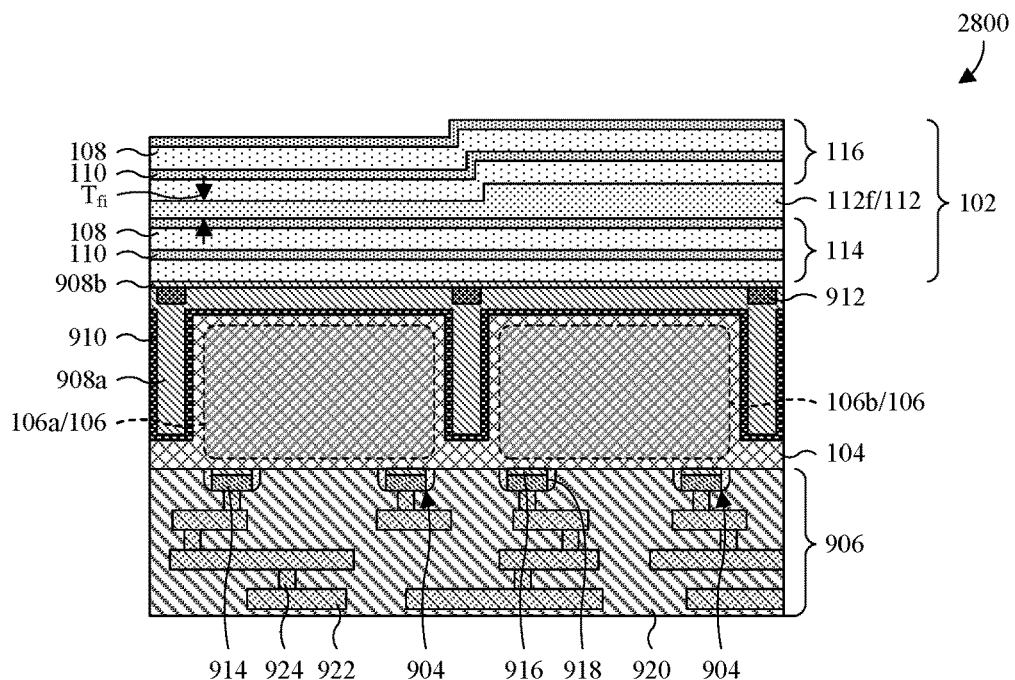

As illustrated by the cross-sectional view 2800 of FIG. 28, an etch is performed into the mask layer 2502 (see, e.g., FIG. 27) and the first interlayer 112f to transfer a pattern of the mask layer 2502 to the first interlayer 112f. To the extent that any of the mask layer 2502 remains after the etch, the remainder of the mask layer 2502 is removed. As a result of the pattern transfer, a thickness $T_{fi}$ of the first interlayer 112f discretely varies across the first and second photodetectors 106a, 106b. Further, the first interlayer 112f defines an interlayer structure 112. The etch may, for example, be performed as described with regard to FIG. 18. Because of the use of the stamp 2302 (see FIG. 26), the thickness $T_{fi}$ of the first interlayer 112f may be varied across the photodetectors 106 without use of costly photolithography process tools.

Also illustrated by the cross-sectional view 2800 of FIG. 28, one or more additional first refractive-index layers 108 and one or more additional second refractive-index layers 110 are deposited over the first interlayer 112f. In total, at least three of the first and second refractive-index layers 108, 110 are deposited. The additional first and second refractive-index layers 108, 110 have different refractive indexes and are stacked in a periodic pattern to define an upper multilayer film 116. The additional first and second refractive-index layers 108, 110 and the upper multilayer film 116 may, for example, be as described with regard to FIG. 1. Collectively, the lower and upper multilayer films 114, 116 and the interlayer structure 112 define a narrow band filter 102.

While FIGS. 22-28 illustrate embodiments of the method using the stamp 2302 of FIG. 26 to discretely vary the thickness $T_{msk}$ of the mask layer 2502 of FIG. 26, alternative embodiments of the method may use the stamp 2302 to continuously vary the thickness $T_{msk}$. For example, the acts at FIG. 22 may be performed by a photolithography/etching process using the gray mask 1704 illustrated and described at FIGS. 19A-19C, such that the thickness $T_{mld}$ of the mold substrate 2202 varies continuously. Then, the pattern transfer at FIG. 23 may, for example, result in the thickness $T_s$ of the stamp 2302 varying continuously and the pattern transfer at FIG. 26 may, for example, result in the thickness $T_{msk}$ varying continuously.

Figure 29:
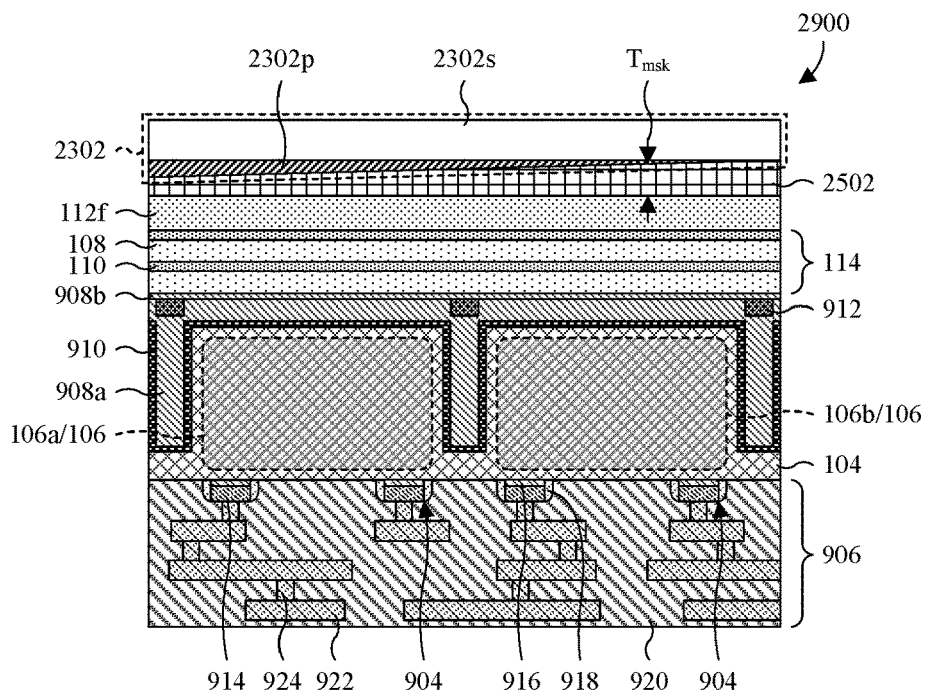
Figure 30:
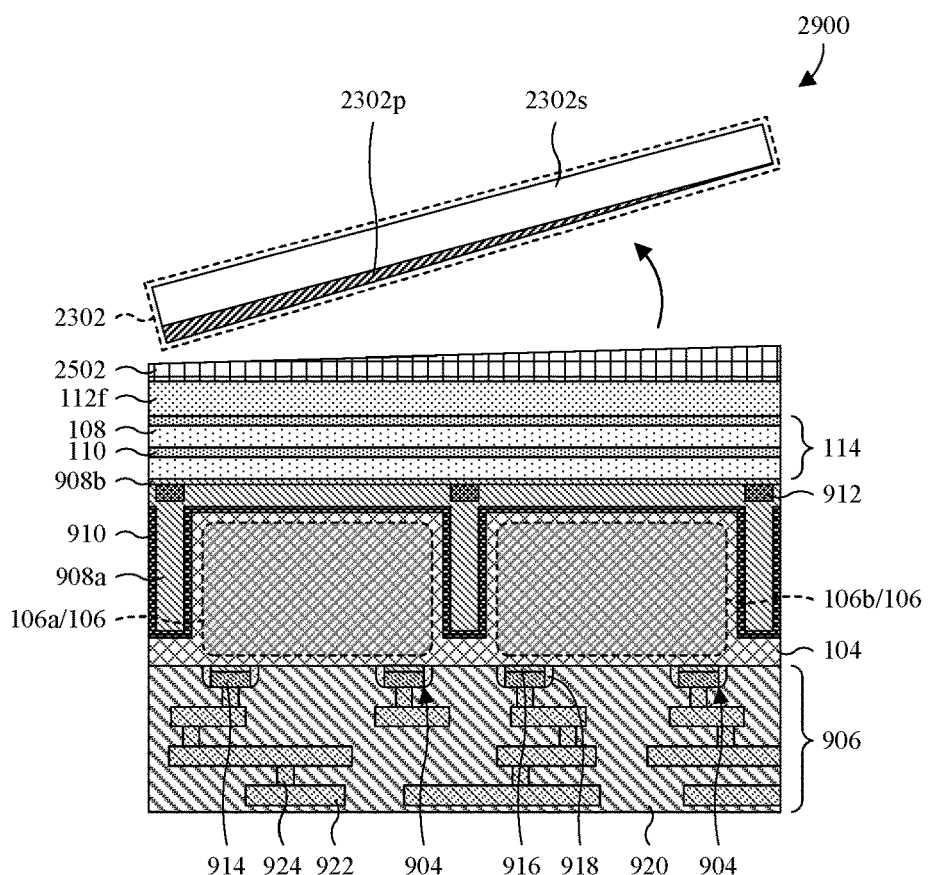
Figure 31:
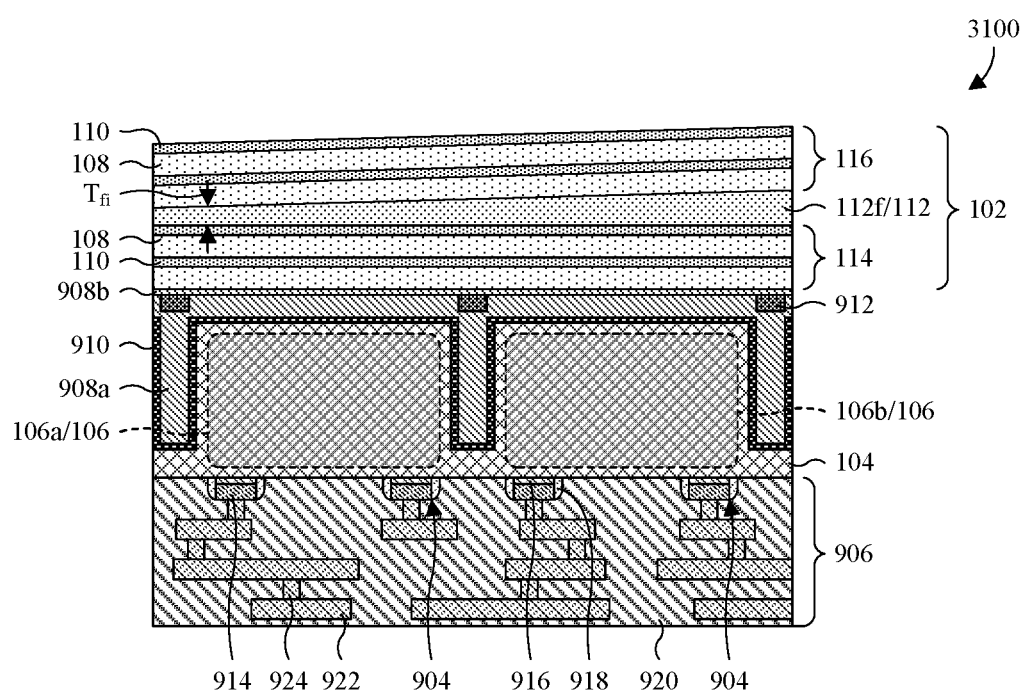

With reference to FIGS. 29-31, cross-sectional views 2900-3100 illustrate some of the alternative embodiments of the method. These alternative embodiments proceed from the acts at FIGS. 22-25 to the acts at FIGS. 29-31, while skipping the acts at FIGS. 26-28. Hence, FIGS. 29-31 are alternatives to FIGS. 26-28 and are respectively as FIGS. 26-28 are described, except for the differences resulting from the thickness $T_{msk}$ of the mask layer 2502 varying continuously.

While FIGS. 22-31 are described with reference to a method, it will be appreciated that the structures shown in FIGS. 22-31 are not limited to the method but rather may stand alone separate of the method. While FIGS. 22-31 are described as a series of acts, it will be appreciated that the order of the acts may be altered in other embodiments. While FIGS. 22-31 illustrate and describe as a specific set of acts, some acts that are illustrated and/or described may be omitted in other embodiments. Further, acts that are not illustrated and/or described may be included in other embodiments.

Figure 32:
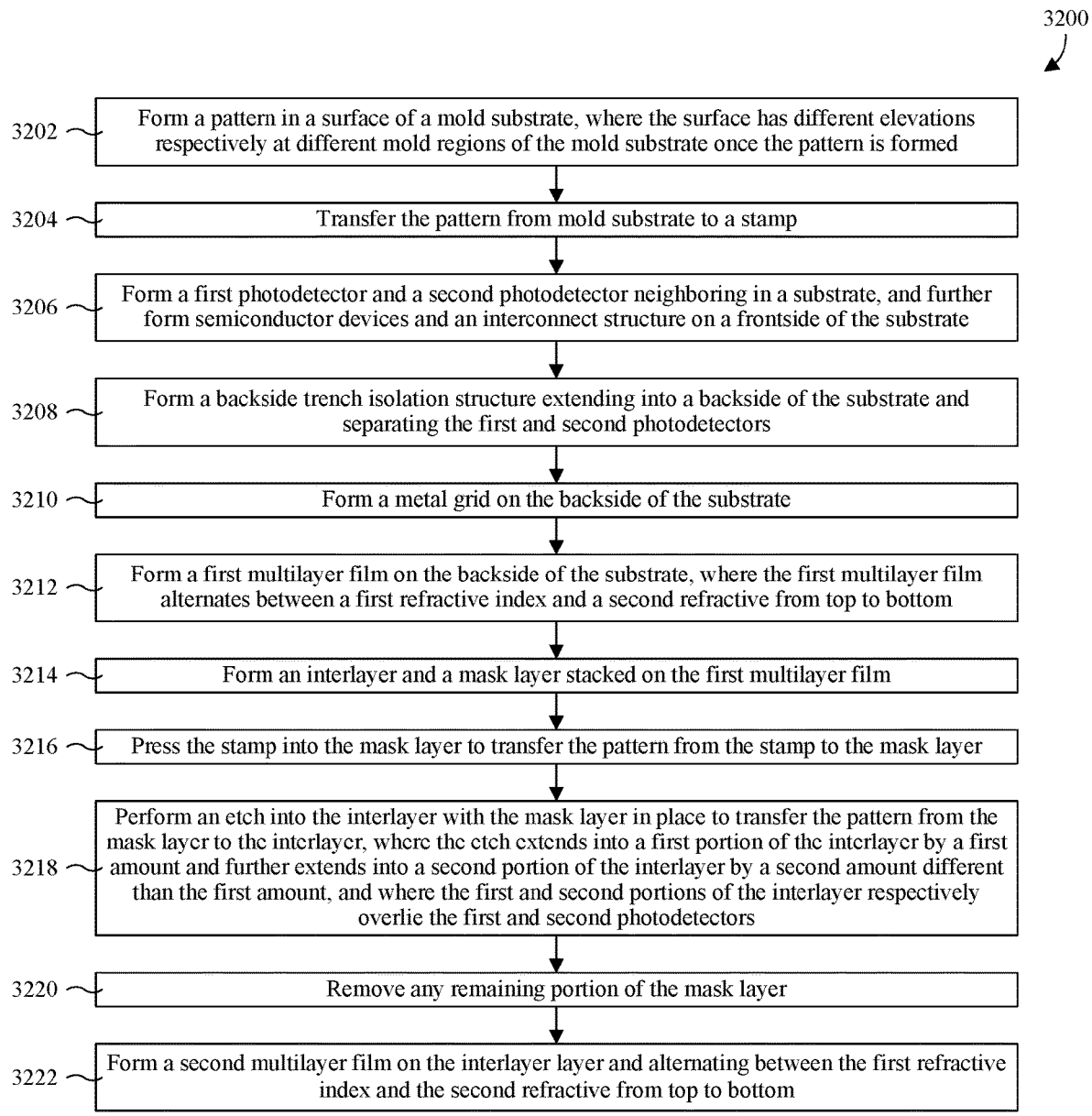
FIG. 32 illustrates a block diagram of some embodiments of the method of FIGS. 22-31.

With reference to FIG. 32, a block diagram 3200 of some embodiments of the method of FIGS. 22-31 is provided.

At 3202, a pattern is formed in a surface of a mold substrate, where the surface has different elevations respectively at different mold regions of the mold substrate once the pattern is formed. See, for example, FIG. 22.

At 3204, the pattern is transferred from mold substrate to a stamp. See, for example, FIGS. 23 and 24.

At 3206, a first photodetector and a second photodetector are formed neighboring in a substrate. Further, semiconductor devices and an interconnect structure are formed on a frontside of the substrate. See, for example, FIG. 25.

At 3208, a backside trench isolation structure is formed extending into a backside of the substrate and separating the first and second photodetectors. See, for example, FIG. 25.

At 3210, a metal grid is formed on the backside of the substrate. See, for example, FIG. 25.

At 3212, a first multilayer film is formed on the backside of the substrate, where the first multilayer film alternates between a first refractive index and a second refractive from top to bottom. See, for example, FIG. 25.

At 3214, an interlayer and a mask layer are formed stacked on the first multilayer film. See, for example, FIG. 25.

At 3216, the stamp is pressed into the mask layer to transfer the pattern from the stamp to the mask layer. See, for example, FIGS. 26 and 27 or FIGS. 29 and 30.

At 3218, an etch is performed into the interlayer with the mask layer in place to transfer the pattern from the mask layer to the interlayer, where the etch extends into a first portion of the interlayer by a first amount and further extends into a second portion of the interlayer by a second amount different than the first amount, and where the first and second portions of the interlayer respectively overlie the first and second photodetectors. See, for example, FIG. 28 or 31.

At 3220, any remaining portion of the mask layer is removed. See, for example, FIG. 28 or 31.

At 3222, a second multilayer film is formed on the interlayer layer and alternating between the first refractive index and the second refractive from top to bottom. See, for example, FIG. 28 or 31.

While the block diagram 3200 of FIG. 32 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 33-36, a series of cross-sectional views 3300-3600 of some embodiments of a method to form an image sensor comprising a narrow band filter in which a ratio between interlayers varies and the interlayers and the narrow band filter have uniform thicknesses. An example of such a narrow band filter is illustrated and described with regard to FIG. 4A.

Figure 33:
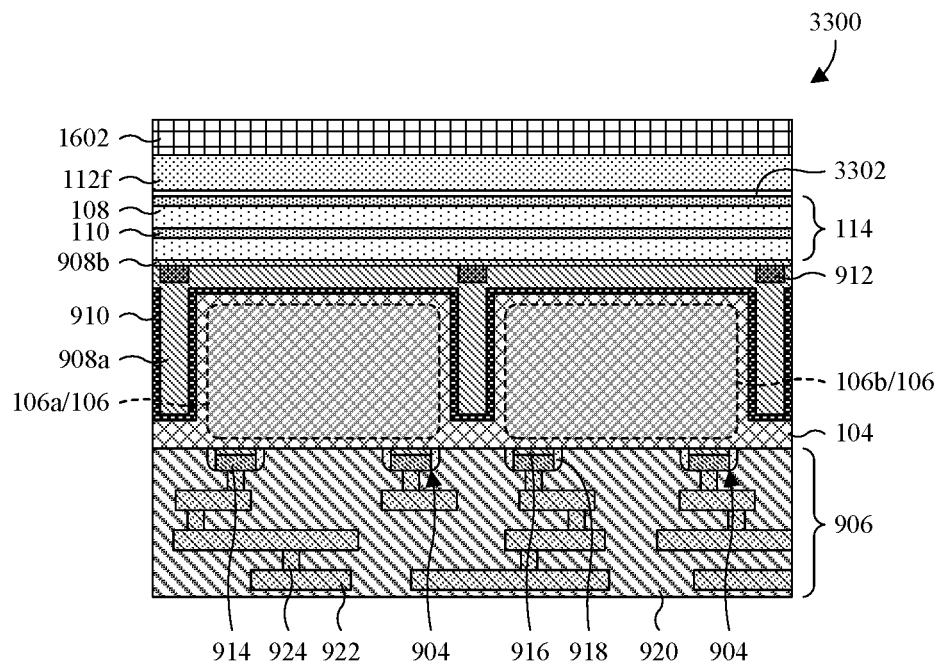
FIGS. 33-39 illustrate a series of cross-sectional views of some embodiments of a method to form an image sensor comprising a narrow band filter in which a ratio between interlayers varies and the interlayers and the narrow band filter have uniform thicknesses.

As illustrated by the cross-sectional view 3300 of FIG. 33, a first isolation layer 908a, a second isolation layer 908b, an isolation liner 910, and a metal grid 912 are formed on a backside of a substrate 104. Further, one or more first refractive-index layers 108, one or more second refractive-index layers 110, a first interlayer 112f, and a mask layer 1602 are deposited over the second isolation layer 908b. The first and second refractive-index layers 108, 110 have different refractive indexes and are stacked in a periodic pattern to define a lower multilayer film 114.

The structure of FIG. 33 and formation thereof are as described at FIGS. 11-16, except for formation of an etch stop layer 3302. The etch stop layer 3302 is deposited between the depositing of the first and second refractive-index layers 108, 110 and the depositing of the first interlayer 112f. The etch stop layer 3302 is a different material than the first interlayer 112f and an adjoining one of the first and second refractive-index layers 108, 110. The etch stop layer 3302 is dielectric and may, for example, be silicon nitride, silicon carbide, some other suitable dielectric(s), or any combination of the foregoing. In alternative embodiments, the etch stop layer 3302 is omitted (i.e., not formed).

As illustrated by the cross-sectional view 3400 of FIG. 34, the mask layer 1602 is exposed to radiation 3402 through a photomask 3404, and is subsequently exposed to a developer, to form a pattern of first openings 3406 in the mask layer 1602. The photomask 3404 has one or more opaque regions 3404o and one or more transparent regions 3404t defining the pattern in the photomask 3404. The first openings 3406 repeat periodically across the photodetectors 106 with a period Pe. Further, the period Pe and/or individual volumes of the first openings 3406 is/are varied across the photodetectors 106. As such, a first subset of the first openings 3406 overlying the first photodetector 106a has a first total volume and a second subset of the first openings 3406 overlying the second photodetector 106b has a second, different total volume. The individual volumes of the first openings 3406 may, for example, be varied by individual widths W of the first openings 3406, individual shapes of the first openings 3406, other suitable parameters of the first openings 3406, or any combination of the foregoing. The period Pe and the widths W are less than a high transmission band for a narrow band filter being formed.

Figure 34:
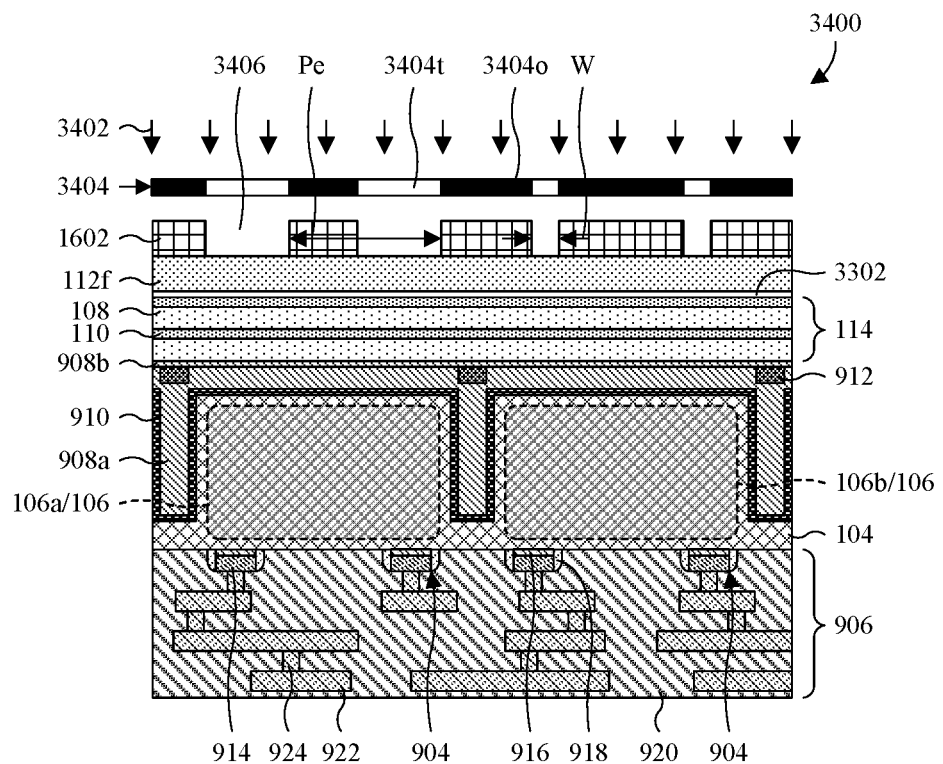
Figure 35:
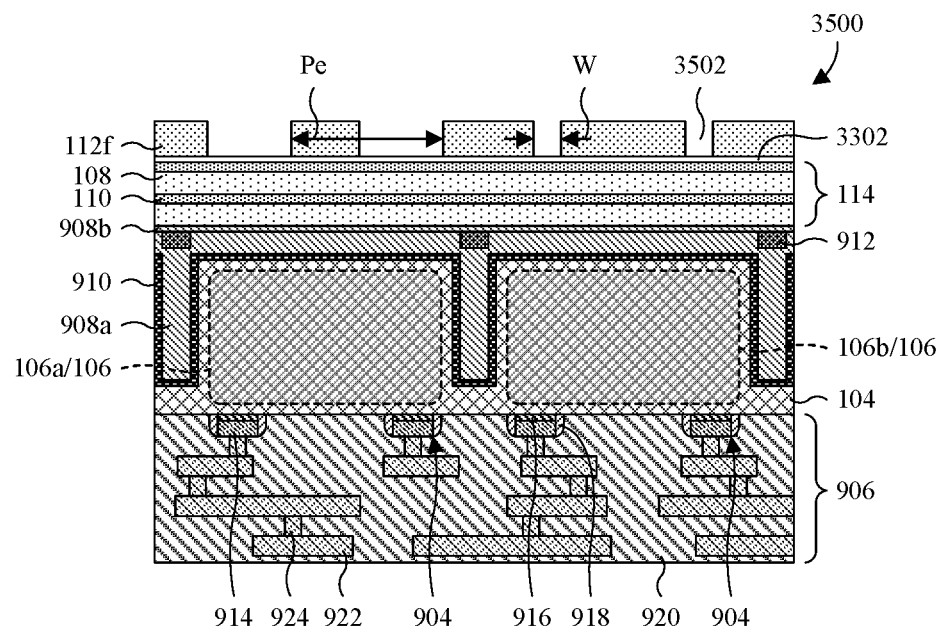

As illustrated by the cross-sectional view 3500 of FIG. 35, an etch is performed into the first interlayer 112f with the mask layer 1602 in place to transfer the pattern from the mask layer 1602 to the first interlayer 112f. As such, the first interlayer 112f has a pattern of second openings 3502 corresponding to the first openings 3406 (see, e.g., FIG. 34). A first subset of the second openings 3502 overlying the first photodetector 106a has a first total volume and a second subset of the second openings 3502 overlying the second photodetector 106b has a second, different total volume. The etch stops on the etch stop layer 3302.

Also illustrated by the cross-sectional view 3500 of FIG. 35, the mask layer 1602 is removed from the first interlayer 112f.

Figure 36:
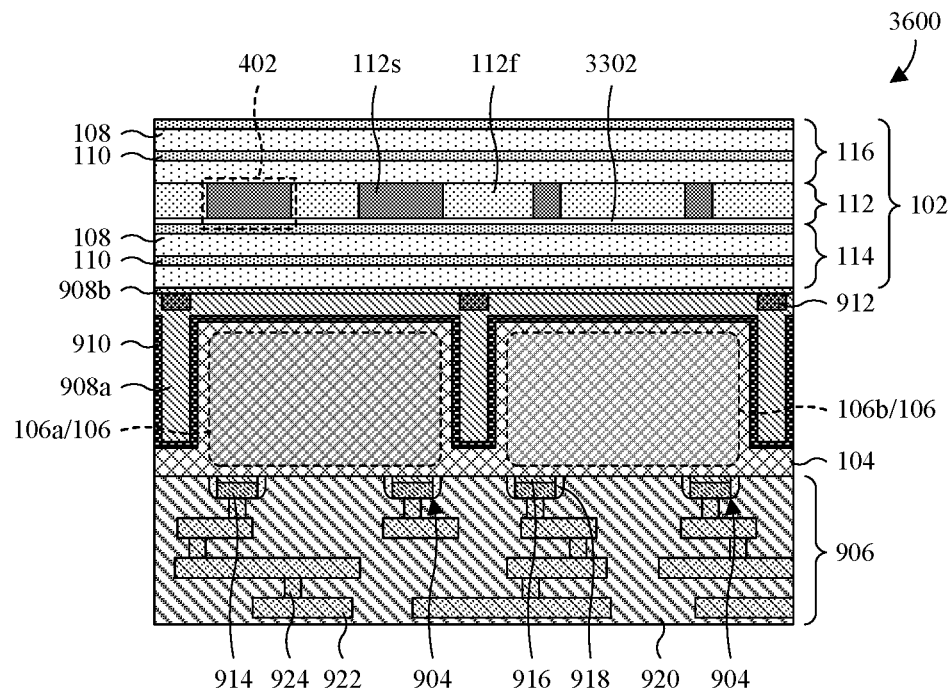

As illustrated by the cross-sectional view 3600 of FIG. 36, a second interlayer 112s is formed in the second openings 3502 (see, e.g., FIG. 35). The second interlayer 112s has a different refractive index than the first interlayer 112f and defines a plurality of columnar structures 402 in the first interlayer 112f. Collectively, the first and second interlayers 112f, 112s define an interlayer structure 112. In some embodiments, a process for forming the second interlayer 112s comprises: 1) depositing the second interlayer 112s in the second openings 3502 and covering the first interlayer 112f; and 2) subsequently performing a planarization into the second interlayer 112s until a top surface of the second interlayer 112s is about even with a top surface of the first interlayer. Other processes are, however, amenable.

In some embodiments, the refractive index of the second interlayer 112s is different than the refractive index of the first refractive-index layer(s) 108 and/or the refractive index of the second refractive-index layer(s) 110. In some embodiments, the refractive index of the second interlayer 112s is about 1.0-4.5, about 1.0-2.75, about 2.75-4.5, or some other suitable value. In some embodiments, the refractive index of the second interlayer 112s is about 1.5-4.5 and the refractive index of the first interlayer 112f is about 1.0-2.5 or vice versa. Other refractive index values are, however, amenable.

In some embodiments, the second interlayer 112s is or comprises a different material than the first refractive-index layer(s) 108 and/or the second refractive-index layer(s) 110. In some embodiments, the second interlayer 112s is or comprises a different material than the first interlayer 112f and/or is or comprises a dielectric. In some embodiments, the second interlayer 112s is transparent and/or has a low absorption for wavelengths to be transmitted by the narrow band filter 102. Low absorption may, for example, be absorption less than about 30%, 20%, 10%, or some other suitable value. In some embodiments, the second interlayer 112s is or comprises silicon oxide, titanium oxide, or some other suitable material. In some embodiments, the second interlayer 112s is or comprises titanium oxide, and the first interlayer 112f is or comprise silicon oxide, or vice versa.

Also illustrated by the cross-sectional view 3600 of FIG. 36, one or more additional first refractive-index layers 108 and one or more additional second refractive-index layers 110 are deposited over the first and second interlayers 112f, 112s. In total, at least three layers are deposited. The additional first and second refractive-index layers 108, 110 have different refractive indexes and are stacked in a periodic pattern to define an upper multilayer film 116. The additional first and second refractive-index layers 108, 110 and the upper multilayer film 116 may, for example, be as described with regard to FIG. 1. Collectively, the lower and upper multilayer films 114, 116 and the interlayer structure 112 define a narrow band filter 102.

During use of the image sensor, increasing the ratio of the second interlayer 112s to the first interlayer 112f shifts the high transmission band up or down depending upon which of the first and second interlayers 112f, 112s has a higher refractive index. In embodiments in which the first interlayer 112f has a higher refractive index, increasing the ratio shifts the high transmission band to lower wavelengths. In embodiments in which the second interlayer 112s has a higher refractive index, increasing the ratio shifts the high transmission band to higher wavelengths.

Because the ratio of the second interlayer 112s to the first interlayer 112f is higher over the first photodetector 106a, the high transmission band is higher overlying the first photodetector 106a than the second photodetector 106b when the second interlayer 112s has a higher refractive index than the first interlayer 112f. Further, the high transmission band is lower overlying the first photodetector 106a than the second photodetector 106b when the second interlayer 112s has a lower refractive index than the first interlayer 112f.

While FIGS. 33-36 illustrate embodiments of the method in which the second interlayer 112s is localized to the first interlayer 112f, the second interlayer 112s may extend through an entire thickness of the narrow band filter in alternative embodiments of the method. An example of such a narrow band filter is illustrated and described with regard to FIG. 4B.

Figure 37:
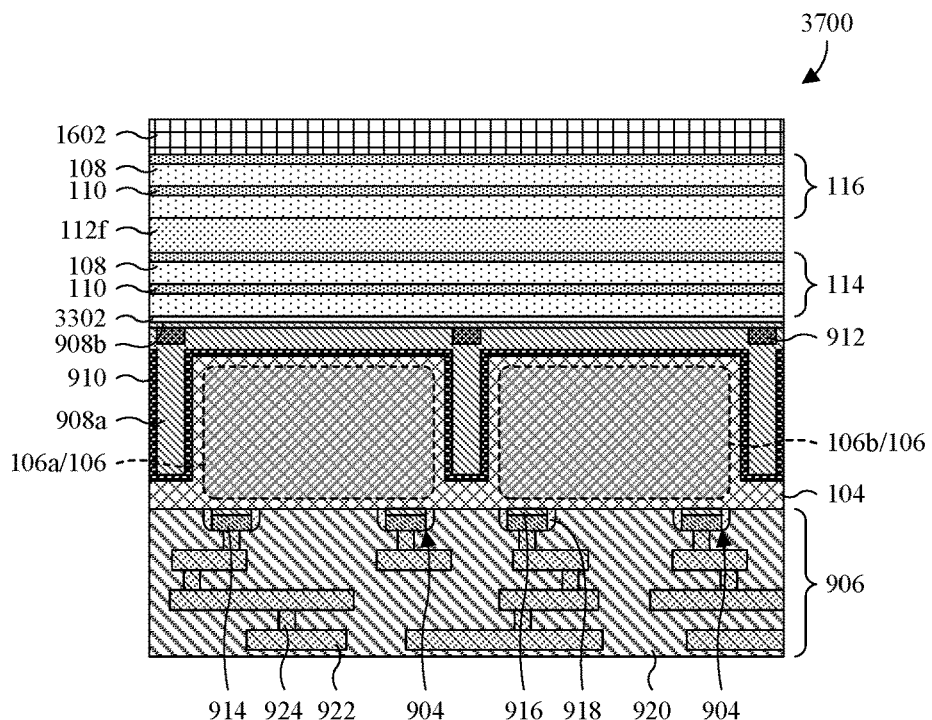
Figure 38:
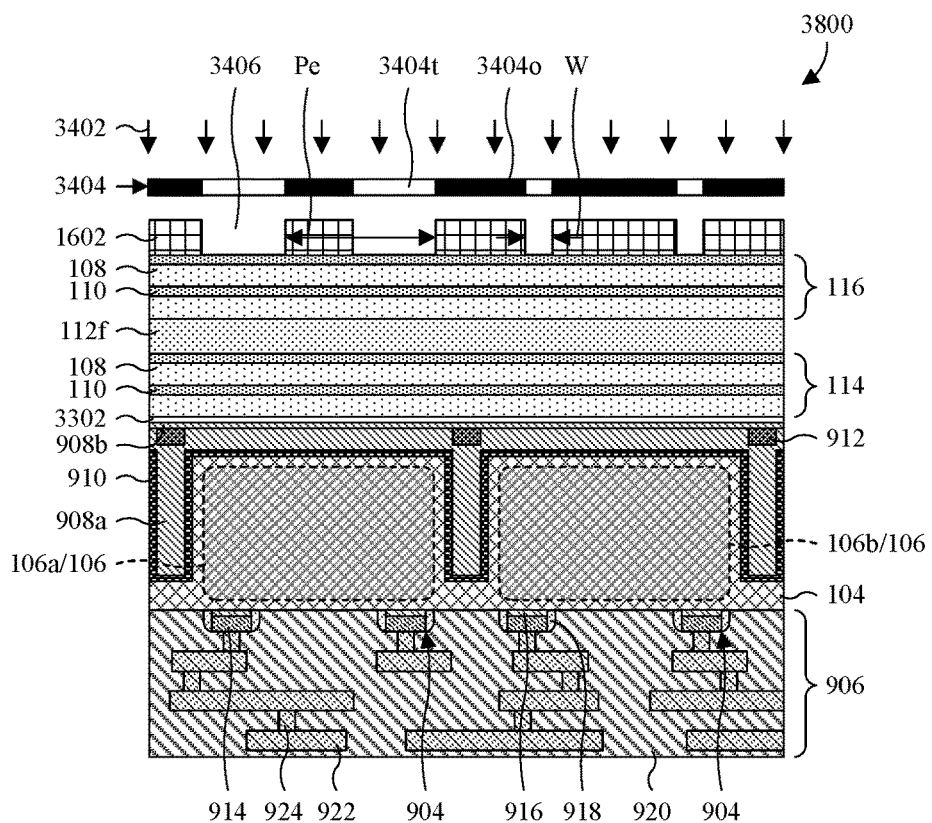
Figure 39:
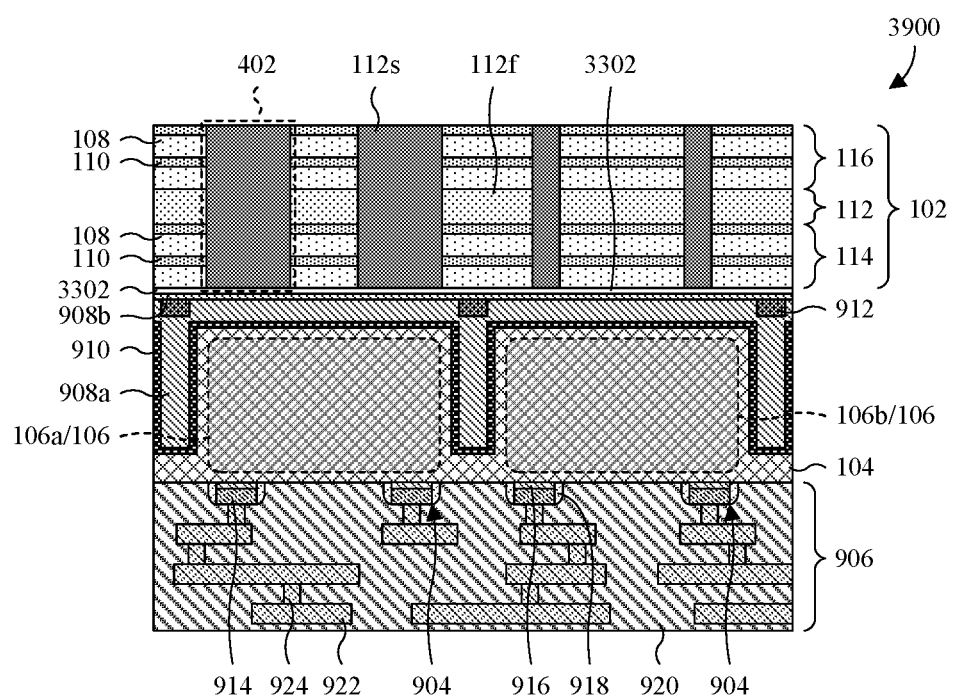

With reference to FIGS. 37-39, cross-sectional views 3700-3900 illustrate some of the alternative embodiments of the method. These alternative embodiments proceed from the acts at FIG. 33, less the depositing of the mask layer 1602. Further, while performing the acts at FIG. 33, the etch stop layer 3302 is instead deposited between the depositing of the second isolation layer 908b and the forming of the lower multilayer film 114. After the acts at FIG. 33, the method proceeds to the acts at FIGS. 37-39 while skipping the acts at FIGS. 34-36. As illustrated by the cross-sectional view 3700 of FIG. 37, the upper multilayer film 116 is formed as described at FIG. 36 and the mask layer 1602 is subsequently deposited as described at FIG. 33. As illustrated by the cross-sectional view 3800 of FIG. 38, the mask layer 1602 is patterned as described at FIG. 34. As illustrated by the cross-sectional view 3900 of FIG. 39, an etch is performed with the mask layer 1602 in place to form a pattern of second openings 3502 as described at FIG. 35. Further, the mask layer 1602 is removed as described at FIG. 35 and the second openings 3502 are filled with the second interlayer 112s as described at FIG. 36.

While FIGS. 33-39 are described with reference to a method, it will be appreciated that the structures shown in FIGS. 33-39 are not limited to the method but rather may stand alone separate of the method. While FIGS. 33-39 are described as a series of acts, it will be appreciated that the order of the acts may be altered in other embodiments. While FIGS. 33-39 illustrate and describe as a specific set of acts, some acts that are illustrated and/or described may be omitted in other embodiments. Further, acts that are not illustrated and/or described may be included in other embodiments.

Figure 40:
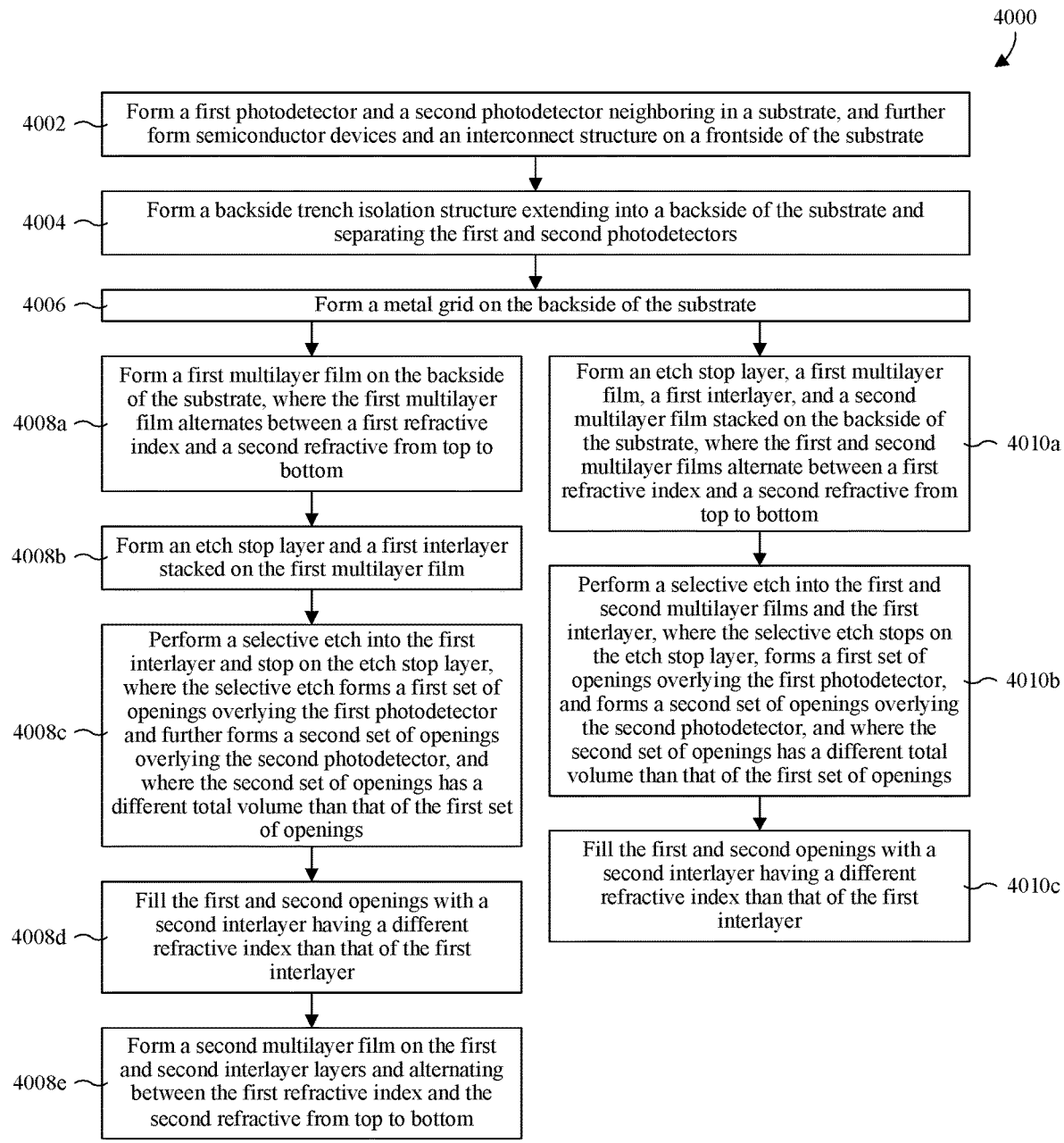
FIG. 40 illustrates a block diagram of some embodiments of the method of FIGS. 33-39.

With reference to FIG. 40, a block diagram 4000 of some embodiments of the method of FIGS. 33-39 is provided.

At 4002, a first photodetector and a second photodetector are formed neighboring in a substrate. Further, semiconductor devices and an interconnect structure are formed on a frontside of the substrate. See, for example, FIG. 33 or 37.

At 4004, a backside trench isolation structure is formed extending into a backside of the substrate and separating the first and second photodetectors. See, for example, FIG. 33 or 37.

At 4006, a metal grid is formed on the backside of the substrate. See, for example, FIG. 33 or 37.

In first embodiments of the method, the acts at 4008a-4008e are next performed. At 4008a, a first multilayer film is formed on the backside of the substrate, where the first multilayer film alternates between a first refractive index and a second refractive from top to bottom. See, for example, FIG. 33. At 4008b, an etch stop layer and a first interlayer are formed stacked on the first multilayer film. See, for example, FIG. 33. At 4008c, a selective etch is performed into the first interlayer and stops on the etch stop layer, where the selective etch forms a first set of openings overlying the first photodetector and further forms a second set of openings overlying the second photodetector, and where the second set of openings has a different total volume than that of the first set of openings. See, for example, FIGS. 34 and 35. At 4008d, the first and second openings are filled with a second interlayer having a different refractive index than that of the first interlayer. See, for example, FIG. 36. At 4008e, a second multilayer film is formed on the first and second interlayer layers and alternating between the first refractive index and the second refractive from top to bottom. See, for example, FIG. 36.

In second embodiments of the method, the acts at 4010a-4010c are performed instead of the acts at 4008a-4008e. At 4010a, an etch stop layer, a first multilayer film, a first interlayer, and a second multilayer film stacked are formed on the backside of the substrate, where the first and second multilayer films alternate between a first refractive index and a second refractive from top to bottom. See, for example, FIG. 37. At 4010b, a selective etch is performed into the first and second multilayer films and the first interlayer, where the selective etch stops on the etch stop layer, forms a first set of openings overlying the first photodetector, and forms a second set of openings overlying the second photodetector, and where the second set of openings has a different total volume than that of the first set of openings. See, for example, FIGS. 38 and 39. At 4010c, the first and second openings are filled with a second interlayer having a different refractive index than that of the first interlayer. See, for example, FIG. 39.

While the block diagram 4000 of FIG. 40 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 41-45, a series of cross-sectional views 4100-4500 of some alternative embodiments of the method of FIGS. 33-36 in which a stamp is used.

Figure 41:
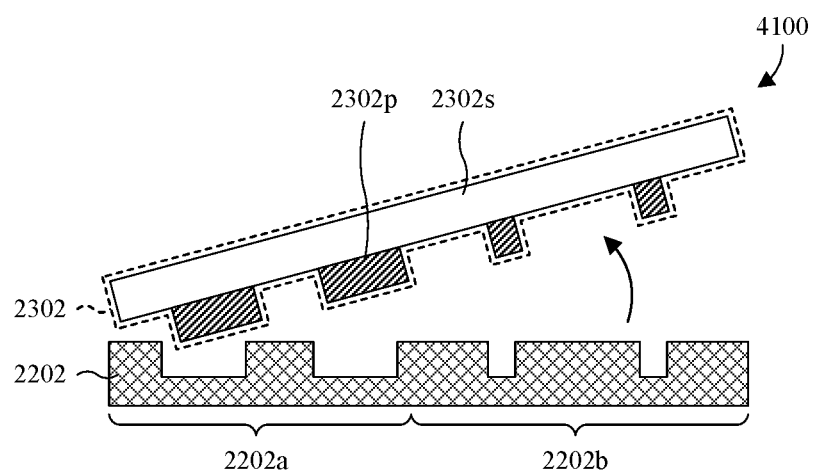
FIGS. 41-48 illustrate a series of cross-sectional views of some alternative embodiments of the method of FIGS. 33-39 in which a stamp is used.

As illustrated by the cross-sectional view 4100 of FIG. 41, a mold substrate 2202 is patterned with the pattern of the mask layer 1602 at FIG. 34. The patterning may, for example, be performed by a photolithography/etching process or some other suitable patterning process. The photolithography/etching process may, for example, use the photomask 3404 at FIG. 34 during photolithography. Further, a stamp 2302 is formed on the mold substrate 2202 with the pattern of the mold substrate 2202 and is subsequently removed from the mold substrate 2202. The stamp 2302 comprises a carrier substrate 2302s and a plurality of protrusions 2302p underlying the carrier substrate 2302s. The stamp 2302 and formation thereof may, for example, be as described at FIGS. 22-24.

Figure 42:
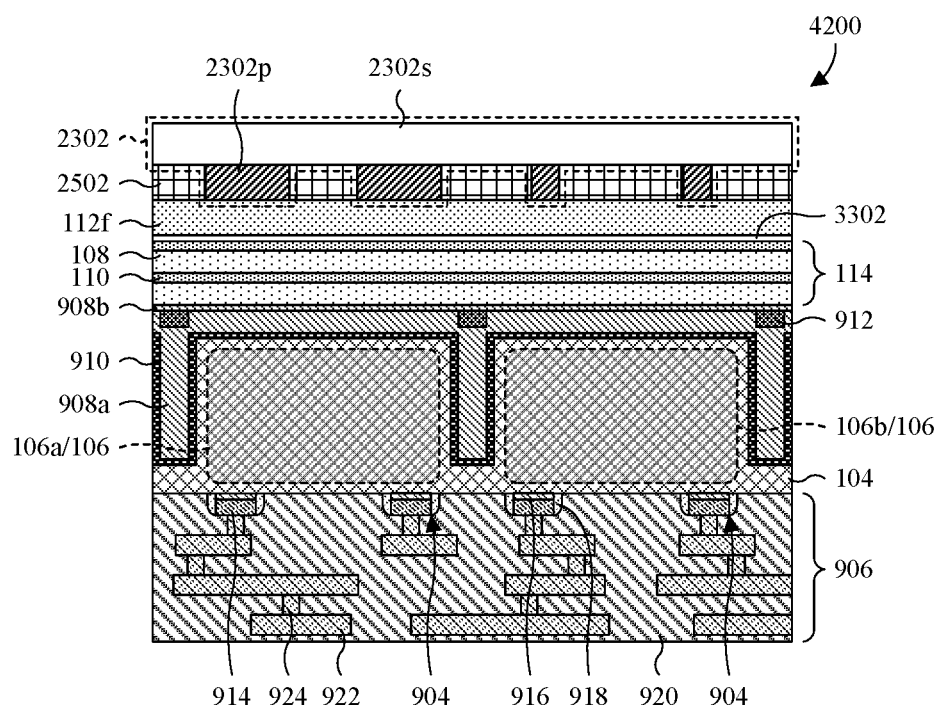

As illustrated by the cross-sectional view 4200 of FIG. 42, a first isolation layer 908a, a second isolation layer 908b, an isolation liner 910, and a metal grid 912 are formed on a backside of a substrate 104. Further, one or more first refractive-index layers 108, one or more second refractive-index layers 110, and a first interlayer 112f are deposited over the second isolation layer 908b. The first and second refractive-index layers 108, 110 have different refractive indexes and are stacked in a periodic pattern to define a lower multilayer film 114.

The structure of FIG. 42 and formation thereof are as described at FIGS. 11-16, except for formation of an etch stop layer 3302 and a mask layer 2502. The etch stop layer 3302 is deposited between the depositing of the first and second refractive-index layers 108, 110 and the depositing of the first interlayer 112f. In alternative embodiments, the etch stop layer 3302 is omitted. The mask layer 2502 is deposited on the first interlayer 112f instead of the mask layer 1602 of FIG. 16. The mask layer 2502 and the etch stop layer 3302 are respectively described at FIGS. 25 and 33.

Also illustrated by the cross-sectional view 4200 of FIG. 42, the mask layer 2502 is stamped to transfer a pattern from the stamp 2302 to the mask layer 2502. Additionally, in some embodiments, the mask layer 2502 is cured and/or hardened once the pattern has been transferred. The curing and/or hardening may, for example, be performed by heating the mask layer 2502, exposing the mask layer 2502 to radiation through the stamp 2302, or by some other suitable process. The resulting structure may, for example, be as described at FIG. 34.

Figure 43:
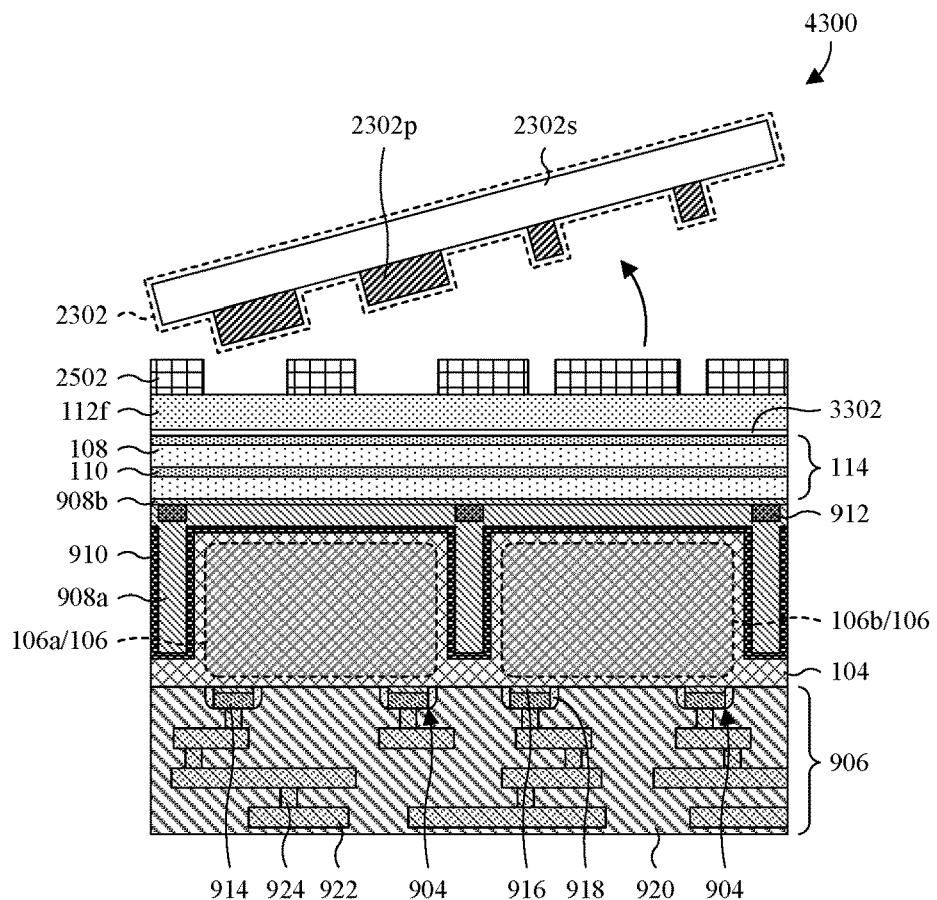

As illustrated by the cross-sectional view 4300 of FIG. 43, the stamp 2302 is removed from the mask layer 2502.

Figure 44:
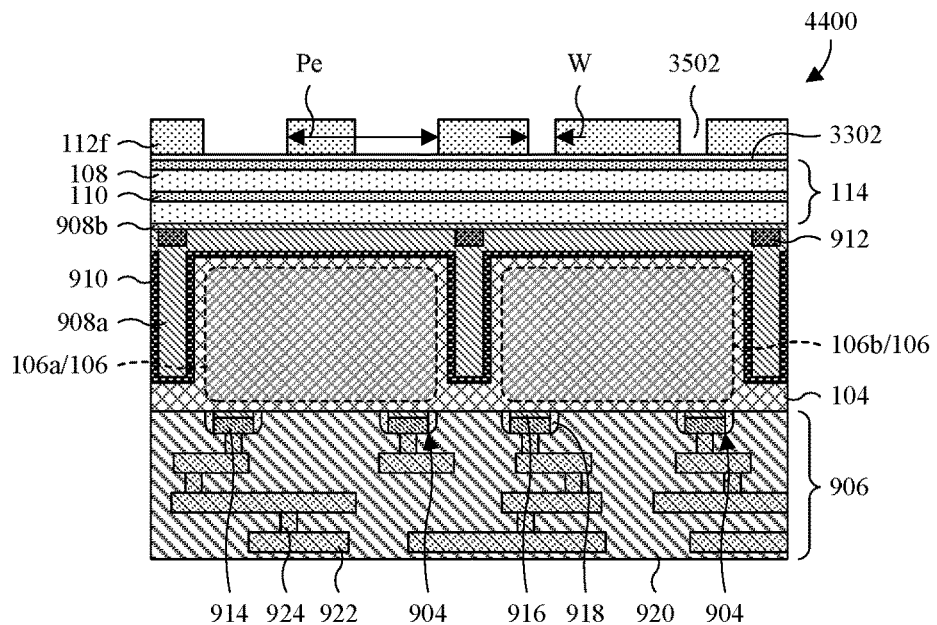

As illustrated by the cross-sectional view 4400 of FIG. 44, an etch is performed into the first interlayer 112f with the mask layer 2502 in place to transfer the pattern from the mask layer 2502 to the first interlayer 112f. Further, the mask layer 1602 is removed from the first interlayer 112f. The etch and resulting structure may, for example, be as described at FIG. 35.

Figure 45:
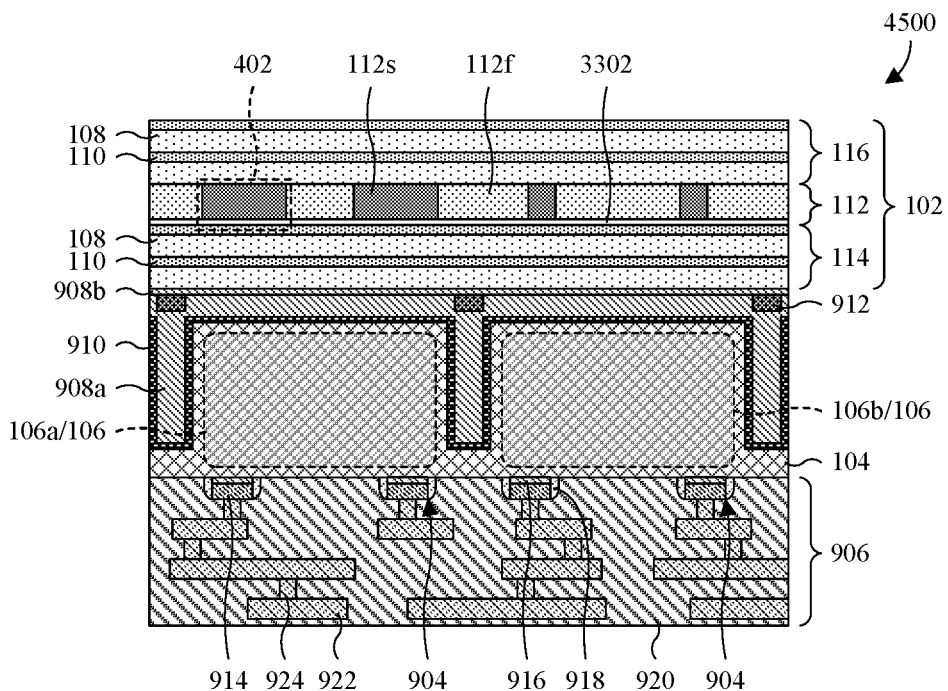

As illustrated by the cross-sectional view 4500 of FIG. 45, a second interlayer 112s is formed surrounded by the first interlayer 112f. Further, an upper multilayer film 116 is formed on the first and second interlayers 112f, 112s. The forming of the second interlayer 112s and the forming of the upper multilayer film 116 may, for example, be as described at FIG. 36 and the resulting structure may, for example, be as described at FIG. 36.

While FIGS. 41-45 illustrate embodiments of the method in which the second interlayer 112s is localized to the first interlayer 112f, the second interlayer 112s may extend through an entire thickness of the narrow band filter in alternative embodiments of the method. An example of such a narrow band filter is illustrated and described with regard to FIG. 4B.

Figure 46:
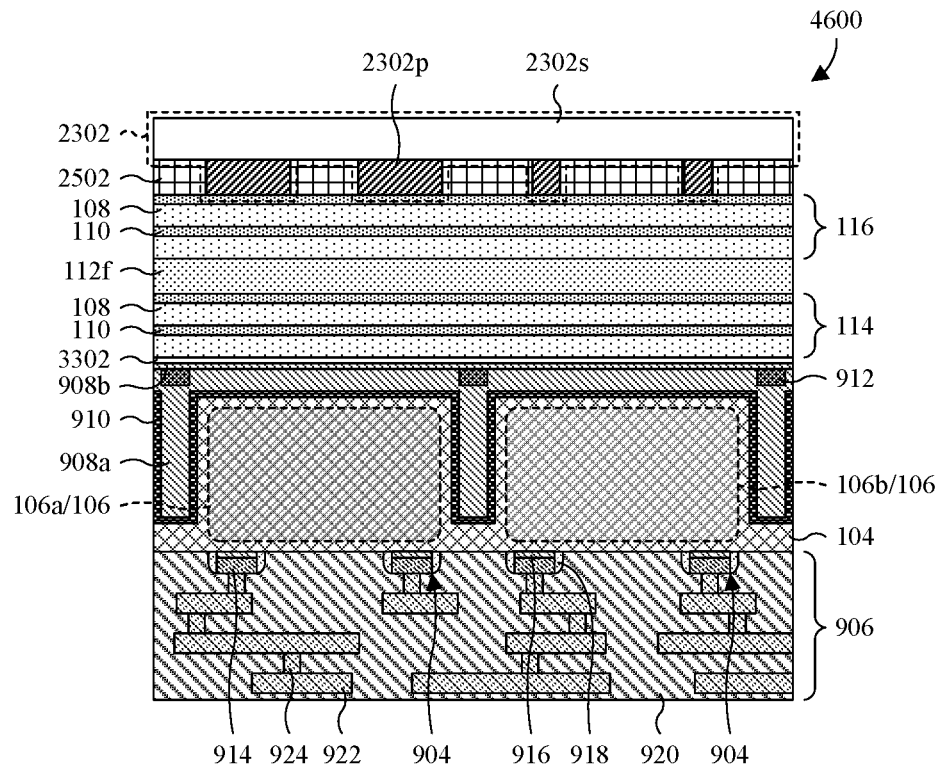
Figure 47:
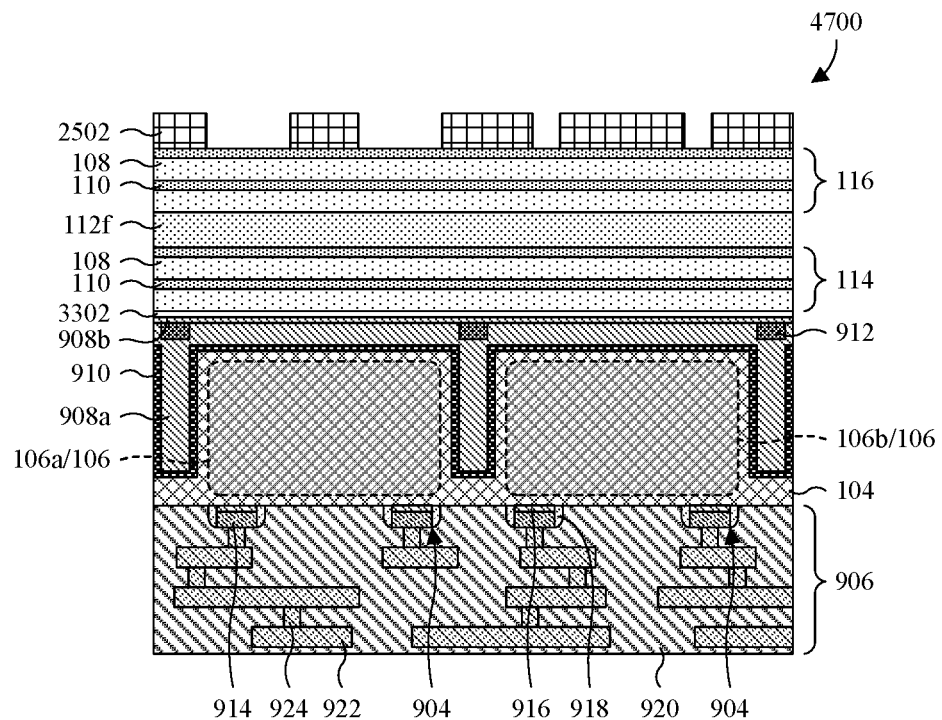
Figure 48:
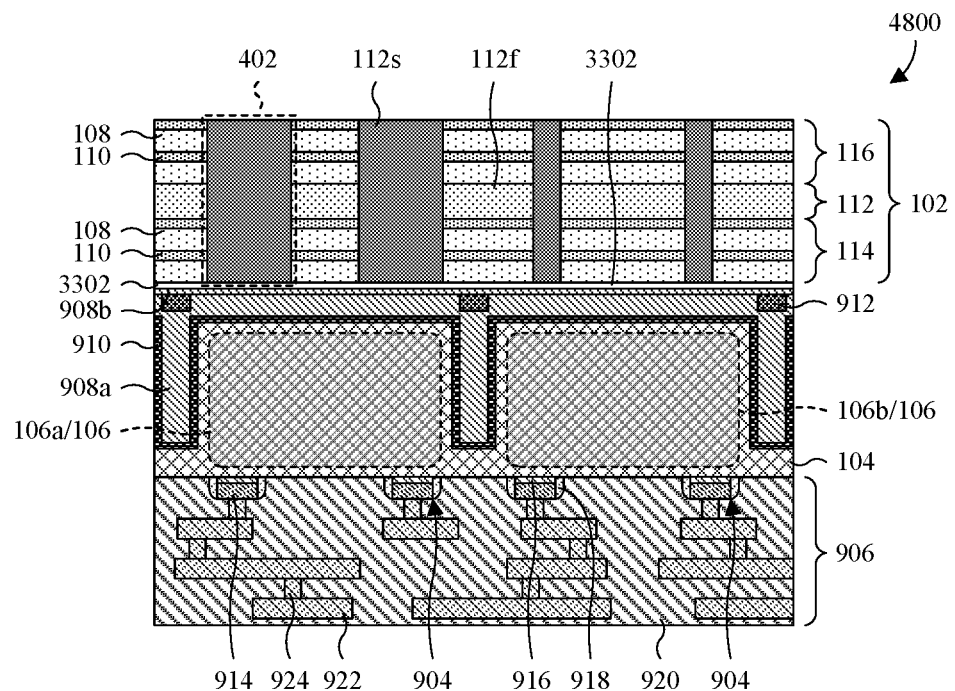

With reference to FIGS. 46-48, cross-sectional views 4600-4800 illustrate some of the alternative embodiments of the method. These alternative embodiments proceed from the acts at FIGS. 41 and 42, less the depositing of the mask layer 2502 and the stamping. Further, while performing the acts at FIG. 42, the etch stop layer 3302 is instead deposited between the depositing of the second isolation layer 908b and the forming of the lower multilayer film 114. After the acts at FIGS. 41 and 42, the method proceeds to the acts at FIGS. 46-48 while skipping the acts at FIGS. 43-45. As illustrated by the cross-sectional view 4600 of FIG. 46, the upper multilayer film 116 is formed as described at FIG. 45 and the mask layer 2502 is subsequently deposited as described at FIG. 42. Further, the mask layer 2502 is patterned with the stamp 2302 as described at FIG. 42. As illustrated by the cross-sectional view 4700 of FIG. 47, the stamp 2302 is removed from the mask layer 2502. As illustrated by the cross-sectional view 4800 of FIG. 48, an etch is performed with the mask layer 2502 in place as described at FIG. 44. Further, the mask layer 2502 is removed as described at FIG. 44 and the second interlayer 112s is formed as described at FIG. 45.

While FIGS. 41-48 are described with reference to a method, it will be appreciated that the structures shown in FIGS. 41-48 are not limited to the method but rather may stand alone separate of the method. While FIGS. 41-48 are described as a series of acts, it will be appreciated that the order of the acts may be altered in other embodiments. While FIGS. 41-48 illustrate and describe as a specific set of acts, some acts that are illustrated and/or described may be omitted in other embodiments. Further, acts that are not illustrated and/or described may be included in other embodiments.

Figure 49:
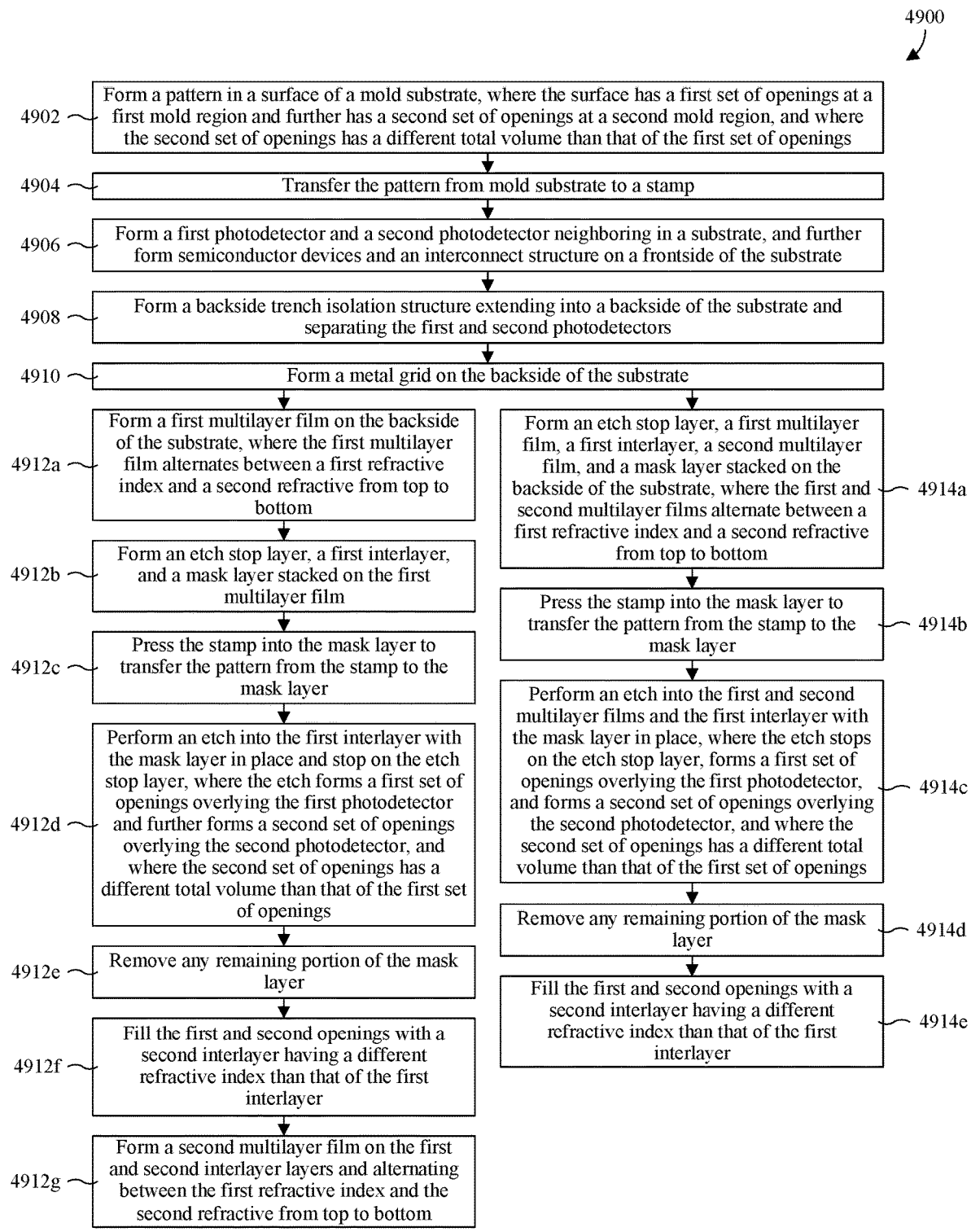
FIG. 49 illustrates a block diagram of some embodiments of the method of FIGS. 41-48.

With reference to FIG. 49, a block diagram 4900 of some embodiments of the method of FIGS. 41-48 is provided.

At 4902, a pattern is formed in a surface of a mold substrate, where the surface has a first set of openings at a first filter region and further has a second set of openings at a second filter region, and where the second set of openings has a different total volume than that of the first set of openings. See, for example, FIG. 41.

At 4904, the pattern is transferred from mold substrate to a stamp. See, for example, FIG. 41.

At 4906, a first photodetector and a second photodetector are formed neighboring in a substrate. Further, semiconductor devices and an interconnect structure are formed on a frontside of the substrate. See, for example, FIG. 42 or 46.

At 4908, a backside trench isolation structure is formed extending into a backside of the substrate and separating the first and second photodetectors. See, for example, FIG. 42 or 46.

At 4910, a metal grid is formed on the backside of the substrate. See, for example, FIG. 42 or 46.

In first embodiments of the method, the acts at 4912a-4912g are next performed. At 4912a, a first multilayer film is formed on the backside of the substrate, where the first multilayer film alternates between a first refractive index and a second refractive from top to bottom. See, for example, FIG. 42. At 4912b, an etch stop layer, a first interlayer, and a mask layer are formed stacked on the first multilayer film. See, for example, FIG. 42. At 4912c, the stamp is pressed into the mask layer to transfer the pattern from the stamp to the mask layer. See, for example, FIGS. 42 and 43. At 4912d, an etch is performed into the first interlayer with the mask layer in place and stops on the etch stop layer, where the etch forms a first set of openings overlying the first photodetector and further forms a second set of openings overlying the second photodetector, and where the second set of openings has a different total volume than that of the first set of openings. See, for example, FIG. 44. At 4912e, any remaining portion of the mask layer is removed. See, for example, FIG. 44. At 4912f, the first and second openings are filled with a second interlayer having a different refractive index than that of the first interlayer. See, for example, FIG. 45. At 4912g, a second multilayer film is formed on the first and second interlayer layers and alternates between the first refractive index and the second refractive from top to bottom. See, for example, FIG. 45.

In second embodiments of the method, the acts at 4914a-4914e are performed instead of the acts at 4912a-4912g. At 4914a, an etch stop layer, a first multilayer film, a first interlayer, a second multilayer film, and a mask layer are formed stacked on the backside of the substrate, where the first and second multilayer films alternate between a first refractive index and a second refractive from top to bottom. See, for example, FIG. 46. At 4914b, the stamp is pressed into the mask layer to transfer the pattern from the stamp to the mask layer. See, for example, FIGS. 46 and 47. At 4914c, an etch is performed into the first and second multilayer films and the first interlayer with the mask layer in place, where the etch stops on the etch stop layer, forms a first set of openings overlying the first photodetector, and forms a second set of openings overlying the second photodetector, and where the second set of openings has a different total volume than that of the first set of openings. See, for example, FIG. 48. At 4914d, any remaining portion of the mask layer is removed. See, for example, FIG. 48. At 4914e, the first and second openings are filled with a second interlayer having a different refractive index than that of the first interlayer. See, for example, FIG. 48.

While the block diagram 4900 of FIG. 49 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 50-54, a series of cross-sectional views 5000-5400 of some embodiments of a method to form an image sensor comprising a narrow band filter in which a ratio between interlayers varies and the interlayers and the narrow band filter have variable thicknesses. An example of such a narrow band filter is illustrated and described with regard to FIG. 8A.

Figure 50:
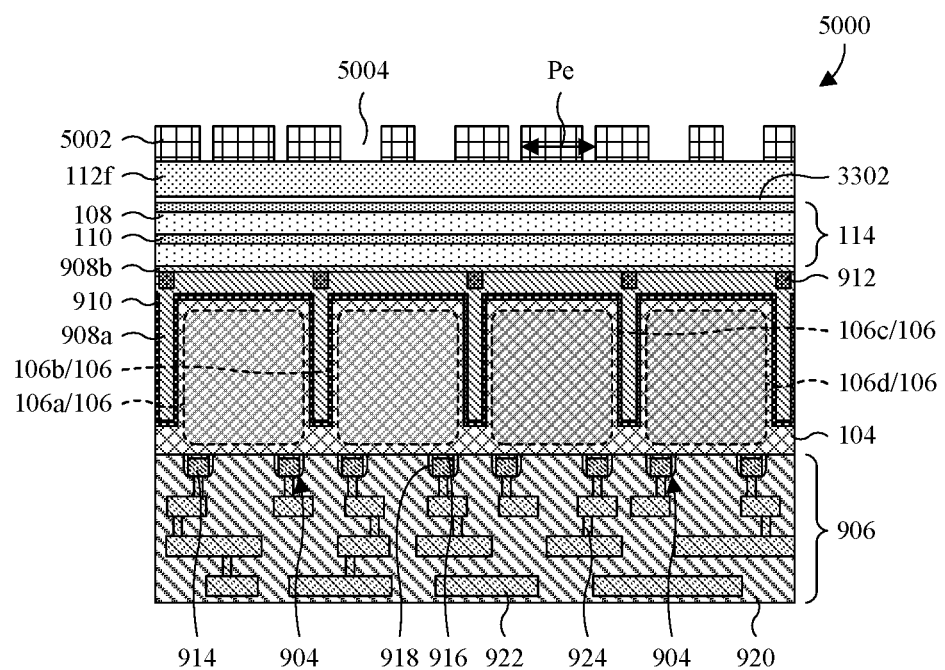
FIGS. 50-54 illustrate a series of cross-sectional views of some embodiments of a method to form an image sensor comprising a narrow band filter in which a ratio between interlayers varies and the interlayers and the narrow band filter have variable thicknesses.

As illustrated by the cross-sectional view 5000 of FIG. 50, a first isolation layer 908a, a second isolation layer 908b, an isolation liner 910, and a metal grid 912 are formed on a backside of a substrate 104. Further, one or more first refractive-index layers 108, one or more second refractive-index layers 110, and a first interlayer 112f, are deposited over the second isolation layer 908b. The first and second refractive-index layers 108, 110 have different refractive indexes and are stacked in a periodic pattern to define a lower multilayer film 114.

The structure of FIG. 50 and formation thereof are as described at FIGS. 11-16, except for formation of an etch stop layer 3302, a first mask layer 5002, and additional photodetectors 106c, 106d. The etch stop layer 3302 is deposited between the depositing of the first and second refractive-index layers 108, 110 and the depositing of the first interlayer 112f. In alternative embodiments, the etch stop layer 3302 is omitted. The first mask layer 5002 is deposited on the first interlayer 112f instead of the mask layer 1602 of FIG. 16. The first mask layer 5002 varies depending upon how the first mask layer 5002 is subsequently patterned. In some embodiments, the first mask layer 5002 is photoresist or some other suitable photosensitive material. Such embodiments may, for example, arise when the first mask layer 5002 is subsequently patterned by photolithography. In other embodiments, the first mask layer 5002 is or comprises a flowable and/or pliable material. Such embodiments may, for example, arise when the first mask layer 5002 is subsequently patterned by stamping. The additional photodetector comprises a third photodetector 106c and a fourth photodetector 106d.

Also illustrated by the cross-sectional view 5000 of FIG. 50, the first mask layer 5002 is patterned to form a pattern of first openings 5004 in the first mask layer 5002. The first openings 5004 repeat periodically across the photodetectors 106 with a period Pe. Further, the period Pe and/or individual volumes of the first openings 3406 is/are varied across the photodetectors 106. As such, a first subset of the first openings 5004 overlying the first photodetector 106a and a second subset of the first openings 5004 overlying the third photodetector 106c each has a first total volume. Further, a second subset of the first openings 5004 overlying the second photodetector 106b and a fourth subset of the first openings 5004 overlying the fourth photodetector 106d each has a second total volume different than the first total volume.

In some embodiments, the patterning of the first mask layer 5002 is performed by photolithography. An example of patterning by photolithography is illustrated at FIG. 34. In alternative embodiments, the patterning of the first mask layer 5002 is performed by stamping. An example of patterning by stamping is illustrated at FIGS. 41-43. Notwithstanding the abovementioned patterning processes, other patterning processes are amenable.

Figure 51:
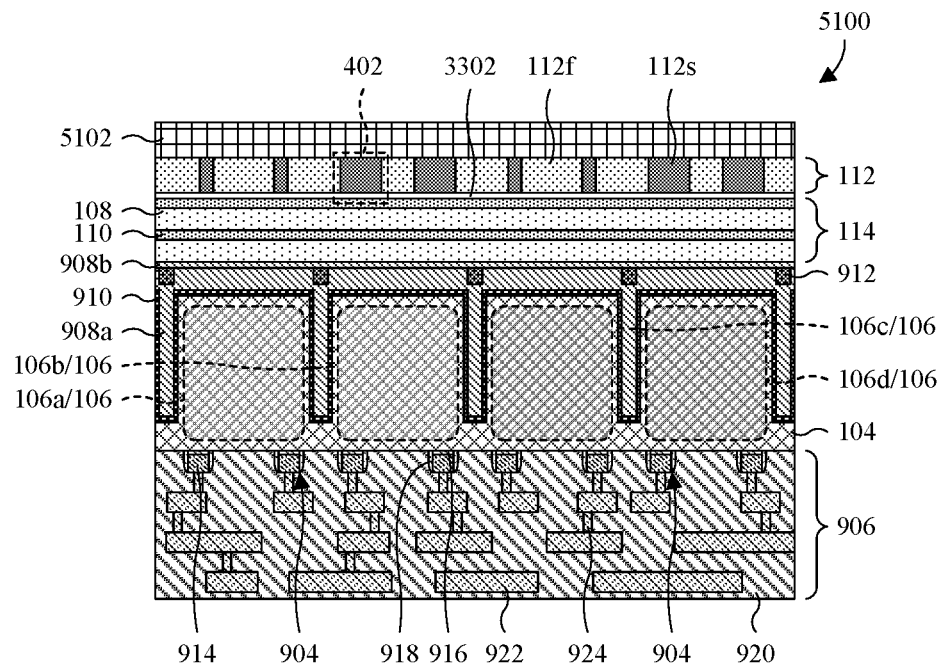

As illustrated by the cross-sectional view 5100 of FIG. 51, an etch is performed into the first interlayer 112f with the first mask layer 5002 in place to transfer a pattern of the first mask layer 5002 to the first interlayer 112f. Further, the first mask layer 5002 is removed and a second interlayer 112s is subsequently formed in second openings (not shown) that result in the first interlayer 112f from the etch. The first and second interlayers 112f, 112s collectively define an interlayer structure 112. The etch and the removing are as described with regard to FIG. 35. The second interlayer 112s and the forming thereof are as described with regard to FIG. 36.

Also illustrated by the cross-sectional view 5100 of FIG. 51, a second mask layer 5102 is formed on the first and second interlayers 112f, 112s. As with the first mask layer 5002, the second mask layer 5102 varies depending upon how the second mask layer 5102 is subsequently patterned. In some embodiments, the second mask layer 5102 is photoresist or some other suitable photosensitive material. Such embodiments may, for example, arise when the first mask layer 5002 is subsequently patterned using a gray mask. In other embodiments, the second mask layer 5102 is or comprises a flowable and/or pliable material. Such embodiments may, for example, arise when the second mask layer 5102 is subsequently patterned by stamping.

Figure 52:
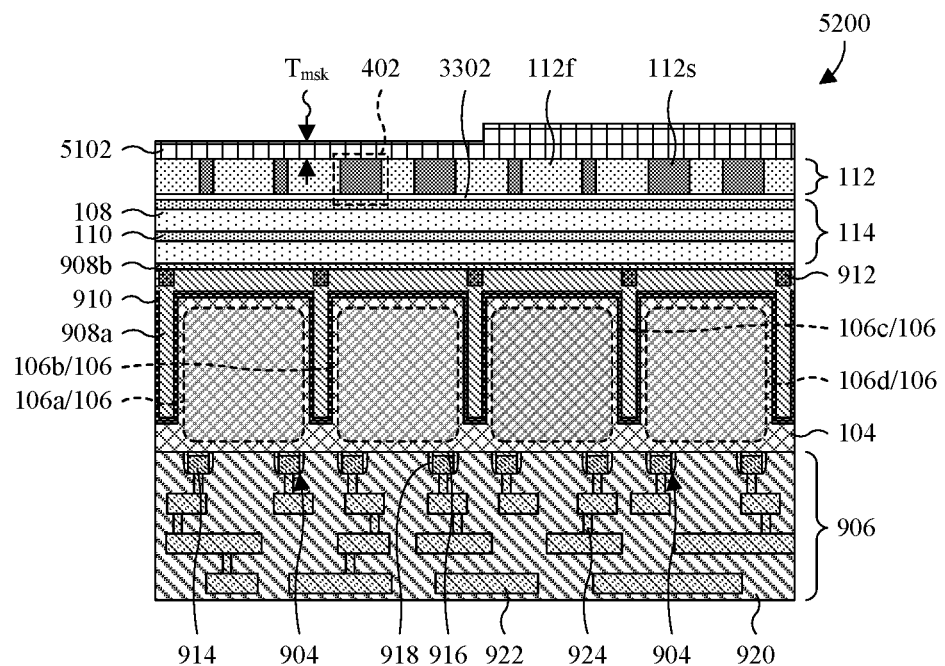

As illustrated by the cross-sectional view 5200 of FIG. 52, the second mask layer 5102 is patterned to vary a thickness $T_{msk}$ of the second mask layer 5102 across the photodetectors 106. For example, the thickness $T_{msk}$ is varied so its greater over the third and fourth photodetectors 106c, 106d than over the first and second photodetectors 106a, 106b. In some embodiments, the patterning of the second mask layer 5102 is performed by photolithography using a gray mask. An example of patterning by photolithography using a gray mask is illustrated at FIGS. 17A-17C. In alternative embodiments, the patterning of the second mask layer 5102 is performed by stamping. An example of patterning by stamping is illustrated at FIGS. 22-27. Notwithstanding the abovementioned patterning processes, other patterning processes are amenable.

Figure 53:
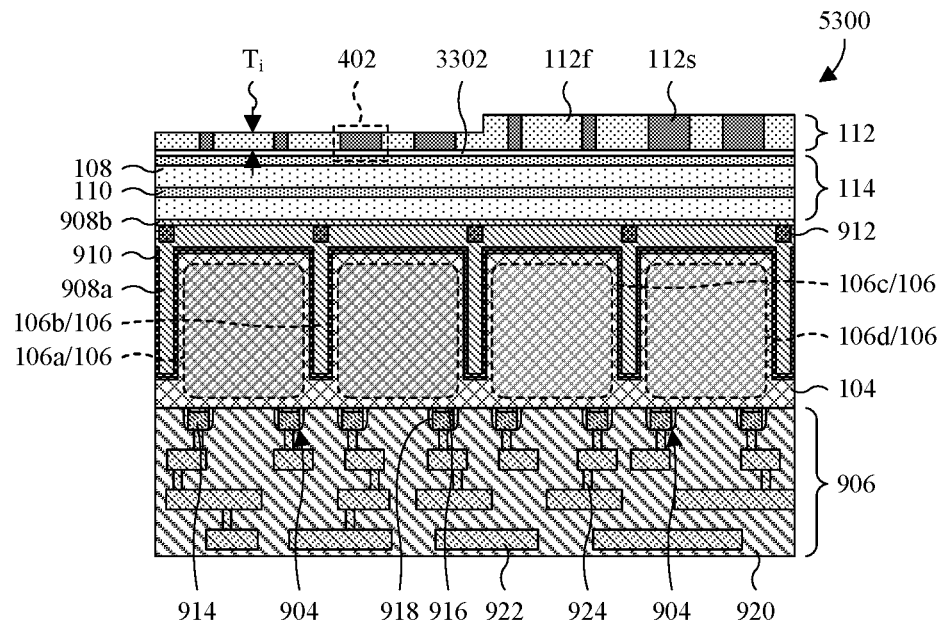

As illustrated by the cross-sectional view 5300 of FIG. 53, an etch is performed into the interlayer structure 112 with the second mask layer 5102 in place to transfer a pattern of the second mask layer 5102 to the interlayer structure 112. As a result, a thickness $T_i$ of the interlayer structure 112 varies across the photodetectors 106. Further, to the extent that any of the second mask layer 5102 remains after the etch, the remainder of the second mask layer 5102 is removed from the interlayer structure 112. The etch and the removal may, for example, be performed as described with regard to FIG. 18.

Figure 54:
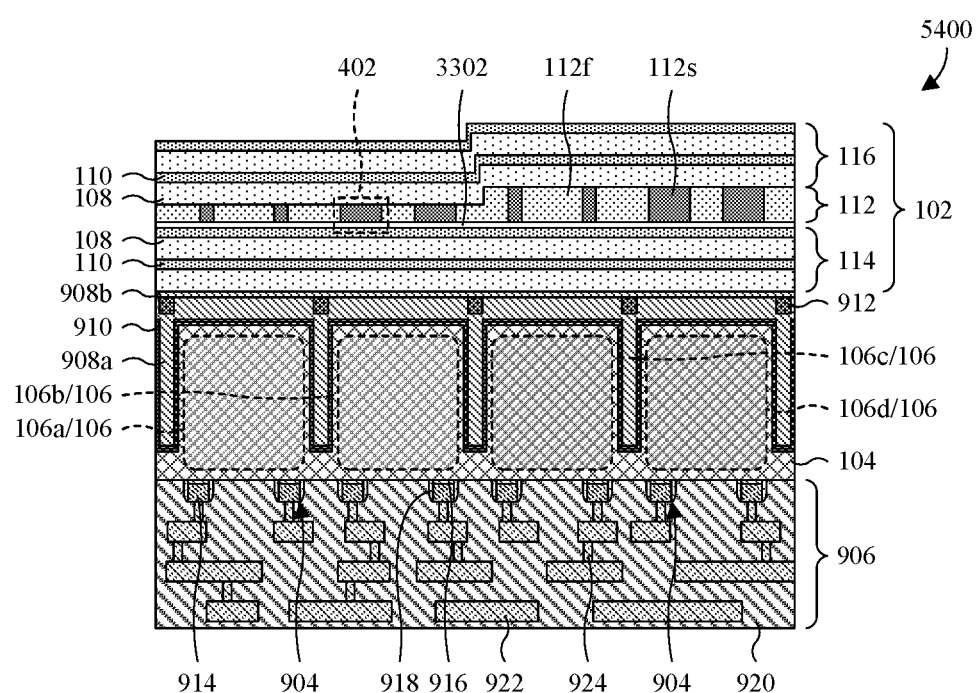

As illustrated by the cross-sectional view 5400 of FIG. 54, an upper multilayer film 116 is formed on the interlayer structure 112. The upper multilayer film 116 and formation thereof are as described at FIG. 18. The lower and upper multilayer films 114, 116 and the interlayer structure 112 collectively define a narrow band filter 102.

During use of the image sensor, increasing the thickness $T_i$ of the interlayer structure 112 shifts the high transmission band to higher wavelengths and decreasing the thickness $T_i$ shifts the high transmission band to lower wavelengths. Increasing the ratio of the second interlayer 112s to the first interlayer 112f shifts the effective refractive index of the interlayer structure 112 and hence shifts the high transmission band. In embodiments in which the first interlayer 112f has a higher refractive index, increasing the ratio reduces the effective refractive index and shifts the high transmission band to lower wavelengths. In embodiments in which the second interlayer 112s has a higher refractive index, increasing the ratio increases the effective refractive index and shifts the high transmission band to higher wavelengths. Therefore, the high transmission band is shifted to higher wavelengths as a product of the thickness $T_i$ and the effective refractive index increases and is shifted to lower wavelengths as the product decreases.

Because the fill factor of the of the second interlayer 112s varies across the photodetectors 106, the effective refractive index of the interlayer structure 112 varies across the photodetectors 106. Because the effective refractive index and the thickness $T_i$ both vary across the photodetectors 106, both the effective refractive index and the thickness $T_i$ contribute to a shift in the high transmission band across the photodetectors 106. In some embodiments, the high transmission band is shifted by a different amount at each of the photodetectors 106.

While FIGS. 50-54 are described with reference to a method, it will be appreciated that the structures shown in FIGS. 50-54 are not limited to the method but rather may stand alone separate of the method. While FIGS. 50-54 are described as a series of acts, it will be appreciated that the order of the acts may be altered in other embodiments. While FIGS. 50-54 illustrate and describe as a specific set of acts, some acts that are illustrated and/or described may be omitted in other embodiments. Further, acts that are not illustrated and/or described may be included in other embodiments.

Figure 55:
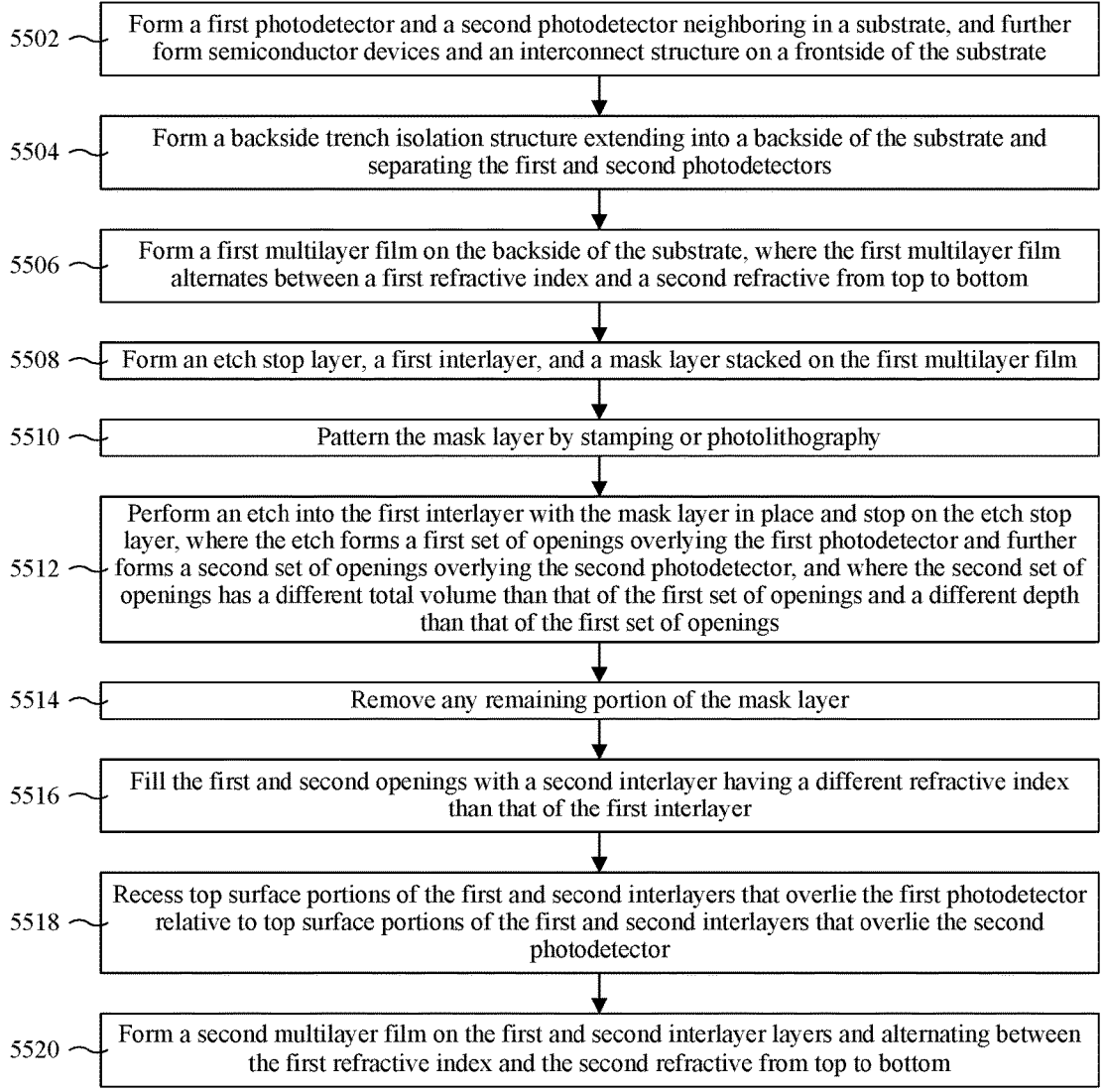
FIG. 55 illustrates a block diagram of some embodiments of the method of FIGS. 50-54.

With reference to FIG. 55, a block diagram 5500 of some embodiments of the method of FIGS. 50-54 is provided.

At 5502, a first photodetector and a second photodetector are formed neighboring in a substrate. Further, semiconductor devices and an interconnect structure are formed on a frontside of the substrate. See, for example, FIG. 50.

At 5504, a backside trench isolation structure is formed extending into a backside of the substrate and separating the first and second photodetectors. See, for example, FIG. 50.

At 5506, a first multilayer film is formed on the backside of the substrate, where the first multilayer film alternates between a first refractive index and a second refractive from top to bottom. See, for example, FIG. 50.

At 5508, an etch stop layer, a first interlayer, and a mask layer are formed stacked on the first multilayer film. See, for example, FIG. 50.

At 5510, the mask layer is patterned by stamping or photolithography. See, for example, FIG. 50.

At 5512, an etch is performed into the first interlayer with the mask layer in place and stops on the etch stop layer, where the etch forms a first set of openings overlying the first photodetector and further forms a second set of openings overlying the second photodetector, and where the second set of openings has a different total volume than that of the first set of openings and a different depth than that of the first set of openings. See, for example, FIG. 51.

At 5514, any remaining portion of the mask layer is removed. See, for example, FIG. 51.

At 5516, the first and second openings are filled with a second interlayer having a different refractive index than that of the first interlayer. See, for example, FIG. 51.

At 5518, top surface portions of the first and second interlayers that overlie the first photodetector are recessed relative to top surface portions of the first and second interlayers that overlie the second photodetector. See, for example, FIGS. 51-53.

At 5520, a second multilayer film is formed on the first and second interlayer layers and alternating between the first refractive index and the second refractive from top to bottom. See, for example, FIG. 54.

While the block diagram 5500 of FIG. 55 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 56-62, a series of cross-sectional views 5600-6200 of some embodiments of a method to form an image sensor comprising a narrow band filter in which a ratio between interlayers varies, the interlayers have variable thicknesses, and the narrow band filter has a uniform thickness. An example of such a narrow band filter is illustrated and described with regard to FIG. 7B.

Figure 56:
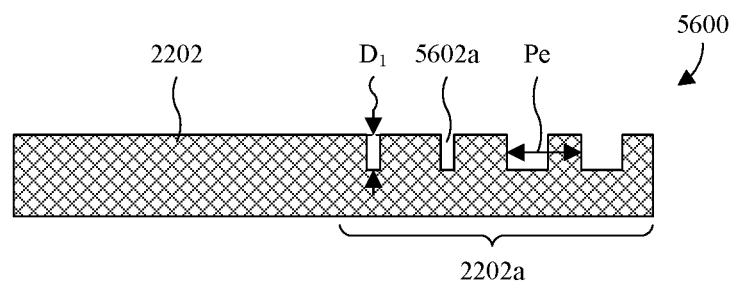
FIGS. 56-62 illustrate a series of cross-sectional views of some embodiments of a method to form an image sensor comprising a narrow band filter in which a ratio between interlayers varies, the interlayers have variable thicknesses, and the narrow band filter has a uniform thickness.

As illustrated by the cross-sectional view 5600 of FIG. 56, a mold substrate 2202 is patterned to form a plurality of first mold openings 5602a on a first mold region 2202a and having a first depth $D_1$. The first mold openings 5602a repeat periodically across the first mold region 2202a with a period Pe. Further, the period Pe and/or individual volumes of the first mold openings 5602a is/are varied across the first mold region 2202a. The patterning to form the first mold openings 5602a may, for example, be performed by a photolithography/etching process or some other suitable patterning process.

Figure 57:
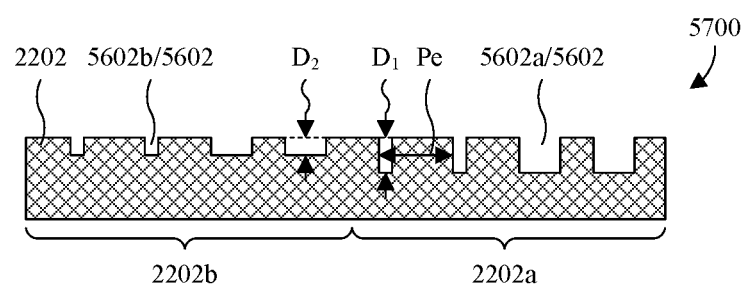

As illustrated by the cross-sectional view 5700 of FIG. 57, the mold substrate 2202 is patterned to form a plurality of second mold openings 5602b on a second mold region 2202b and having a second depth $D_2$ less than the first depth $D_1$. In alternative embodiments, the second depth $D_2$ is greater than the first depth $D_1$. The second mold openings 5602b repeat periodically across the second mold region 2202b with the period Pe. Further, the period Pe and/or individual volumes of the second mold openings 5602b is/are varied across the second mold region 2202b. Collectively, the first and second mold openings 5602a, 5602b are hereafter referred to as mold openings 5602. The patterning to form the second mold openings 5602b may, for example, be performed by a photolithography/etching process or some other suitable patterning process.

Figure 58:
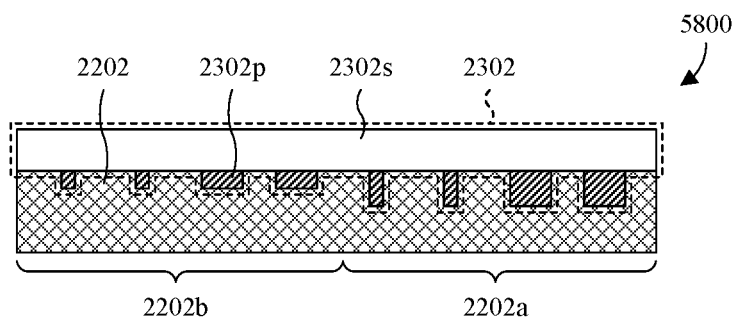

As illustrated by the cross-sectional view 5800 of FIG. 58, a stamp 2302 is formed with the pattern of the mold substrate 2202. The stamp 2302 comprises a carrier substrate 2302s and a plurality of protrusions 2302p underlying the carrier substrate 2302s. The protrusions 2302p and/or the carrier substrate 2302s may, for example, be as described at FIG. 23 and/or the stamp 2302 may, for example, be formed as described at FIG. 23.

Figure 59:
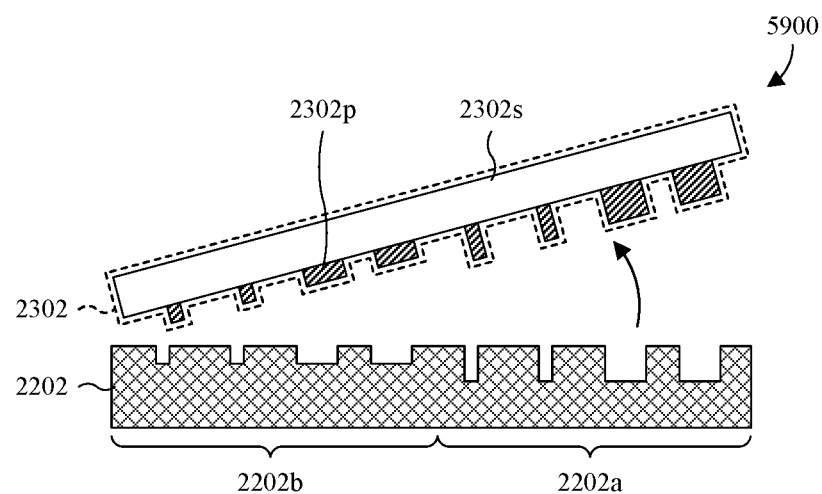

As illustrated by the cross-sectional view 5900 of FIG. 59, the stamp 2302 is removed from the mold substrate 2202.

Figure 60:
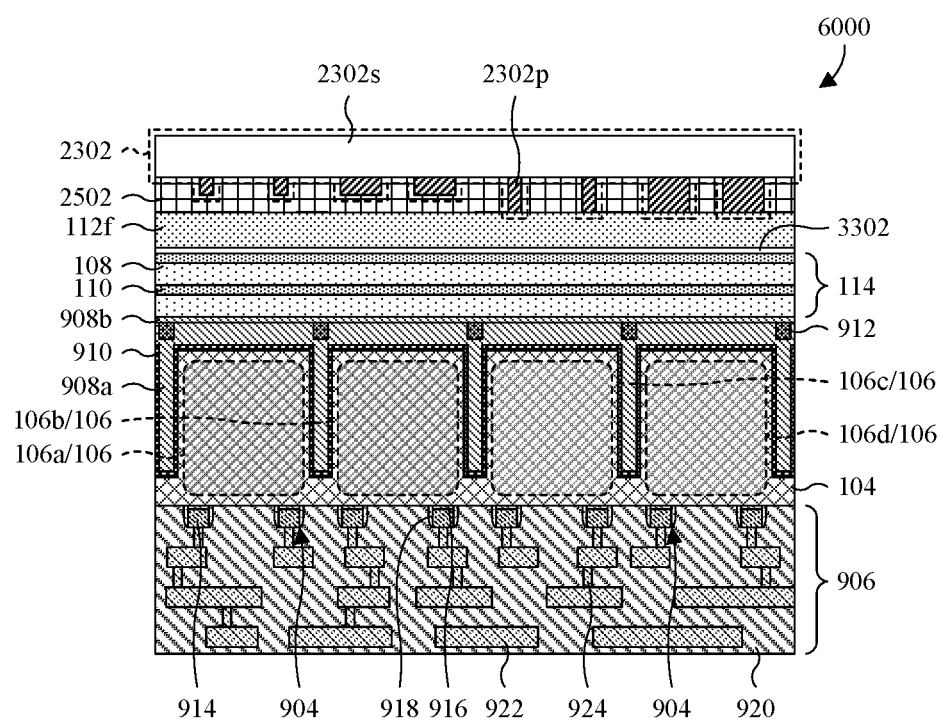

As illustrated by the cross-sectional view 6000 of FIG. 60, a first isolation layer 908a, a second isolation layer 908b, an isolation liner 910, and a metal grid 912 are formed on a backside of a substrate 104. Further, one or more first refractive-index layers 108, one or more second refractive-index layers 110, and a first interlayer 112f are deposited over the second isolation layer 908b. The first and second refractive-index layers 108, 110 have different refractive indexes and are stacked in a periodic pattern to define a lower multilayer film 114.

The structure of FIG. 6000 and formation thereof are as described at FIGS. 11-16, except for formation of an etch stop layer 3302, a mask layer 2502, and additional photodetectors 106c, 106d. The etch stop layer 3302 is deposited between the depositing of the first and second refractive-index layers 108, 110 and the depositing of the first interlayer 112f. In alternative embodiments, the etch stop layer 3302 is omitted. The mask layer 2502 is deposited on the first interlayer 112f instead of the mask layer 1602 of FIG. 16 and is or comprises a flowable and/or pliable material. The additional photodetector comprises a third photodetector 106c and a fourth photodetector 106d.

Also illustrated by the cross-sectional view 6000 of FIG. 60, the mask layer 2502 is stamped to transfer a pattern from the stamp 2302 to the mask layer 2502. Additionally, in some embodiments, the mask layer 2502 is cured and/or hardened once the pattern has been transferred.

Figure 61:
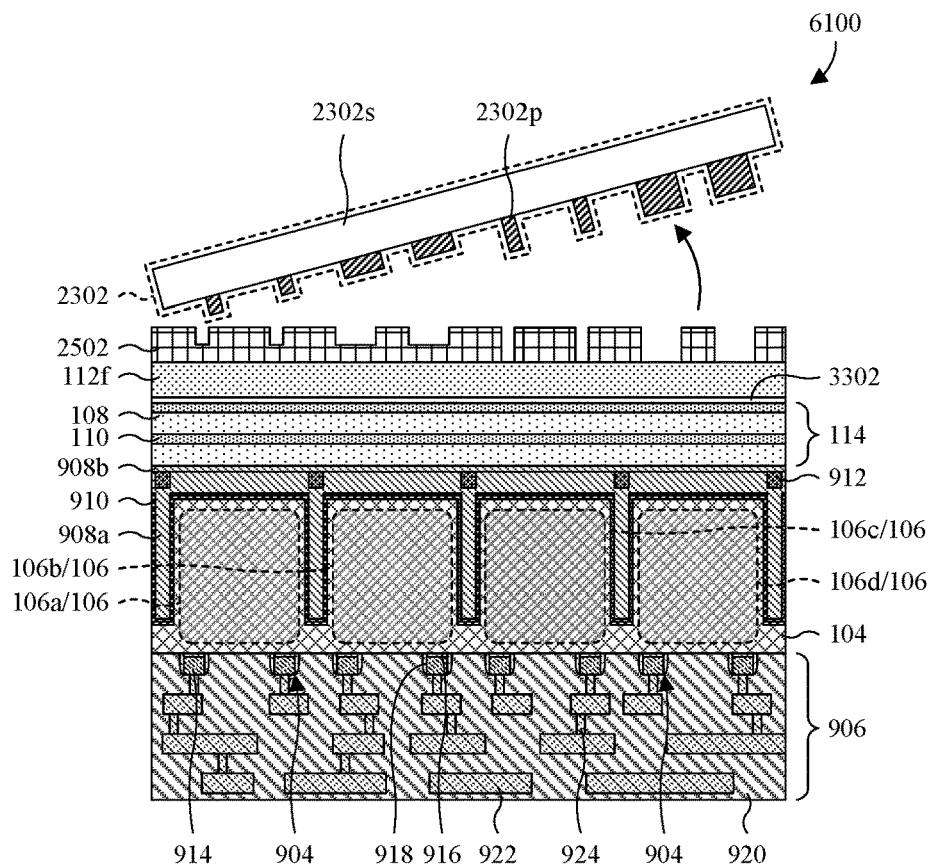

As illustrated by the cross-sectional view 6100 of FIG. 61, the stamp 2302 is removed from the mask layer 2502.

Figure 62:
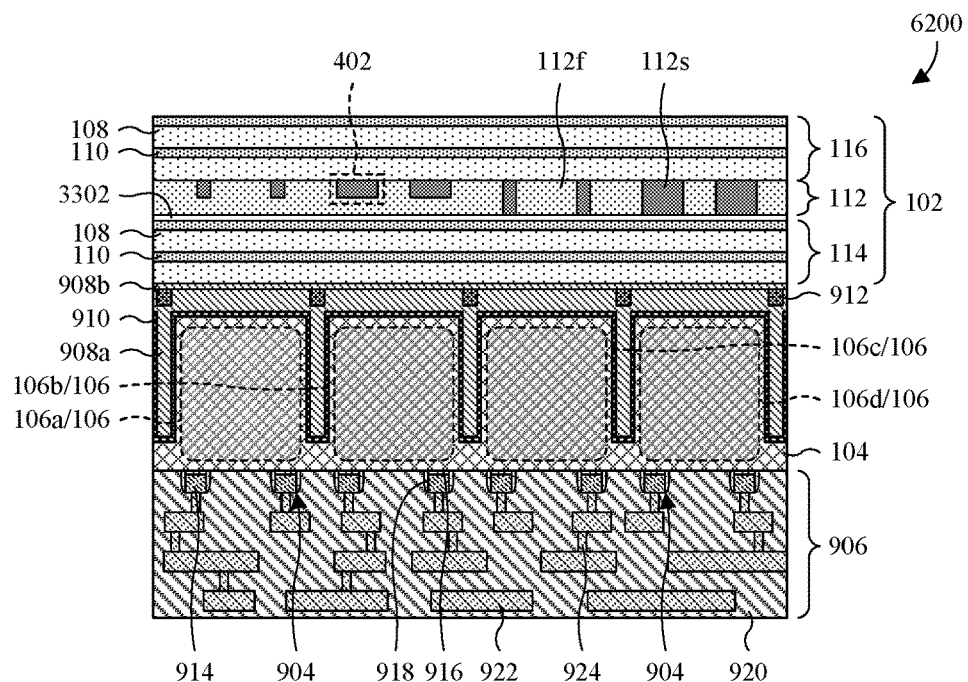

As illustrated by the cross-sectional view 6200 of FIG. 62, an etch is performed into the first interlayer 112f with the mask layer 2502 in place to transfer the pattern from the mask layer 2502 to the first interlayer 112f. Further, the mask layer 1602 is removed from the first interlayer 112f. The etch may, for example, be as described with regard to FIG. 35.

Also illustrated by the cross-sectional view 6200 of FIG. 62, a second interlayer 112s is formed surrounded by the first interlayer 112f. The first and second interlayers 112f, 112s define an interlayer structure 112. Further, an upper multilayer film 116 is formed on the first and second interlayers 112f, 112s. The lower and upper multilayer films 114, 116 and the interlayer structure 112 define a narrow band filter 102. The forming of the second interlayer 112s and the forming of the upper multilayer film 116 may, for example, be as described at FIG. 36.

During use of the image sensor, increasing the ratio of the second interlayer 112s to the first interlayer 112f shifts the effective refractive index of the interlayer structure 112 and hence shifts the high transmission band. In embodiments in which the first interlayer 112f has a higher refractive index, increasing the ratio reduces the effective refractive index and shifts the high transmission band lower. In embodiments in which the second interlayer 112s has a higher refractive index, increasing the ratio increases the effective refractive index and shifts the high transmission band higher. Because the ratio varies across the photodetectors 106, the location of the high transmission band varies across the photodetectors 106.

While FIGS. 56-62 are described with reference to a method, it will be appreciated that the structures shown in FIGS. 56-62 are not limited to the method but rather may stand alone separate of the method. While FIGS. 56-62 are described as a series of acts, it will be appreciated that the order of the acts may be altered in other embodiments. While FIGS. 56-62 illustrate and describe as a specific set of acts, some acts that are illustrated and/or described may be omitted in other embodiments. Further, acts that are not illustrated and/or described may be included in other embodiments.

Figure 63:
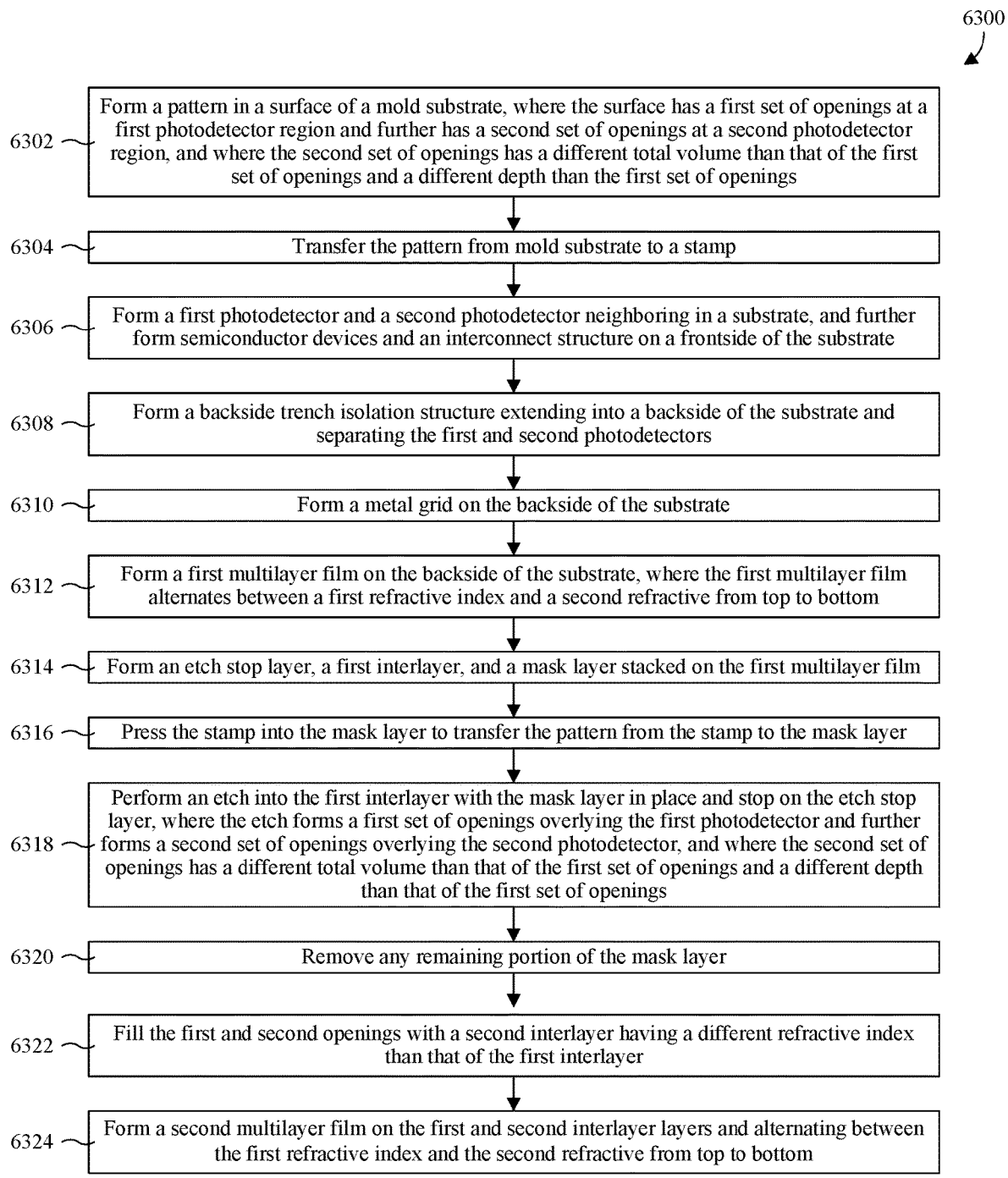
FIG. 63 illustrates a block diagram of some embodiments of the method of FIGS. 56-62.

With reference to FIG. 63, a block diagram 6300 of some embodiments of the method of FIGS. 56-62 is provided.

At 6302, a pattern is formed in a surface of a mold substrate, where the surface has a first set of openings at a first mold region and further has a second set of openings at a second mold region, and where the second set of openings has a different total volume than that of the first set of openings and a different depth than the first set of openings. See, for example, FIGS. 56 and 57.

At 6304, the pattern is transferred from mold substrate to a stamp. See, for example, FIGS. 58 and 59.

At 6306, a first photodetector and a second photodetector are formed neighboring in a substrate. Further, semiconductor devices and an interconnect structure are formed on a frontside of the substrate. See, for example, FIG. 60.

At 6308, a backside trench isolation structure is formed extending into a backside of the substrate and separating the first and second photodetectors. See, for example, FIG. 60.

At 6310, a metal grid is formed on the backside of the substrate. See, for example, FIG. 60.

At 6312, a first multilayer film is formed on the backside of the substrate, where the first multilayer film alternates between a first refractive index and a second refractive from top to bottom. See, for example, FIG. 60.

At 6314, an etch stop layer, a first interlayer, and a mask layer are formed stacked on the first multilayer film. See, for example, FIG. 60.

At 6316, the stamp is pressed into the mask layer to transfer the pattern from the stamp to the mask layer. See, for example, FIGS. 60 and 61.

At 6318, an etch is performed into the first interlayer with the mask layer in place and stops on the etch stop layer, where the etch forms a first set of openings overlying the first photodetector and further forms a second set of openings overlying the second photodetector, and where the second set of openings has a different total volume than that of the first set of openings and a different depth than that of the first set of openings. See, for example, FIG. 62.

At 6320, any remaining portion of the mask layer is removed. See, for example, FIG. 62.

At 6322, the first and second openings are filled with a second interlayer having a different refractive index than that of the first interlayer. See, for example, FIG. 62.

At 6324, a second multilayer film is formed on the first and second interlayer layers and alternating between the first refractive index and the second refractive from top to bottom. See, for example, FIG. 63.

While the block diagram 6300 of FIG. 63 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 64:
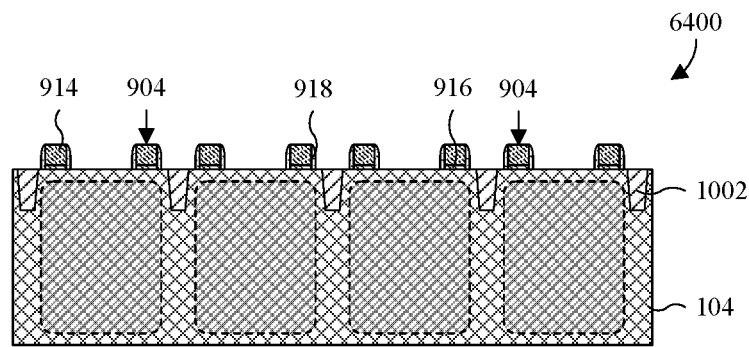
FIGS. 64-66 illustrate a series of cross-sectional views of some embodiments of forming an image sensor that is frontside illuminated and comprises a narrow band filter.
Figure 65:
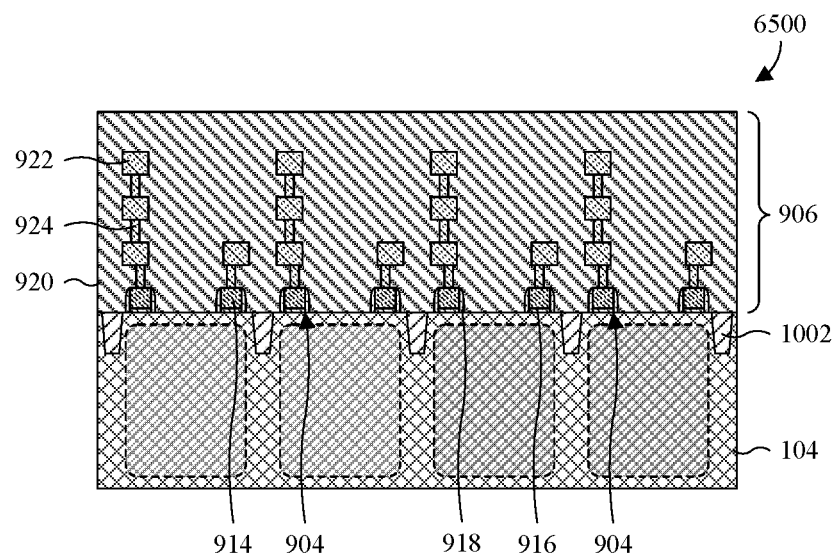
Figure 66:
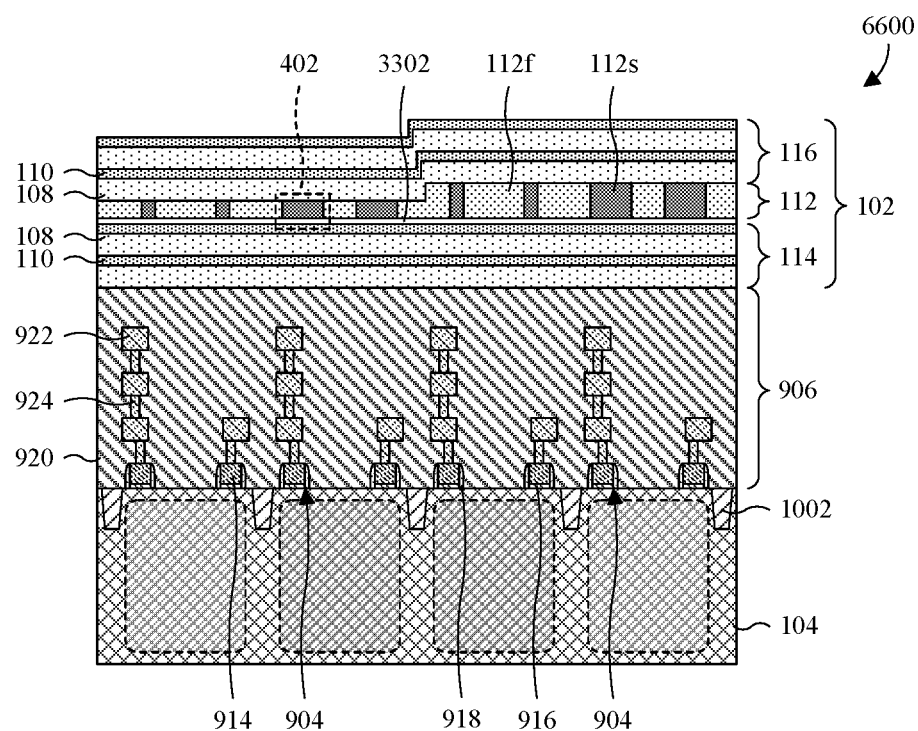

The above described methods (i.e., the methods spanning from FIG. 11 to FIG. 63) have thus far illustrated image sensors as being backside illuminated. In alternative embodiments, the image sensors may be frontside illuminated. In such alternative embodiments, the narrow band filters 102 are formed on the interconnect structure 906. To illustrate, FIGS. 64-66 are provided. FIGS. 64-66 illustrate a series of cross-sectional views 6400-6600 of some alternative embodiments of the method of FIGS. 50-54 in which the image sensor is frontside illuminated. An example of such an image sensor is illustrated and described with regard to FIG. 10.

As illustrated by the cross-sectional view 6400 of FIG. 64, photodetectors 106 are formed in the substrate 104, separated by a trench isolation structure 1002 that extends into a frontside of the substrate 104. Further, semiconductor devices 904 are formed on the frontside of the substrate 104.

As illustrated by the cross-sectional view 6500 of FIG. 65, an interconnect structure 906 is formed on the frontside of the substrate 104.

As illustrated by the cross-sectional view 6600 of FIG. 66, the narrow band filter 102 is formed on the interconnect structure 906 as illustrated and described with regard to FIGS. 50-54. In alternative embodiments, the narrow band filter 102 is formed as illustrated and described with regard to: 1) FIGS. 15, 16, 17A, and 18; 2) FIGS. 19A and 20; 3) FIGS. 22-28; 4) FIGS. 29-31; 5) FIGS. 33-36; 6) FIGS. 37-39; 7) FIGS. 41-45; 8) FIG. 46-48; or 9) FIGS. 56-62.

While FIGS. 64-66 are described with reference to a method, it will be appreciated that the structures shown in FIGS. 64-66 are not limited to the method but rather may stand alone separate of the method. While FIGS. 64-66 are described as a series of acts, it will be appreciated that the order of the acts may be altered in other embodiments. While FIGS. 64-66 illustrate and describe as a specific set of acts, some acts that are illustrated and/or described may be omitted in other embodiments. Further, acts that are not illustrated and/or described may be included in other embodiments.

In some embodiments, the present disclosure provides an image sensor including: a substrate; a first photodetector and a second photodetector neighboring in the substrate; and a filter overlying the first and second photodetectors, wherein the filter includes: a first DBR; a second DBR; and an interlayer between the first and second DBRs, wherein a thickness of the interlayer has a first thickness value overlying the first photodetector and a second thickness value overlying the second photodetector. In some embodiments, the thickness of the interlayer discretely varies across the first and second photodetectors. In some embodiments, the thickness of the interlayer continuously varies across the first and second photodetectors. In some embodiments, the interlayer has a single refractive index. In some embodiments, the filter further includes a plurality of columnar structures extending through the interlayer and overlying the first and second photodetectors, wherein the columnar structures have a refractive index different than a refractive index of the interlayer. In some embodiments, the plurality of column structures includes a first subset of columnar structures and a second subset of columnar structures respectively overlying the first and second photodetectors, and wherein a total volume of the first subset is different than a total volume of the second subset. In some embodiments, the plurality of column structures includes a first subset of columnar structures and a second subset of columnar structures respectively overlying the first and second photodetectors, wherein the columnar structures in the first subset have a different top layout than columnar structures in the second subset. In some embodiments, top surfaces of the columnar structures are even with a top surface of the interlayer, wherein bottom surfaces of the column structures are even with a bottom surface of the interlayer.

In some embodiments, the present disclosure provides a method for forming an image sensor, the method including: forming a first photodetector and a second photodetector neighboring in a substrate; depositing a first multilayer film on the substrate, wherein the first multilayer film includes a first stack of layers alternating between a first refractive index and a second refractive index different than the first refractive index; depositing an interlayer over the first multilayer film; depositing a mask layer over the interlayer; stamping the mask layer to transfer a pattern from a stamp to the mask layer; performing an etch into the interlayer with the mask layer in place to transfer the pattern from the mask layer to the interlayer; and depositing a second multilayer film on the interlayer, wherein the second multilayer film includes a second stack of layers alternating between the first and second refractive indexes. In some embodiments, a first top surface portion of the mask layer that overlies the first photodetector has a first elevation above the interlayer after the stamping, wherein a second top surface portion of the mask layer that overlies the second photodetector has a second elevation above the interlayer after the stamping, and wherein the first and second elevations are different. In some embodiments, the first and second top surface portions have planar profiles, wherein the first top surface portion covers at least a majority of the first photodetector, and wherein the second top surface portion covers at least a majority of the second photodetector. In some embodiments, the mask layer has a first set of openings that overlie the first photodetector after the stamping and further has a second set of openings that overlie the second photodetector after the stamping, and wherein the first set of openings has a different total volume than that of the second set of openings. In some embodiments, the first set of openings has a first depth and the second set of openings has a second depth different than the first depth. In some embodiments, the mask layer has a first set of openings that overlie the first photodetector after the stamping and further has a second set of openings that overlie the second photodetector after the stamping, wherein the first set of openings has a depth different than that of the second set of openings.

In some embodiments, the present disclosure provides another method for forming an image sensor, the method including: forming a first photodetector and a second photodetector neighboring in a substrate; depositing a first DBR on the substrate; depositing a first interlayer and a photosensitive layer on the first DBR; exposing the photosensitive layer to radiation, wherein an intensity of the radiation has different intensity values respectively overlying the first and second photodetectors; developing the photosensitive layer, wherein a thickness of the photosensitive layer has different values respectively overlying the first and second photodetectors after the developing; performing a first etch into the first interlayer with the photosensitive layer in place to transfer thickness variations of the photosensitive layer to the first interlayer; and depositing a second DBR on the first interlayer. In some embodiments, the intensity of the radiation and the thickness of the photosensitive layer continuously vary across the first and second photodetectors. In some embodiments, the intensity of the radiation and the thickness of the photosensitive layer discretely vary across the first and second photodetectors. In some embodiments, a first top surface portion of the first interlayer that overlies the first photodetector has a first elevation above the first DBR after the first etch, wherein a second top surface portion of the first interlayer that overlies the second photodetector has a second elevation above the first DBR after the first etch, wherein the first and second elevations are different, and wherein the first and second top surface portions have planar profiles and each covers at least a majority of a respective one of the first and second photodetectors. In some embodiments, the method further including: depositing a mask layer over the first interlayer; patterning the mask layer to form a first set of openings overlying the first photodetector and to further form a second set of openings overlying the second photodetector; performing a second etch into the first interlayer with the mask layer in place to transfer the first and second set of openings to the first interlayer; and filling the first and second sets of openings with a second interlayer having a different refractive index than the first interlayer. In some embodiments, the patterning includes stamping the mask layer to simultaneously form the first and second sets of openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a first photodetector and a second photodetector neighboring in a substrate;
    depositing a first multilayer film on the substrate, wherein the first multilayer film comprises a first stack of layers alternating between a first refractive index and a second refractive index different than the first refractive index;
    depositing an interlayer over the first multilayer film;
    depositing a mask layer over the interlayer;
    stamping the mask layer to transfer a pattern from a stamp to the mask layer;
    performing an etch into the interlayer with the mask layer in place to transfer the pattern from the mask layer to the interlayer;
    depositing and patterning a second mask layer over the interlayer;
    performing a second etch into the interlayer with the second mask layer in place to transfer a second pattern from the second mask layer to the interlayer, wherein one of the etch and the second etch varies a thickness of the interlayer across the first and second photodetectors, and wherein another one of the etch and the second etch forms openings respectively overlying the first and second photodetectors in the interlayer;
    filling the openings with a second interlayer having a different refractive index than the interlayer; and
    depositing a second multilayer film on the interlayer, wherein the second multilayer film comprises a second stack of layers alternating between the first and second refractive indexes.

2. The method according to claim 1, wherein a first top surface portion of the mask layer that overlies the first photodetector has a first elevation above the interlayer after the stamping, wherein a second top surface portion of the mask layer that overlies the second photodetector has a second elevation above the interlayer after the stamping, and wherein the first and second elevations are different.

3. The method according to claim 2, wherein the first and second top surface portions have planar profiles, wherein the first top surface portion covers at least a majority of the first photodetector, and wherein the second top surface portion covers at least a majority of the second photodetector.

4. The method according to claim 2,
    wherein the filling forms a first set of columnar structures and a second set of columnar structures in the interlayer, wherein the first and second sets of columnar structures respectively overlie the first and second photodetectors, wherein the first set of columnar structures has a different total volume than that of the second set of columnar structures, and wherein the mask layer is deposited over the first and second sets of columnar structures.

5. The method according to claim 4,
    wherein the patterning of the second mask layer comprises stamping the second mask layer to form mask openings having a top layout of the first and second sets of columnar structures, and wherein the second etch is performed into the interlayer with the second mask layer in place to form the openings in the interlayer.

6. The method according to claim 1, wherein the mask layer has a first set of mask openings that overlie the first photodetector after the stamping and further has a second set of mask openings that overlie the second photodetector after the stamping, and wherein the first set of mask openings has a different total volume than that of the second set of mask openings.

7. The method according to claim 6, wherein the filling forms columnar structures in the openings, wherein the second mask layer is deposited over the interlayer and the columnar structures, wherein the second mask layer is photosensitive, and wherein the patterning of the second mask layer comprises:
    exposing the second mask layer to radiation, wherein an intensity of the radiation has different intensity values respectively overlying the first and second photodetectors; and
    developing the second mask layer so a thickness of the second mask layer varies laterally from directly over the first photodetector to directly over the second photodetector;
    wherein the second etch is performed into the interlayer and the columnar structures with the second mask layer in place to vary the thickness of the interlayer and a thickness of the columnar structures.

8. The method according to claim 6, wherein the filling forms columnar structures in the openings, wherein the second mask layer is deposited over the interlayer and the columnar structures, and wherein the patterning of the second mask layer comprises:
    stamping the second mask layer so a first top surface portion of the second mask layer that overlies the first photodetector has a first elevation above the interlayer and so a second top surface portion of the second mask layer that overlies the second photodetector has a second elevation above the interlayer different than the first elevation;
    wherein the second etch is performed into the interlayer and the columnar structures with the second mask layer in place to vary the thickness of the interlayer and a thickness of the columnar structures laterally from directly over the first photodetector to directly over the second photodetector.

9. A method for forming an image sensor, the method comprising:
    forming a first photodetector and a second photodetector neighboring in a substrate;
    depositing a first distributed Bragg reflector (DBR) on the substrate;
    depositing a first interlayer and a photosensitive layer on the first DBR;
    exposing the photosensitive layer to radiation, wherein an intensity of the radiation has different intensity values respectively overlying the first and second photodetectors;
    developing the photosensitive layer, wherein a thickness of the photosensitive layer has different values respectively overlying the first and second photodetectors after the developing;
    performing a first etch into the first interlayer with the photosensitive layer in place to transfer thickness variations of the photosensitive layer to the first interlayer;
    depositing a mask layer over the first interlayer;
    patterning the mask layer to form a first set of openings overlying the first photodetector and to further form a second set of openings overlying the second photodetector;
    performing a second etch into the first interlayer with the mask layer in place to transfer the first and second set of openings to the first interlayer;

filling the first and second sets of openings with a second interlayer having a different refractive index than the first interlayer; and depositing a second DBR on the first interlayer.

10. The method according to claim 9, wherein the intensity of the radiation and the thickness of the photosensitive layer discretely vary across the first and second photodetectors.

11. The method according to claim 9, wherein a first top surface portion of the first interlayer that overlies the first photodetector has a first elevation above the first DBR after the first etch, wherein a second top surface portion of the first interlayer that overlies the second photodetector has a second elevation above the first DBR after the first etch, wherein the first and second elevations are different, and wherein the first and second top surface portions have planar profiles and each covers at least a majority of a respective one of the first and second photodetectors.

12. The method according to claim 9, wherein the patterning comprises stamping the mask layer to simultaneously form the first and second sets of openings.

13. A method for forming an image sensor, the method comprising:

forming a first photodetector, a second photodetector, and a third photodetector in a substrate, wherein the second photodetector is between and borders the first and third photodetectors;

forming a first distributed Bragg reflector (DBR) overlying the first, second, and third photodetectors;

forming an interlayer overlying the first DBR, wherein a thickness of the interlayer has a first thickness value overlying the first and second photodetectors and further has a second thickness value overlying the third photodetector;

forming a first columnar structure and a second columnar structure inset into the interlayer, wherein the first and second columnar structures are respectively and directly over the first and second photodetectors and have different volumes; and forming a second DBR overlying the interlayer.

14. The method according to claim 13, wherein the interlayer has a single refractive index.

15. The method according to claim 13, wherein the first and second columnar structures have a refractive index different than a refractive index of the interlayer.

16. The method according to claim 15, wherein the first columnar structures has a different top layout than the second columnar structures.

17. The method according to claim 13, wherein the forming of the interlayer having the first and second thickness values comprises depositing the interlayer and subsequently etching into the interlayer with a first mask in place to vary the thickness of the interlayer, wherein the forming of the first and second columnar structures comprises etching into the interlayer with a second mask in place to form openings and subsequently filling the openings with material of the first and second columnar structures, and wherein the first and second masks are different.

18. The method according to claim 17, wherein the first or second mask is patterned by stamping.

19. The method according to claim 13, wherein the first and second columnar structures extend from a bottom surface of the first DBR, through the interlayer, to a top surface of the second DBR.

20. The method according to claim 13, further comprising:

depositing an etch stop layer overlying and distinct from the first DBR, wherein the interlayer is formed overlying the etch stop layer.

* * * * *